US009076822B2

(12) United States Patent
Loy et al.

(10) Patent No.: US 9,076,822 B2
(45) Date of Patent: Jul. 7, 2015

(54) METHOD OF MANUFACTURING ELECTRONIC DEVICES ON BOTH SIDES OF A CARRIER SUBSTRATE AND ELECTRONIC DEVICES THEREOF

(71) Applicant: Arizona Board of Regents, a Body Corporate of the State of Arizona Acting for and on Behalf of Arizona State University, Scottsdale, AZ (US)

(72) Inventors: Douglas E Loy, Chandler, AZ (US); David Morton, Columbia, MO (US); Emmett Howard, Gilbert, AZ (US)

(73) Assignee: Arizona Board of Regents, a Body Corporate of the State of Arizona Acting for and on behalf of Arizona State University, Scottsdale, AZ (US)

( * ) Notice: Subject to any disclaimer, the term of this patent is extended or adjusted under 35 U.S.C. 154(b) by 274 days.

(21) Appl. No.: 13/684,150

(22) Filed: Nov. 21, 2012

(65) Prior Publication Data

US 2013/0075739 A1 Mar. 28, 2013

Related U.S. Application Data

(63) Continuation of application No. PCT/US2011/037207, filed on May 19, 2011, and
(Continued)

(51) Int. Cl.
*H01L 21/00* (2006.01)
*H01L 29/66* (2006.01)
(Continued)

(52) U.S. Cl.
CPC ...... *H01L 29/66765* (2013.01); *H01L 21/6835* (2013.01); *H01L 27/1266* (2013.01);
(Continued)

(58) Field of Classification Search
CPC .................................................. H01L 27/1266

USPC ........... 257/60; 438/158, 149, 106, 107, 110, 438/125
See application file for complete search history.

(56) References Cited

U.S. PATENT DOCUMENTS

| 3,089,801 A | 5/1963 | Tierney et al. |
| 3,684,637 A | 8/1972 | Andersen et al. |

(Continued)

FOREIGN PATENT DOCUMENTS

| CN | 1118075 | 3/1996 |
| CN | 101231972 | 7/2007 |

(Continued)

OTHER PUBLICATIONS

Machine translation, Akimoto, Japanese Patent Pub. No. JP2007-123861 (parts 1 and 2), translation date: Mar. 4, 2015, JPO & Japio, all pages.*

(Continued)

*Primary Examiner* — Fernando L Toledo
*Assistant Examiner* — Victoria K Hall
(74) *Attorney, Agent, or Firm* — Bryan Cave LLP

(57) ABSTRACT

Some embodiments can include a method of manufacturing first electronic device(s) and second electronic device(s), the method including: providing a carrier substrate having a first side and a second side, a first substrate bonded to the first side of the carrier substrate, and a second substrate bonded to the second side of the carrier substrate; depositing at least one layer of a first material over the first substrate while the first substrate is bonded to the first side of the carrier substrate to create a portion of the first electronic device(s); and depositing at least one layer of a second material over the second substrate while the second substrate is bonded to the second side of the carrier substrate to create a portion of the second electronic device(s). In many embodiments, the first substrate and/or the second substrate includes a flexible substrate. Other related systems and methods are also disclosed.

20 Claims, 41 Drawing Sheets

Related U.S. Application Data application No. 13/684,150, which is a continuation of application No. PCT/US2011/037226, filed on May 19, 2011.

(60) Provisional application No. 61/383,600, filed on Sep. 16, 2010, provisional application No. 61/347,342, filed on May 21, 2010, provisional application No. 61/389,647, filed on Oct. 4, 2010, provisional application No. 61/355,083, filed on Jun. 15, 2010.

(51) Int. Cl.
  *H01L 21/683* (2006.01)
  *H01L 27/12* (2006.01)
  *H01L 29/786* (2006.01)

(52) U.S. Cl.
  CPC ... *H01L29/78603* (2013.01); *H01L 2221/6835* (2013.01); *H01L 2221/68381* (2013.01); *H01L 29/78669* (2013.01); *H01L 27/1218* (2013.01)

(56) References Cited

U.S. PATENT DOCUMENTS

| | | |
|---|---|---|
| 3,723,635 A | 3/1973 | Smith |
| 4,337,107 A | 6/1982 | Eshleman |
| 4,349,593 A | 9/1982 | Blechstein |
| 4,858,073 A | 8/1989 | Gregory |
| 5,098,772 A | 3/1992 | Strom |
| 5,220,488 A | 6/1993 | Denes |
| 5,229,882 A | 7/1993 | Rowland |
| 5,252,383 A | 10/1993 | Fukutake et al. |
| 5,264,063 A | 11/1993 | Martin |
| 5,292,686 A | 3/1994 | Riley et al. |
| 5,453,157 A | 9/1995 | Jeng |
| 5,702,980 A | 12/1997 | Yu et al. |
| 5,714,305 A | 2/1998 | Teng et al. |
| 5,853,511 A | 12/1998 | Fairbanks |
| 5,861,470 A | 1/1999 | Voss et al. |
| 5,869,150 A | 2/1999 | Iwamoto |
| 5,890,429 A | 4/1999 | Alam et al. |
| 5,916,652 A | 6/1999 | Miner et al. |
| 6,051,169 A | 4/2000 | Brown et al. |
| 6,051,508 A | 4/2000 | Takase et al. |
| 6,083,580 A | 7/2000 | Finestone et al. |
| 6,177,163 B1 | 1/2001 | Blok et al. |
| 6,358,832 B1 | 3/2002 | Edelstein et al. |
| 6,482,288 B1 | 11/2002 | Kreckel et al. |
| 6,531,389 B1 | 3/2003 | Shue et al. |
| 6,541,398 B2 | 4/2003 | Grill et al. |
| 6,627,037 B1 | 9/2003 | Kurokawa et al. |
| 6,630,289 B1 | 10/2003 | Kwok et al. |
| 6,632,746 B2 | 10/2003 | Kanegae et al. |
| 6,670,265 B2 | 12/2003 | Wang et al. |
| 6,746,969 B2 | 6/2004 | Shimada et al. |
| 6,752,160 B2 | 6/2004 | Chen |
| 6,808,773 B2 | 10/2004 | Shimamura et al. |
| 6,825,068 B2 | 11/2004 | Denis et al. |
| 7,212,088 B1 | 5/2007 | Norregaard |
| 7,316,942 B2 | 1/2008 | Sarma et al. |
| 7,329,601 B2 | 2/2008 | Miyajima |
| 7,344,993 B2 | 3/2008 | Balasubramaniam et al. |
| 7,385,224 B2 | 6/2008 | Ishii et al. |
| 7,481,901 B2 | 1/2009 | Toyoda et al. |
| 7,538,038 B2 | 5/2009 | Matsushita et al. |
| 7,795,006 B2 | 9/2010 | Nagino et al. |
| 7,838,328 B2 | 11/2010 | Isa |
| 7,906,193 B2 | 3/2011 | Yukawa et al. |
| 8,038,820 B2 | 10/2011 | Kim et al. |
| 8,048,251 B2 | 11/2011 | Yamashita et al. |
| 8,881,381 B2 * | 11/2014 | Hwang et al. ............... 29/830 |
| 2002/0008839 A1 | 1/2002 | Miyai et al. |
| 2002/0018173 A1 | 2/2002 | Furukawa et al. |
| 2002/0081863 A1 | 6/2002 | Shimada et al. |
| 2003/0072889 A1 | 4/2003 | Abrams |
| 2003/0201465 A1 | 10/2003 | Ryuzaki et al. |
| 2004/0008298 A1 | 1/2004 | Kwok et al. |
| 2004/0110326 A1 | 6/2004 | Forbes et al. |
| 2005/0186801 A1 | 8/2005 | Uno et al. |
| 2005/0221542 A1* | 10/2005 | Yamazaki et al. ............ 438/149 |
| 2005/0221599 A1 | 10/2005 | Kanegae et al. |
| 2005/0233583 A1 | 10/2005 | Miyajima |
| 2005/0242341 A1 | 11/2005 | Knudson et al. |
| 2006/0017154 A1 | 1/2006 | Eguchi et al. |
| 2006/0019491 A1 | 1/2006 | Soda |
| 2006/0148141 A1 | 7/2006 | Seo et al. |
| 2006/0169485 A1 | 8/2006 | Kawaguchi et al. |
| 2006/0180815 A1 | 8/2006 | Sarma et al. |
| 2006/0192229 A1* | 8/2006 | Kato et al. ................. 257/207 |
| 2006/0194363 A1 | 8/2006 | Giesberg et al. |
| 2006/0207967 A1 | 9/2006 | Bocko et al. |
| 2006/0223282 A1 | 10/2006 | Amundson et al. |
| 2007/0241436 A1 | 10/2007 | Ookubo et al. |
| 2008/0038885 A1* | 2/2008 | Lee et al. ................. 438/166 |
| 2008/0050548 A1 | 2/2008 | Abrams |
| 2008/0090338 A1* | 4/2008 | Tredwell et al. .............. 438/151 |
| 2008/0105877 A1 | 5/2008 | Yamazaki et al. |
| 2008/0122121 A1 | 5/2008 | Suda et al. |
| 2008/0179594 A1 | 7/2008 | Oh |
| 2009/0004419 A1 | 1/2009 | Cok et al. |
| 2009/0008132 A1 | 1/2009 | Takasawa et al. |
| 2009/0072122 A1 | 3/2009 | Tada et al. |
| 2009/0101903 A1 | 4/2009 | Chen et al. |
| 2009/0202857 A1 | 8/2009 | Kerr et al. |
| 2009/0211791 A1 | 8/2009 | Tredwell et al. |
| 2009/0229874 A1* | 9/2009 | Katagiri et al. .............. 174/262 |
| 2009/0296754 A1 | 12/2009 | Ledentsov et al. |
| 2010/0003512 A1 | 1/2010 | Ookubo et al. |
| 2010/0003513 A1 | 1/2010 | Ookubo et al. |
| 2010/0038023 A1 | 2/2010 | Kho et al. |
| 2010/0059171 A1 | 3/2010 | Chun |
| 2010/0059747 A1 | 3/2010 | Nakayama et al. |
| 2010/0140807 A1 | 6/2010 | Kobayashi et al. |
| 2010/0155694 A1 | 6/2010 | Miller et al. |
| 2010/0219410 A1 | 9/2010 | Godo et al. |
| 2010/0295161 A1 | 11/2010 | Koduri |
| 2010/0330748 A1* | 12/2010 | Chu et al. ................. 438/127 |
| 2011/0064953 A1 | 3/2011 | O'Rourke et al. |
| 2011/0228492 A1 | 9/2011 | Haq et al. |
| 2012/0061672 A1 | 3/2012 | O'Rourke et al. |
| 2012/0146713 A1 | 6/2012 | Kim et al. |
| 2012/0164408 A1 | 6/2012 | Hwu et al. |
| 2012/0168836 A1 | 7/2012 | Lee et al. |
| 2012/0231689 A1* | 9/2012 | Kim et al. ................. 442/181 |
| 2013/0077033 A1 | 3/2013 | Li et al. |
| 2014/0065389 A1* | 3/2014 | Loy et al. ................. 428/214 |
| 2014/0065393 A1* | 3/2014 | Lee et al. ................. 428/216 |
| 2015/0008566 A1* | 1/2015 | Gerber et al. .............. 257/668 |

FOREIGN PATENT DOCUMENTS

| | | |
|---|---|---|
| CN | 101288348 | 10/2008 |
| JP | 01-198094 | 9/1989 |
| JP | 07-022795 | 1/1995 |
| JP | 08-148814 | 7/1996 |
| JP | 11-340462 | 10/1999 |
| JP | 2004-311912 | 11/2004 |
| JP | 2005-123576 | 12/2005 |
| JP | 2007-073559 | 3/2007 |
| JP | 2007-123861 | 5/2007 |
| JP | 2007146121 | 6/2007 |
| JP | 2009-71057 | 4/2009 |
| JP | 2010-067849 | 3/2010 |
| JP | 2010-226101 | 10/2010 |
| KR | 20070103050 A | 10/2007 |
| KR | 100810708 B1 | 3/2008 |
| KR | 10-2009-0098033 | 9/2009 |
| KR | 10-2010-0007703 | 1/2010 |
| KR | 10-2010-0043654 | 4/2010 |
| WO | WO9852391 A1 | 11/1998 |
| WO | 2006088564 A1 | 8/2006 |
| WO | 2007083906 | 7/2007 |
| WO | WO2007108659 A1 | 9/2007 |
| WO | WO2008005979 A1 | 1/2008 |

(56) References Cited

FOREIGN PATENT DOCUMENTS

| WO | WO2010051106 A2 | 5/2010 |
|---|---|---|
| WO | 2010-065542 | 6/2010 |
| WO | 2010138811 | 12/2010 |

OTHER PUBLICATIONS

Machine translation, Goto, Japanese Patent Pub. No. JP 2010-226101 (parts 1 and 2), translation date: Mar. 4, 2015, JPO & Japio, all pages.*
Machine translation, Hirao, Japanese Patent Pub. No. JP 2007-073559, translation date: Mar. 4, 2015, JPO & Japio, all pages.*
Machine translation, Kim, Korean Patent Pub. No. KR 10-2010-0007703, translation date: Mar. 4, 2015, KIPO, all pages.*
Machine translation, Nakayama, Japanese Patent Pub. No. JP 2010-67849, translation date: Mar. 4, 2015, JPO & Japio, all pages.*
International Search Report and Written Opinion from related Int'l Application No. PCT/US2013/058284, Dated Dec. 26, 2013.
International Search Report and Written Opinion from related Int'l Application No. PCT/US2013/058293, Dated Dec. 26, 2013.
International Search Report and Written Opinion from related Int'l Application No. PCT/US2012/066833, Dated Jan. 17, 2013.
International Search Report and Written Opinion from related Int'l Application No. PCT/US2012/032388 dated Dec. 27, 2010, 10 pages. Dec. 10, 2012.
International Search Report and Written Opinion for PCT Application No. PCT/US2011/037226, 11 pages, Feb. 21, 2012.
International Search Report and Written Opinion for PCT Application No. PCT/US2011/037207, 11 pages, Feb. 21, 2012.
International Search Report and Written Opinion for PCT Application No. PCT/US2010/036569, 12 pages, Dec. 27, 2010.
International Search Report and Written Opinion for PCT Application No. PCT/US2009/066259, 9 pages, May 5, 2010.
International Search Report and Written Opinion for PCT Application No. PCT/US2009/066111, 8 pages, Oct. 25, 2010.
International Search Report and Written Opinion for PCT Application No. PCT/US2009/066114, 9 pages, Sep. 3, 2010.
International Search Report and Written Opinion for PCT Application No. PCT/US2014/060501, Jan. 19, 2015.

* cited by examiner

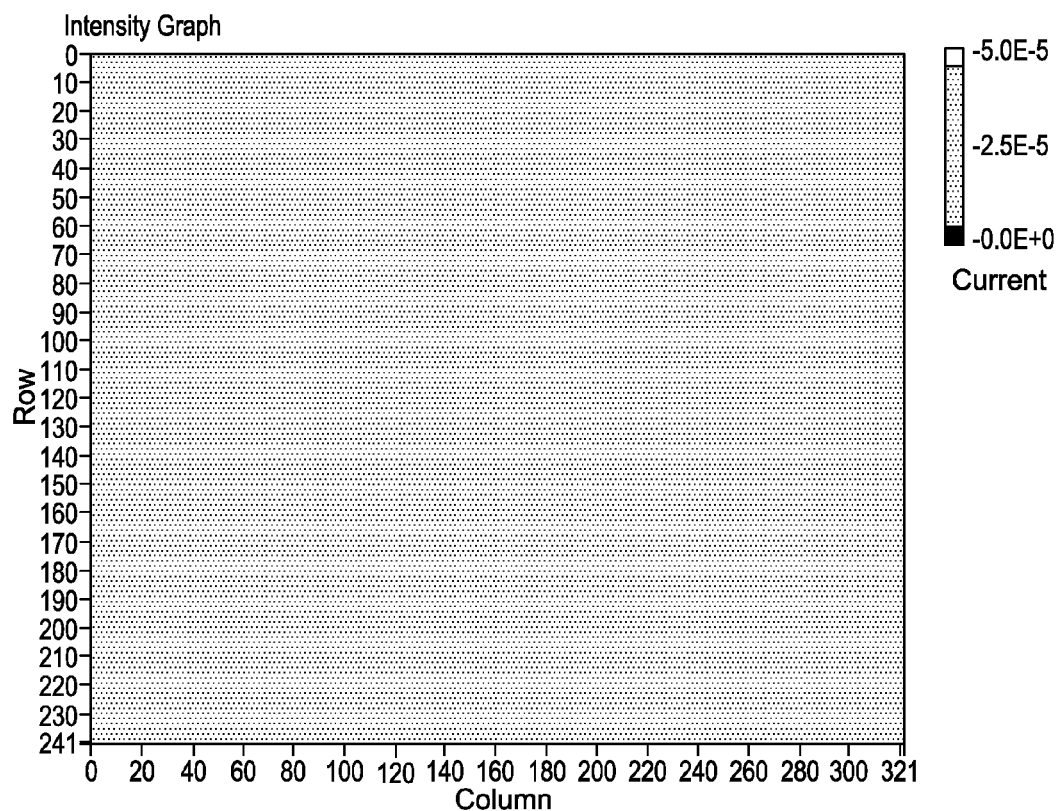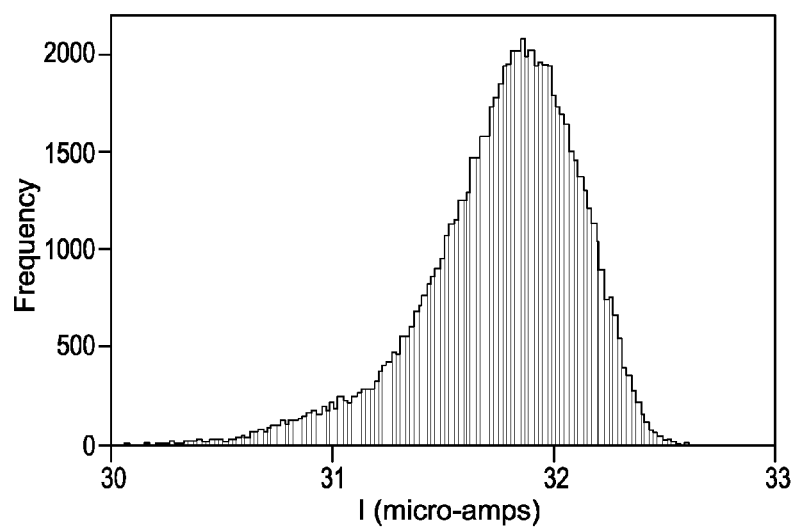
FIG. 12

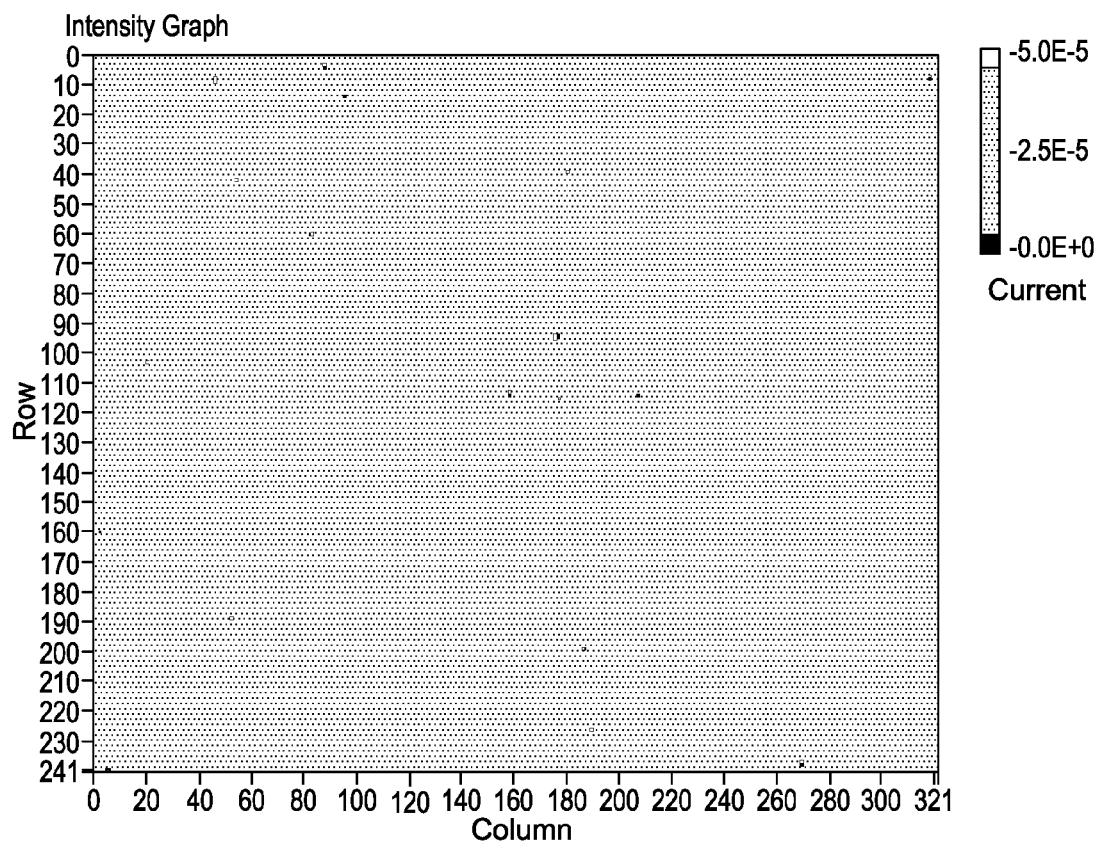
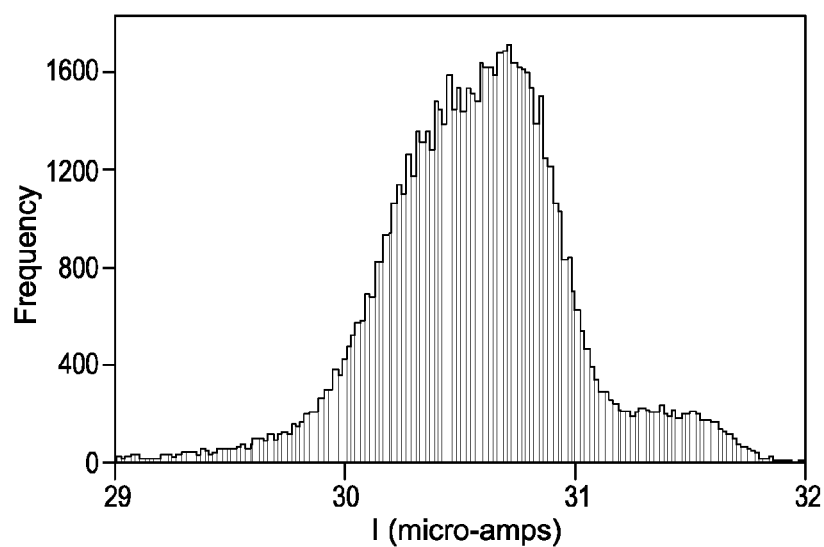
*FIG. 13*

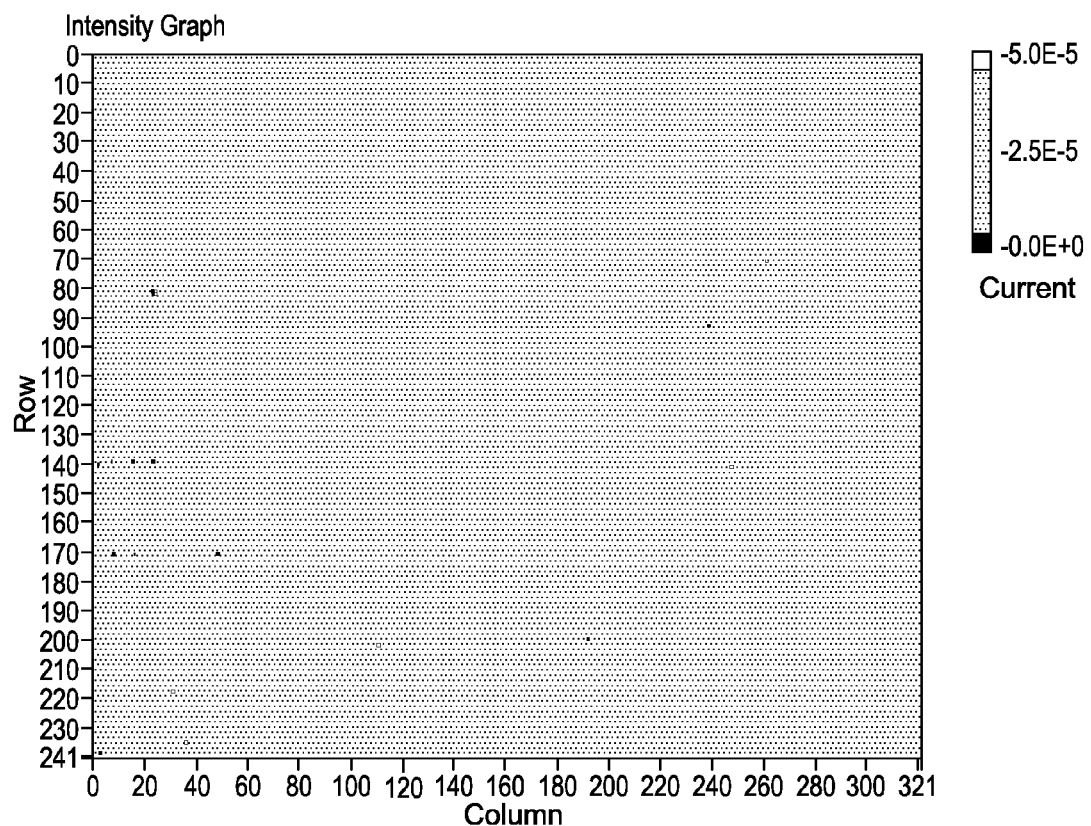
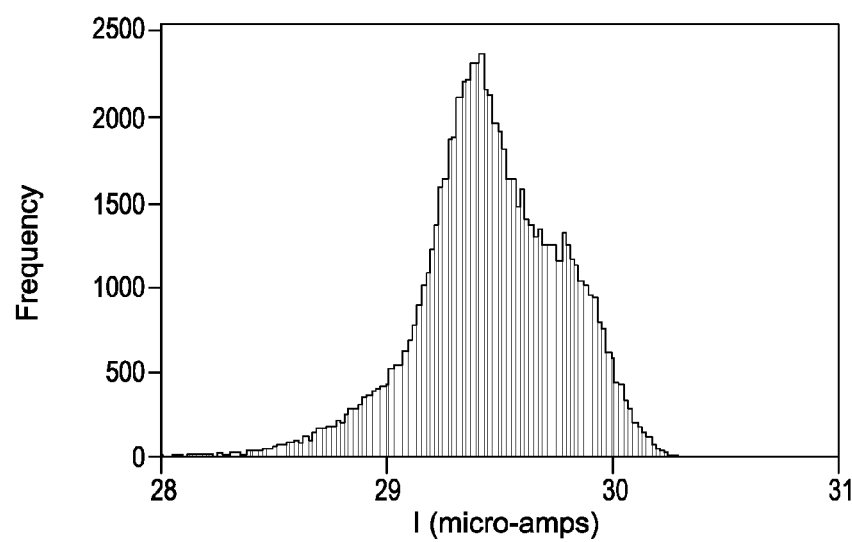
*FIG. 14*

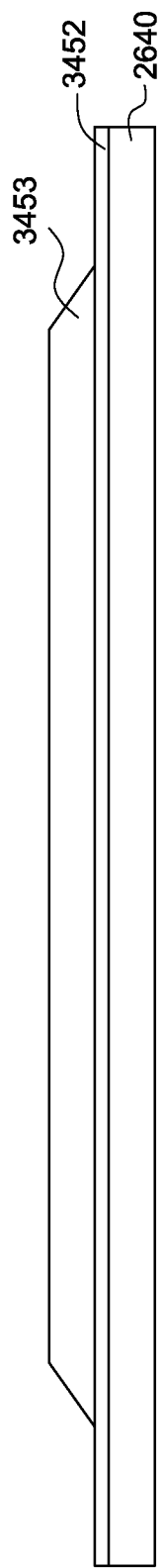
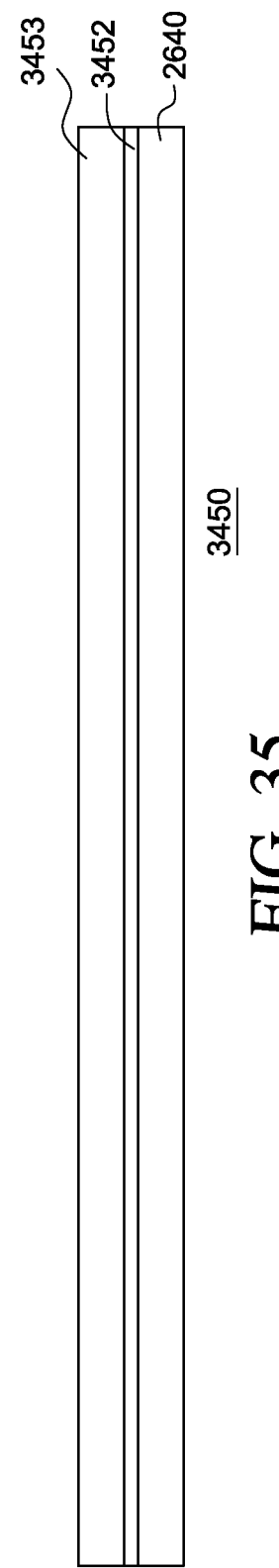

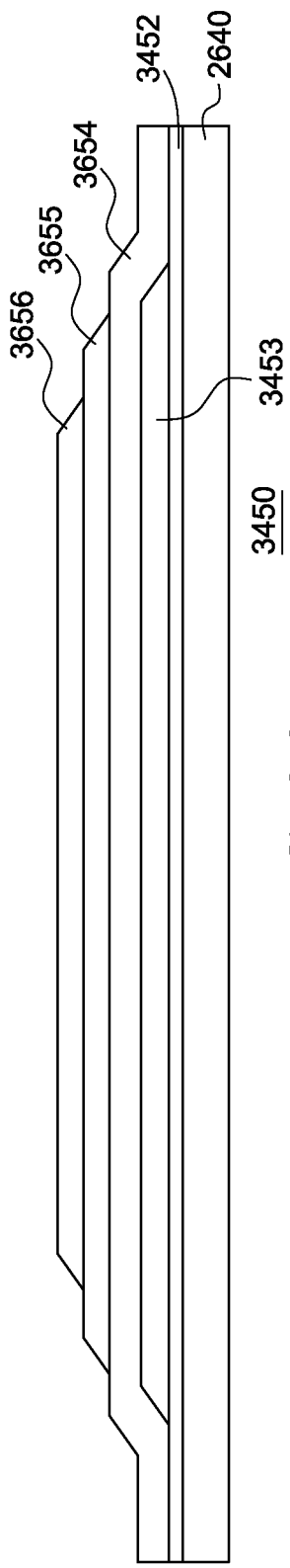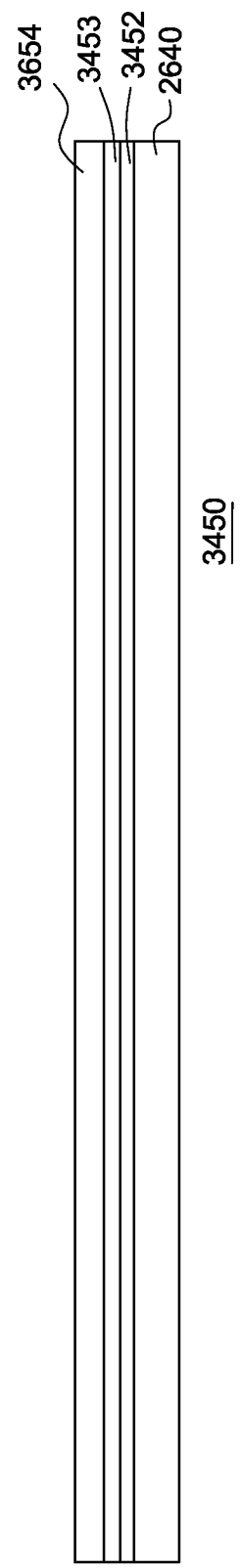

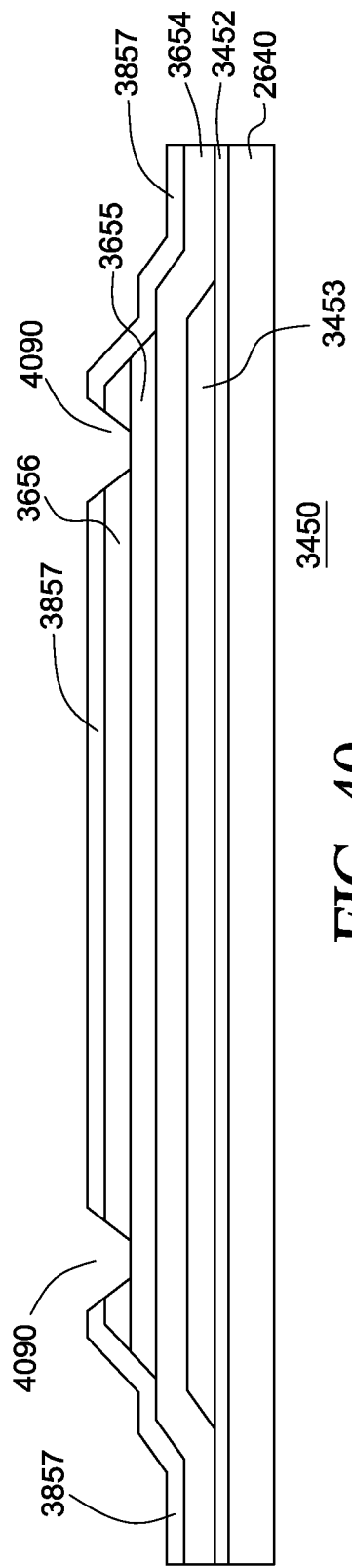
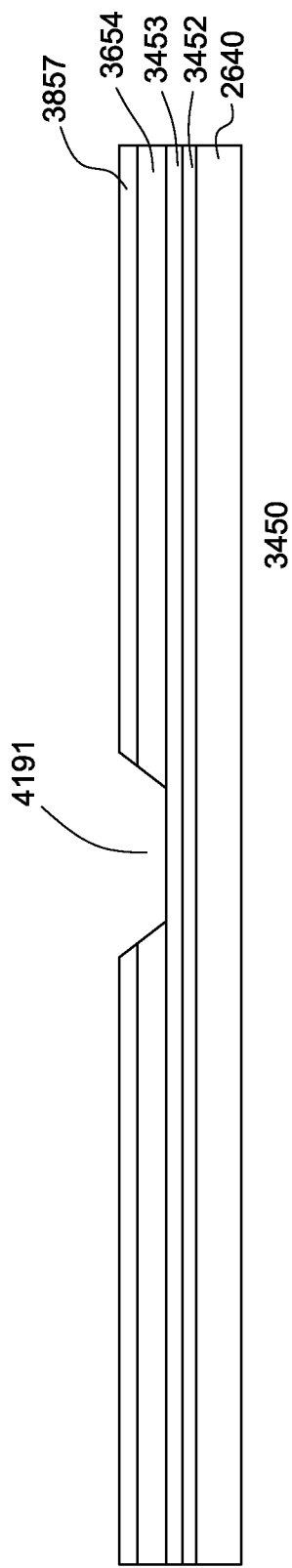

METHOD OF MANUFACTURING ELECTRONIC DEVICES ON BOTH SIDES OF A CARRIER SUBSTRATE AND ELECTRONIC DEVICES THEREOF

CROSS-REFERENCE TO RELATED APPLICATIONS

This application is a continuation application based on International Patent Application Serial No. PCT/US2011/037207, filed May 19, 2011. International Patent Application Serial No. PCT/US2011/037207 claims the benefit of U.S. Provisional Application Ser. No. 61/383,600, filed Sep. 16, 2010, and U.S. Provisional Application Ser. No. 61/347,342, filed May 21, 2010.

Further, this application is a continuation application based on International Patent Application Serial No. PCT/US2011/037226, filed May 19, 2011. International Patent Application Serial No. PCT/US2011/037226 claims the benefit of U.S. Provisional Application Ser. No. 61/389,647, filed Oct. 4, 2010; U.S. Provisional Application Ser. No. 61/383,600, U.S. Provisional Application Ser. No. 61/355,083, filed Jun. 15, 2010; and U.S. Provisional Application Ser. No. 61/347,342.

U.S. Provisional Application Ser. No. 61/389,647, U.S. Provisional Application Ser. No. 61/383,600, U.S. Provisional Application Ser. No. 61/347,342, U.S. Provisional Application Ser. No. 61/355,083, International Patent Application Serial No. PCT/US2011/037207, International Patent Application Serial No. PCT/US2011/037226, and International Patent Application Serial No. PCT/US2010/036569, filed May 28, 2010, are incorporated herein by reference in their entirety.

STATEMENT REGARDING FEDERALLY SPONSORED RESEARCH OR DEVELOPMENT

This invention was made with government support under W911NF-04-2-0005 awarded by the Army Research Office. The government has certain rights in the invention.

FIELD OF THE INVENTION

This invention relates generally to processing electronic devices on flexible substrates, and relates more particularly to processing electronic devices on flexible substrates bonded to both sides of a carrier substrate, and the electronic devices therefrom.

DESCRIPTION OF THE BACKGROUND

Flexible electronics have attracted significant academic and commercial attention in recent years as a result of their potential to revolutionize the interaction between humans and electronic devices. This paradigm shifting technology provides the opportunity to create energy-efficient products that are lightweight, ultrathin, and rugged. It provides further opportunities to create very large area electronics with the ability to flex, curve, conform, and roll. Currently, flexible electronics technology is being actively developed for applications in flexible flat panel display manufacturing, flexible semiconductor manufacturing, flexible electronic manufacturing/processing, flexible solar manufacturing, flexible sensor manufacturing. As a result, a rapidly increasing demand exists for high performance, highly compact and portable devices and methods of high-throughput manufacturing for such devices.

Accordingly, a need or potential for benefit exists for a method that increases the manufacturing output of flexible electronics without sacrificing device efficiencies.

BRIEF DESCRIPTION OF THE DRAWINGS

To facilitate further description of the embodiments, the following drawings are provided in which:

FIG. 12 provides an exemplary thin-film transistor array drive current map and histogram for a rigid silicon first flexible substrate;

FIG. 13 provides an exemplary thin-film transistor array drive current map and histogram for a heat stabilized polyethylene naphthalate first flexible substrate, provided according to the embodiment of FIG. 1;

FIG. 14 provides an exemplary thin-film transistor array drive current map and histogram for a planarized stainless steel first flexible substrate, providing according to the embodiment of FIG. 1;

FIG. 34 illustrates a cross-sectional view of an example of a device build area of a semiconductor device after providing a gate metal layer, according to the embodiment of FIG. 22;

FIG. 35 illustrates a cross-sectional view of an example of a gate contact build area of a semiconductor device after providing the gate metal layer, according to the embodiment of FIG. 22;

FIG. 36 illustrates a cross-sectional view of an example of the device build area of the semiconductor device of FIG. 13 after providing an active stack layer, according to the embodiment of FIG. 22;

FIG. 37 illustrates a cross-sectional view of an example of the gate contact build area of the semiconductor device of FIG. 14 after providing the active stack layer, according to the embodiment of FIG. 22;

FIG. 40 illustrates a cross-sectional view of an example of the device build area of the semiconductor device of FIG. 13 after conducting one or more post-mesa passivation layer etches, according to the embodiment of FIG. 22;

FIG. 41 illustrates a cross-sectional view of an example of the gate contact build area of the semiconductor device of FIG. 14 after conducting one or more post-mesa passivation layer etches, according to the embodiment of FIG. 22;

Figure 1:
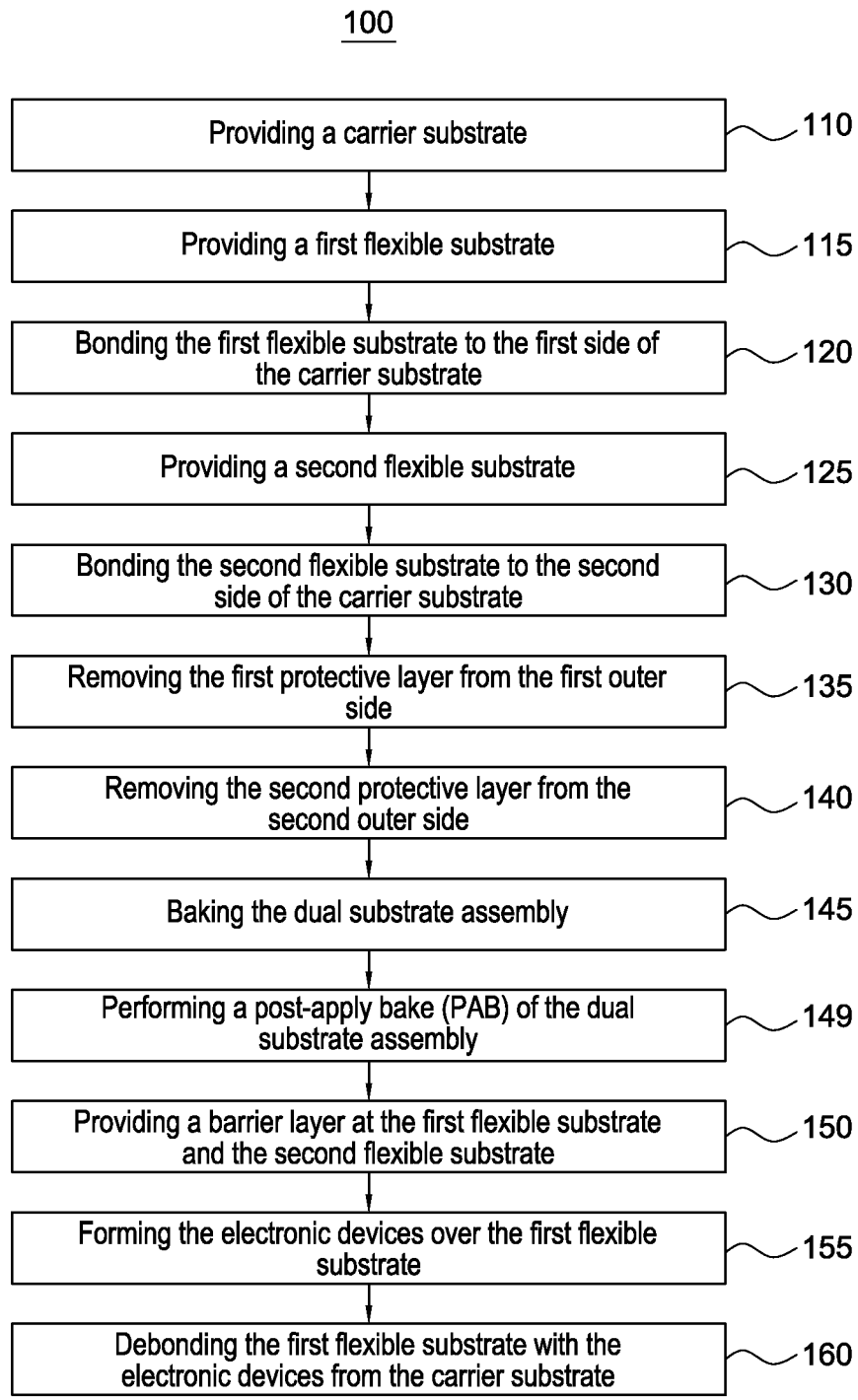
FIG. 1 illustrates an example method of manufacturing electronic devices, according to a first embodiment.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Furthermore, the terms "include," and "have," and any variations thereof, are intended to cover a non-exclusive inclusion, such that a process, method, system, article, device, or apparatus that comprises a list of elements is not necessarily limited to those elements, but may include other elements not expressly listed or inherent to such process, method, system, article, device, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein.

The terms "couple," "coupled," "couples," "coupling," and the like should be broadly understood and refer to connecting two or more elements or signals, electrically, mechanically and/or otherwise. Two or more electrical elements may be electrically coupled but not be mechanically or otherwise coupled; two or more mechanical elements may be mechanically coupled, but not be electrically or otherwise coupled; two or more electrical elements may be mechanically coupled, but not be electrically or otherwise coupled. Coupling may be for any length of time, e.g., permanent or semi-permanent or only for an instant.

"Electrical coupling" and the like should be broadly understood and include coupling involving any electrical signal, whether a power signal, a data signal, and/or other types or combinations of electrical signals. "Mechanical coupling" and the like should be broadly understood and include mechanical coupling of all types.

DETAILED DESCRIPTION OF EXAMPLES OF EMBODIMENTS

Some embodiments can comprise a method of manufacturing at least one first electronic device and at least one second electronic device. The method can comprise: providing a carrier substrate having a first side and a second side, a first substrate bonded to the first side of the carrier substrate, and a second substrate bonded to the second side of the carrier substrate; depositing at least one layer of a first material over the first substrate while the first substrate is bonded to the first side of the carrier substrate to create a portion of the at least one first electronic device; and depositing at least one layer of a second material over the second substrate while the second substrate is bonded to the second side of the carrier substrate to create a portion of the at least one second electronic device. In many embodiments, at least one of the first substrate or the second substrate comprises a flexible substrate.

Other embodiments can comprise a method. The method can comprise: providing a carrier substrate having a first side and a second side, where the first substrate is bonded to the first side of the carrier substrate and at least a portion of an electronic device is located at the second side of the carrier substrate; depositing a first gate metal layer over the first substrate while the first substrate is bonded to the first side of the carrier substrate; depositing a first silicon comprising layer over the first gate metal layer while the first substrate is bonded to the first side of the carrier substrate; depositing a first contact element over the first silicon comprising layer while the first substrate is bonded to the first side of the carrier substrate, where the first contact element comprises a first diffusion barrier; depositing a first dielectric material over the first contact element while the first substrate is bonded to the first side of the carrier substrate, where the first dielectric material comprises an organic siloxane-based dielectric material; depositing a second dielectric material over the first dielectric material while the first substrate is bonded to the first side of the carrier substrate, where the second dielectric material comprises a silicon nitride material; and baking the second dielectric material, the first dielectric material, the first contact element, the first silicon comprising layer, the first gate metal layer, the first substrate, the at least the portion of the electronic device, and the carrier substrate while the first substrate is bonded to the first side of the carrier substrate. In many embodiments, the first substrate comprises a first flexible substrate.

Further embodiments can comprise an electrical device structure comprising a carrier substrate having a first side and a second side. In many embodiments, the structure can further comprise a first electronic device located at the first side of the carrier substrate. In the same or different embodiments, the first electronic device can comprise a first flexible substrate located at the first side of the carrier substrate. In further embodiments, the first electronic device can comprise a first metal gate layer over the first flexible substrate. In still further embodiments, the first electronic device can comprise a first amorphous silicon layer over the first metal gate layer. In still further embodiments, the first electronic device can comprise a first N+ amorphous silicon layer over the first amorphous silicon layer. In still further embodiments, the first electronic device can comprise a first diffusion barrier. In still further embodiments, the first electronic device can comprise a first metal layer. In the same or different embodiments, the first diffusion barrier can be positioned between the first metal layer and the first N+ amorphous silicon layer. In many embodiments, the structure can further comprise a second electronic device located at the second side of the carrier substrate.

The term "bowing" as used herein means the curvature of a substrate about a median plane, which is parallel to the top and bottom sides, or major surfaces of the substrate. The term "warping" as used herein means the linear displacement of the surface of a substrate with respect to a z-axis, which is perpendicular to the top and bottom sides, or major surfaces of the substrate. The term "distortion" as used herein means the displacement of a substrate in-plane (i.e., the x-y plane, which is parallel to the top and bottom sides, or major surfaces of the substrate). For example, distortion could include shrinkage in the x-y plane of a substrate and/or expansion in the x-y plane of the substrate. The term "deformation" as used herein means a change in the configuration of a substrate resulting from the effect of at least one of bowing, warping, or distortion.

The term "CTE matched material" as used herein means a material that has a coefficient of thermal expansion (CTE) which differs from the CTE of a reference material by less than about 20 percent (%). In different embodiments, the CTEs differ by less than about 10%, 5%, 3%, or 1%. As used herein, "polish" can mean to lap and polish a surface or to only lap the surface.

The term "flexible substrate" as used herein means a freestanding substrate comprising a flexible material which readily adapts its shape.

Turning to the figures, FIG. 1 illustrates an example of method 100 of manufacturing electronic devices, according to a first embodiment. In the same or different embodiments, method 100 can be considered a method of bonding flexible substrates to dual sides of a carrier substrate to mitigate stress and thermal expansion differences between the flexible substrates and the carrier substrate. Method 100 is merely exemplary and is not limited to the embodiments presented herein. Method 100 can be employed in many different embodiments or examples not specifically depicted or described herein.

Figure 2:
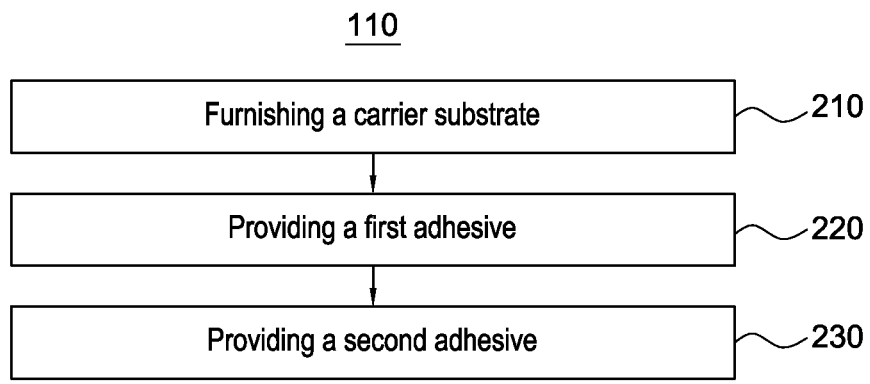
FIG. 2 illustrates an example method of providing a carrier substrate, according to the embodiment of FIG. 1.

In some embodiments, method 100 comprises procedure 110 of providing a carrier substrate. In some embodiments, procedure 110 can comprise various processes. FIG. 2 is a flow chart illustrating procedure 110 of providing a carrier substrate, according to the first embodiment.

Referring to FIG. 2, in some embodiments, procedure 110 comprises process 210 of furnishing a carrier substrate. In many examples, the carrier substrate can comprise a first side and a second side. In many further examples, the carrier substrate can comprise a first side, a second side, and a first adhesive at the first side. In other examples, the carrier substrate can further comprise a mechanism configured to compensate for deformation of the carrier substrate. In some embodiments of procedure 110, the mechanism is provided as part of procedure 125, described below, instead of being part of procedure 110. In various examples, the carrier substrate also can comprise a second adhesive at the second side. In some embodiments of procedure 110, either or both of the first adhesive and the second adhesive are provided at the carrier substrate according to processes 220 and 230, described below, instead of being part of process 210.

In many examples, the carrier substrate can be rigid. In these or other examples, the increase in rigidity of the carrier substrate provided by increasing the thickness of the carrier substrate can be balanced against the increase in cost and weight provided by increasing the thickness of the carrier substrate. In many examples, the carrier substrate can be a 6, 8, 12, or 18 inch wafer or panel. In the same or different examples, increasing the radius of the wafer can help to maintain the planarity of the carrier substrate. In some examples, the carrier substrate can be a wafer or a panel of approximately 370 millimeters (mm) by 470 mm.

In some examples, the carrier substrate can comprise a material having a glass transition point greater than or equal to approximately 300 degrees Celsius (° C.). In the same or different examples, the carrier substrate can have a thickness greater than or equal to approximately 0.5 mm and less than or equal to approximately 2.0 mm. In various examples, the carrier substrate can be a material comprising at least one of the following: alumina ($Al_2O_3$), silicon, low CTE glass, steel, sapphire, barium borosilicate, soda lime silicate, alkali silicate, or a first material that is CTE matched to a second material comprising at least one of polyethylene naphthalate (PEN), polyethylene terephthalate (PET), polyethersulfone (PES), polyimide, polycarbonate, cyclic olefin copolymer, or liquid crystal polymer. In some examples, where the carrier substrate is bonded to another material, the CTE of the carrier substrate can be matched to the CTE of the second material to reduce the formation of stress between the carrier substrate and the second material. In some embodiments, the carrier substrate can be of high purity to minimize ion leaching from the carrier substrate that could degrade ultimate electronic device performance.

In more specific examples, the carrier substrate could comprise sapphire with a thickness between approximately 0.7 mm and approximately 1.1 mm. In other examples, the carrier substrate also could comprise 96% alumina with a thickness between approximately 0.7 mm and approximately 1.1 mm. In different examples, the thickness of the 96% alumina can be approximately 2.0 mm. In another example, the carrier substrate could be a single crystal silicon wafer with a thickness of at least approximately 0.65 mm. In still a further examples, the carrier substrate can comprise stainless steel with a thickness of at least approximately 0.5 mm. In some examples, the carrier substrate is slightly larger than the flexible substrate.

In some examples, at least one side of the carrier substrate can comprise a single micrometer roughness. In the same or different examples, roughening the surface of the carrier substrate to a single micrometer roughness can improve the adhesive wetting properties of the carrier substrate. In many examples, minimizing the surface roughness of the carrier substrate above the single micrometer can help to prevent high spots from forming later during method 100 (FIG. 1). In various examples, etching a side of the carrier substrate can provide a single micrometer roughness. In some examples, etching a side of the carrier substrate can be performed using a Frost etching and/or a Plasma Enhanced etching. In further examples, etching a side of the carrier substrate can be performed using a wet etching.

In some examples, the carrier substrate can be designed to minimize stress development during method 100 (FIG. 1). In many embodiments, minimizing the initial stress in the carrier substrate and matching the CTE of the carrier substrate to the flexible substrate, described below, can help to minimize stress development. In further examples, minimizing stress can help to reduce the development of deformation of the carrier substrate during method 100 (FIG. 1) in the event of a vacuum failure of a vacuum chuck.

In some examples, the first adhesive and the second adhesive can comprise similar or identical materials while in other examples, the first adhesive and the second adhesive can comprise different materials. In various examples, each of the first adhesive and the second adhesive can comprise Henkel NS122 and/or can have a thickness greater than or equal to approximately 3 micrometers (μm) and less than or equal to approximately 50 μm. In further examples, the first adhesive and the second adhesive neither comprise Henkel NS122 nor have a thickness greater than or equal to approximately 3 μm and less than or equal to approximately 50 μm. Meanwhile, in other examples, the first adhesive and the second adhesive can comprise a pressure sensitive adhesive and/or can have a thickness greater than or equal to approximately 3 μm and less than or equal to approximately 250 μm. In various examples, the first adhesive or the second adhesive neither comprise a pressure sensitive adhesive nor have a thickness greater than or equal to approximately 3 μm and less than or equal to approximately 250 μm. In many examples, the first adhesive and/or the second adhesive can comprise a "semiconductor grade" adhesive to avoid particle formation in a clean room environment, impurities that might contaminate the thin-film transistors (TFTs), and cause outgassing in vacuum processing tools.

In some embodiments, procedure 110 can comprise process 220 of providing a first adhesive, as illustrated in FIG. 2. In other embodiments, process 220 can instead be performed as process 430 (FIG. 4) of procedure 115, as described below.

Figure 3:
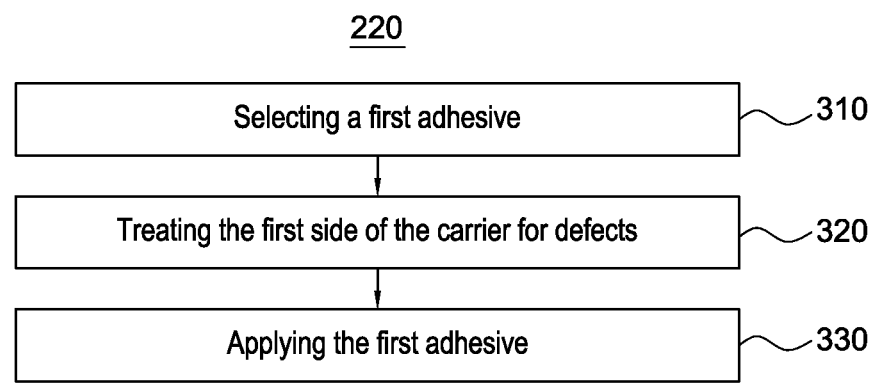
FIG. 3 illustrates an example method of providing a first adhesive, according to the embodiment of FIG. 1.

Meanwhile, some embodiments of method 100 can comprise performing both process 220 and process 430. In various embodiments, process 220 can comprise activity 310 (FIG. 3) of selecting a first adhesive. In many examples, the first adhesive of activity 310 can comprise at least one of the embodiments of the first adhesive and/or the second adhesive, where applicable, of procedure 110 above. FIG. 3 is a flow chart illustrating activity 310 of selecting a first adhesive, according to the first embodiment.

In some embodiments, after activity 310 in FIG. 3, process 220 can comprise activity 320 of treating the first side of the carrier for defects. In many examples, the first side of the carrier can be treated with an oxygen plasma ash. In the same or different examples, the oxygen plasma ash treatment can be applied for six minutes. In various examples, treating the side of the carrier within approximately 48 hours of applying the first adhesive can help to remove carbon deposits from the first side of the carrier in order to provide improved wetting of the first adhesive to the first side of the carrier.

In various embodiments, process 220 also can comprise activity 330 of applying the first adhesive. In some examples, activity 330 of applying the first adhesive can comprise one or more of spin-coating, spray-coating, extrusion-coating, preform laminating, slot die coating, screen laminating, and/or screen printing. In many examples, activity 330 of applying the first adhesive can comprise applying the first adhesive to the first side of the carrier substrate.

Returning to FIG. 2, in some embodiments, procedure 110 can comprise process 230 of providing a second adhesive. In some embodiments, process 230 can be similar to process 220. Accordingly, in various embodiments, process 230 can comprise performing activity 310 (FIG. 3) for a second adhesive. In some embodiments, process 230 can comprise performing activity 320 (FIG. 3) for the second side of the carrier. In further embodiments, process 230 can comprise performing activity 330 (FIG. 3) for the second adhesive and for the second side of the carrier substrate. In many examples, the embodiments of activities 310, 320, and 330 (FIG. 3) of process 230 can comprise the same embodiments of activities 310, 320, and 330 of process 220. For example, like the first adhesive of process 220, the second adhesive of process 230 can comprise at least one of the embodiments of the first adhesive and/or the second adhesive, where applicable, of procedure 110 above. In some embodiments, instead of performing process 230 as part of procedure 110, process 230 can be performed as process 630 of procedure 125, as described below. Meanwhile, some embodiments of method 100 can comprise performing both process 220 and process 630.

Figure 4:
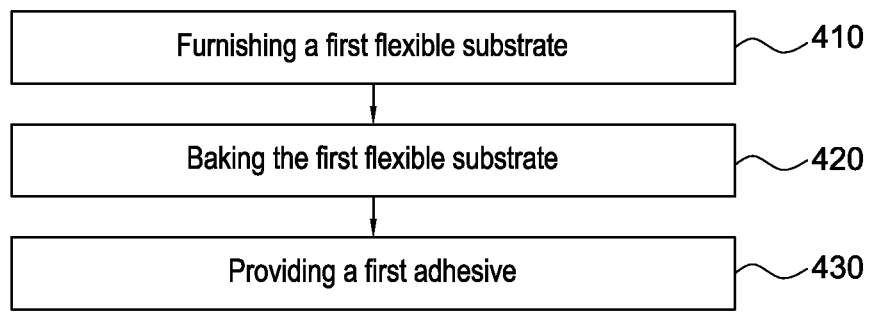
FIG. 4 illustrates an example method of providing a first flexible substrate, according to the embodiment of FIG. 1.

Referring back to FIG. 1, in many embodiments, method 100 comprises a procedure 115 of providing a first flexible substrate. FIG. 4 is a flow chart illustrating procedure 115 of providing a first flexible substrate, according to the first embodiment.

In some embodiments, procedure 115 can comprise a process 410 of furnishing a first flexible substrate, as illustrated in FIG. 4. In some examples, the first flexible substrate can comprise a first outer side. In other examples, the first flexible substrate can comprise a first carrier side. In many examples, the first flexible substrate can comprise both a first outer side and a first carrier side. In some examples, process 410 of furnishing a first flexible substrate can comprise cutting a sheet of plastic substrate from a roll of the plastic material using a paper cutter or a pair of ceramic scissors. In various examples, after cutting the plastic substrate, the cut sheet can be blown clean with a nitrogen gun. In some embodiments of procedure 115, either or both of the cutting and blowing activities can be part of process 420, described below, instead of being part of process 410. In many examples, the first flexible substrate can be cut to a size twenty percent (20%) larger than the final size to be bonded according to procedure 120 below. Cutting the first flexible substrate 20% larger than the final size can compensate for shrinkage of the first flexible substrate that can occur during process 420 as described below.

In many examples, the first flexible substrate can comprise a material. In various examples, the first flexible substrate can comprise a plastic substrate. Plastic substrates are typically optically transparent and thus can be compatible with both bottom emitting and top emitting organic light emitting diode (OLED) device architectures. In various further examples, the first flexible substrate can comprise a thermoplastic polymer substrate. In some examples, the first flexible substrate can comprise polyethylene naphthalate (PEN), polyethylene terephthalate (PET), polyethersulfone (PES), polyimide, polycarbonate, cyclic olefin copolymer, or liquid crystal polymer. In the same or different examples, the first flexible substrate has a thickness greater than or equal to approximately 3 micrometers and less than or equal to approximately 100 micrometers. For example, the first flexible substrate can comprise a PEN substrate from DuPont Teijin Films of Tokyo, Japan, sold under the tradename "planarized Teonex® Q65." In other examples, the first flexible substrate comprises a metal foil. Metal foil substrates can offer an advantages of allowing higher processing temperatures. In many examples, plastic substrates can have a lower cost potential compared to metal foil substrates.

In many examples, potential considerations when selecting a first flexible substrate can comprise dimensional stability, thermal stability, clarity, solvent resistance, permeability of oxygen and moisture, surface roughness, and inertness to process chemicals. In some examples, the first flexible substrate could have at least one of: a glass transition temperature that is compatible with device process temperatures so that the first flexible substrate is thermally and dimensionally stable, a low moisture uptake, a CTE of less than 20 parts per million per degree Celsius (ppm/° C.), good surface properties, compatibility with TFT process chemistry, and an optical transmission in the visible range exceeding 87%.

In some examples, the first flexible substrate can have a coating at one or more sides of the first flexible substrate. In some examples, the coating can improve the scratch resistance of the first flexible substrate and/or help prevent outgassing or oligomer crystallization on the surface of the substrate. In the same or different examples, the coating can planarize the side of the first flexible substrate over which it is located. In further examples, the coating can help decrease distortion. In some examples, the coating is located only at one side of the first flexible substrate. In other examples, the coating is at both sides of the first flexible substrate. In various embodiments, the first flexible substrate can be pre-planarized. In some examples, the first flexible substrate can be electrically insulated.

In some embodiments, procedure 115 can comprise process 420 of baking the first flexible substrate, as illustrated in FIG. 4. Baking the first flexible substrate can help release oligomers and other chemicals in the flexible substrate that could potentially leach out later during method 100 (FIG. 1). In many examples, process 410 and/or 420 can be performed before procedure 220 and/or 230.

In some examples, process 420 of baking the first flexible substrate can comprise vacuum baking the first flexible substrate. In various examples, the temperature in an oven containing the first flexible substrate can be ramped up over approximately two to three hours from room temperature to approximately 160° C. to approximately 200° C. The first flexible substrate can be baked for one hour at approximately 160° C. to approximately 200° C. and at a pressure of approximately one milliTorr (mTorr) to approximately one Torr. Then, the temperature in the oven can be lowered to between approximately 90° C. to approximately 115° C. over 0.5 to 3 hours, and the first flexible substrate can be baked for approximately eight more hours at the lower temperature. In further examples, other baking processes also can be used. In some embodiments, after the baking process is complete, the first flexible substrate can be wiped clean of any residues or chemicals that were baked off.

In some embodiments, procedure 115 can comprise process 430 of providing a first adhesive, as illustrated in FIG. 4. In some embodiments, process 430 can be similar to process 220. Accordingly, in various examples, process 430 can comprise performing activity 310 (FIG. 3) for a first adhesive. In some examples, process 430 can comprise performing activity 320 (FIG. 3) for the first side of the carrier. In further embodiments, process 430 can comprise performing activity 330 (FIG. 3) for the first adhesive and for the first carrier side of the first flexible substrate. In many examples, the embodiments of activities 310, 320, and 330 (FIG. 3) of process 430 can comprise the same embodiments of activities 310, 320, and 330 (FIG. 3) of process 220. For example, like the first adhesive of process 220, the first adhesive of process 430 can comprise at least one of the embodiments of the first adhesive and/or the second adhesive, where applicable, of procedure 110 above.

Figure 5:
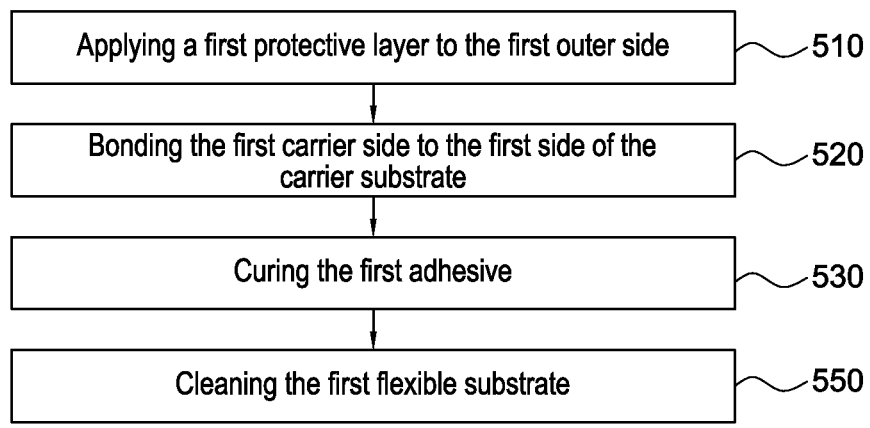
FIG. 5 illustrates an example method of bonding the first flexible substrate to the first side of the carrier substrate, according to the embodiment of FIG. 1.

Referring back to FIG. 1, in some embodiments, method 100 comprises procedure 120 of bonding the first flexible substrate to the first side of the carrier substrate. FIG. 5 is a flow chart illustrating procedure 120 of bonding the first flexible substrate to the first side of the carrier substrate, according to the first embodiment. In many examples, procedure 120 of bonding the first flexible substrate to the first side of the carrier substrate can limit the bowing of the bonded system due to CTE mismatches between the first flexible substrate and the carrier substrate. The CTE of most available flexible substrate materials is often significantly greater than the CTE for many readily available rigid inorganic carrier substrates. Bowing during processing can lead to wafer handling problems in processing equipment and/or delamination of the flexible substrate from the carrier. In many examples, procedure 115 can be performed prior to procedure 120.

In many examples, the first adhesive bonds the first carrier side to the first side of the carrier substrate. In some examples, the first adhesive can form a bond between the first carrier side and the first side of the carrier substrate, where the bond is strong enough to withstand the full range of TFT fabrication conditions experienced during photolithography, thermal vacuum, reactive plasma, wet acid/base, and solvent processes. In the same or different examples, the first adhesive can form a bond between the first carrier side and the first side of the carrier substrate, where the bond can be easily separated when desired. In still other examples, the first adhesive can initially behave like a liquid, but can later behave like a solid upon bonding the first flexible substrate and the carrier substrate to sustain stresses of the joint and to provide sufficient shear strength between the first flexible substrate and the carrier substrate. In further embodiments, the first adhesive also can fix the position of the first flexible substrate during processing to minimize distortion.

In some embodiments, procedure 120 can comprise process 510 of applying a first protective layer to the first outer side, as illustrated in FIG. 5. In various examples, process 510 of applying a first protective layer to the first outer side can comprise applying a first protective layer to all of the first outer side. In other examples, process 510 of applying a first protective layer to the first outer side can comprise applying a first protective layer to a part of the first outer side. In some examples, process 510 is omitted so that no protective layer is applied to the first outer side, or the first flexible substrate is furnished with the protective layer.

In some examples, the first protective layer prevents scratches on the first flexible substrate. In other examples, the first protective layer prevents adhesive from covering at least a portion of the flexible substrate and thus, reduces defects. In many examples, the first protective layer comprises blue low tack tape (e.g. from Semiconductor Equipment Corporation, part number 18133-7.50) or mylar. In the same or different examples, the first protective layer can be approximately 25 µm to approximately 100 µm thick. In some examples, the first protective material can be approximately 70 µm thick. In many examples, the first protective material can be applied by rolling the first protective material onto the outer surface of the first flexible substrate using a roller to remove air bubbles between the first protective layer and the first flexible substrate.

In some embodiments, procedure 120 continues with process 520 of bonding the first carrier side to the first side of the carrier substrate, as illustrated in FIG. 5. In some examples, process 520 of bonding the first carrier side to the first side of the carrier substrate comprises roll pressing the first carrier side of the first flexible substrate to the first side of the carrier substrate. In the same or different examples, the roll pressing can occur at a pressure greater than or equal to approximately 5 pounds per square inch (psi) and less than or equal to approximately 60 psi, at a temperature greater than or equal to approximately 30° C. and less than or equal to approximately 100° C., and/or at a feed rate greater than or equal to approximately 0.25 meters per minute and less than or equal to approximately one meter per minute. In the other examples, the roll pressing can occur under other conditions.

In some embodiments, procedure 120 can comprise process 530 of curing the first adhesive. In various examples, process 530 of curing the first adhesive can comprise providing ultraviolet radiation and/or providing thermal radiation.

In many examples, providing ultraviolet radiation can comprise exposing the first adhesive to UV light for approximately 15 to 25 seconds at room temperature. In some examples, the adhesive can be cured with UV light in the UV light range of approximately 200 nm (nanometers) to approximately 450 nm and with an intensity of approximately 75 milliWatts per square centimeter (mW/cm2). In the same or different examples, a Dymax 2000-EC UV Curing Flood Lamp, manufactured by Dymax Corporation of Torrington, Conn., can be used to cure the first adhesive.

In some examples, providing thermal radiation can comprise vacuum baking the first adhesive. In various examples, the temperature in an oven containing the flexible substrate can be ramped up over approximately two to three hours from room temperature to approximately 160° C. to approximately 190° C. The first adhesive can be baked for 50 minutes to 120 minutes at approximately 180° C. and at a pressure of approximately one mTorr to approximately one Torr. Then, the temperature in the oven can be lowered to between approximately 90° C. to approximately 115° C., and the first adhesive can be baked for approximately seven more hours to approximately nine more hours at the lower temperature. Other baking processes also can be used. In many examples, after the baking process is complete, the first flexible substrate is cleaned and placed in an oven at approximately 90° C. to 110° C. for a minimum of approximately two hours.

In some embodiments, procedure 120 can comprise process 550 of cleaning the first flexible substrate. In many examples, process 550 of cleaning the first flexible substrate comprises applying a surfactant to at least the first flexible substrate, performing a quick-dump-rinse (QDR), and performing a spin-rinse-dry (SRD). In other examples, process 550 of cleaning the first flexible substrate comprises applying a surfactant to at least the first flexible substrate, performing a quick-dump-rinse (QDR), and performing a isopropyl alcohol (IPA) dry. In further examples, process 550 can comprise performing an ultrasonic clean in a solution of ammonium hydroxide ($NH_4OH$) and water ($H_2O$) at a ratio of 100 to 1.

Figure 6:
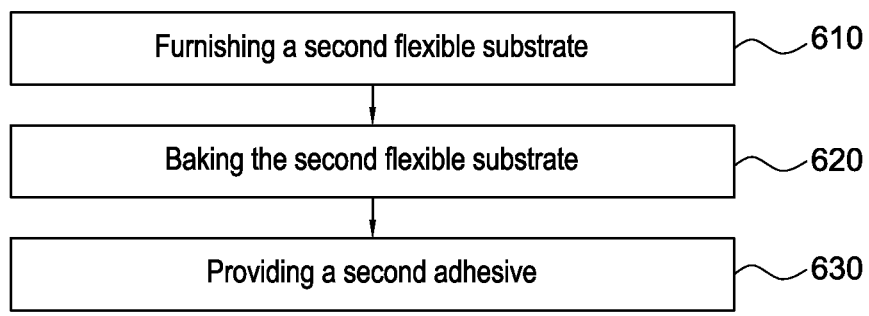
FIG. 6 illustrates an example method of providing a second flexible substrate, according to the embodiment of FIG. 1.

Referring back to FIG. 1, in many embodiments, method 100 comprises procedure 125 of providing a second flexible substrate. FIG. 6 is a flow chart illustrating procedure 125 of providing a second flexible substrate, according to the first embodiment. In many examples, the mechanism configured to compensate for a deformation of the carrier substrate, as described in process 210 above, comprises the second flexible substrate and the second adhesive.

In some embodiments, procedure 125 can comprise process 610 of furnishing a second flexible substrate, as illustrated in FIG. 6. In some examples, the second flexible substrate can comprise a second outer side. In other examples, the second flexible substrate can comprise a second carrier side. In many examples, the second flexible substrate can comprise both a second outer side and a second carrier side. In some examples, process 610 of furnishing a second flexible substrate can comprise cutting a sheet of plastic substrate from a roll of the plastic material using a paper cutter or a pair of ceramic scissors. In various examples, after cutting the plastic substrate, the cut sheet can be blown clean with a nitrogen gun. In some examples of procedure 125, either or both of the cutting and blowing activities can be part of a process 620, described below, instead of being part of process 610. In many examples, the second flexible substrate can be cut to a size 20% larger than the final size to be bonded according to procedure 130 described below. Cutting the first flexible substrate 20% larger than the final size can compensate for shrinkage of the first flexible substrate that can occur during process 620 as described below.

In many examples, the second flexible substrate can comprise a material. In various examples, the second flexible substrate can comprise a plastic substrate. In various further examples, the second flexible substrate can comprise a thermoplastic polymer substrate. In some examples, the second flexible substrate can comprise polyethylene naphthalate (PEN), polyethylene terephthalate (PET), polyethersulfone (PES), polyimide, polycarbonate, cyclic olefin copolymer, or liquid crystal polymer. In the same or different examples, the second flexible substrate has a thickness greater than 3 micrometers and less than 100 micrometers. For example, the second flexible substrate can comprise a PEN substrate from DuPont Teijin Films of Tokyo, Japan, sold under the tradename "planarized Teonex® Q65." In other examples, the second flexible substrate comprise a metal foil.

In many examples, potential considerations when selecting a second flexible substrate can comprise dimensional stability, thermal stability, clarity, solvent resistance, permeability of oxygen and moisture, surface roughness, and inertness to process chemicals. In some examples, the second flexible substrate could have at least one of: a glass transition temperature that is compatible with device process temperatures so that the second flexible substrate is thermally and dimensionally stable, a low moisture uptake, a CTE of less than 20 parts per million per degree Celsius (ppm/° C.), good surface properties, compatibility with TFT process chemistry, and an optical transmission in the visible range exceeding 87%.

In some examples, the second flexible substrate can have a coating at one or more sides of the second flexible substrate. In some examples, the coating can improve the scratch resistance of the second flexible substrate and/or help prevent outgassing or oligomer crystallization on the surface of the substrate. In the same or different examples, the coating can planarize the side of the second flexible substrate over which it is located. In further examples, the coating can help decrease distortion. In some examples, the coating is located only at one or both sides of the second flexible substrate. In various examples, the second flexible substrate can be pre-planarized. In some examples, the second flexible substrate can be electrically insulated.

In some embodiments, process 125 can comprise process 620 of baking the second flexible substrate, as illustrated in FIG. 6. Baking the second flexible substrate can help release oligomers and other chemicals in the flexible substrate that could potentially leach out later during method 100 (FIG. 1). In many examples, process 610 and/or 620 can be performed before process 220 and/or 230.

In some examples, process 620 of baking the second flexible substrate can comprise vacuum baking the second flexible substrate. In various examples, the temperature in an oven containing the second flexible substrate can be ramped up over approximately two to three hours from room temperature to approximately 160° C. to approximately 200° C. The second flexible substrate can be baked for one hour at approximately 160° C. to approximately 200° C. and at a pressure of approximately one milliTorr (mTorr) to approximately one Torr. Then, the temperature in the oven can be lowered to between approximately 90° C. to approximately 115° C. over 0.5 to 3 hours, and the second flexible substrate can be baked for approximately eight more hours at the lower temperature. In further examples, other baking processes also can be used. In some examples, after the baking process is complete, the second flexible substrate can be wiped clean of any residues or chemicals that were baked off.

In some embodiments, procedure 125 can comprise process 630 of providing a second adhesive, as illustrated in FIG. 4. In some examples, process 630 can be similar to process 230 (FIGS. 2 and 3). Accordingly, in various examples, process 630 can comprise performing activity 310 (FIG. 3) for a second adhesive. In some examples, process 630 can comprise performing activity 320 (FIG. 3) for the second side of the carrier. In further examples, process 630 can comprise performing activity 330 (FIG. 3) for the second adhesive and for the second carrier side of the second flexible substrate. In many examples, the examples of activities 310, 320, and 330 (FIG. 3) of process 630 can comprise the same examples of activities 310, 320, and 330 (FIG. 3) of process 220. For example, like the first adhesive of process 220, the first adhesive of process 630 can comprise at least one of the examples of the first adhesive and/or the second adhesive, where applicable, of procedure 110 above.

Figure 7:
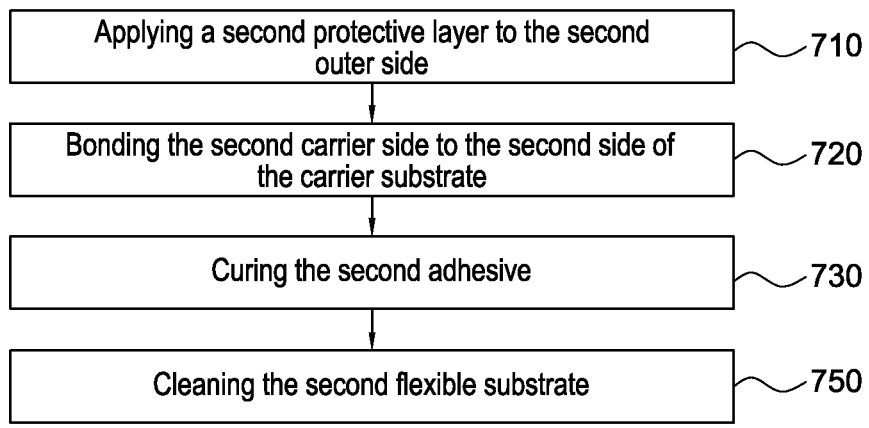
FIG. 7 illustrates an example method of bonding the second flexible substrate to the second side of the carrier substrate, according to the embodiment of FIG. 1.

Referring back to FIG. 1, in some embodiments, method 100 comprises a procedure 130 of bonding the second flexible substrate to the second side of the carrier substrate. FIG. 7 is a flow chart illustrating procedure 130 of bonding the second flexible substrate to the second side of the carrier substrate, according to the first embodiment. In many examples, procedure 130 of bonding the second flexible substrate to the second side of the carrier substrate can limit the bowing of the bonded system due to CTE mismatches between the second flexible substrate and the carrier substrate. In many examples, procedure 125 can be performed prior to procedure 130.

In many examples, the second adhesive bonds the second carrier side to the second side of the carrier substrate. In some examples, the second adhesive can form a bond between the second carrier side and the second side of the carrier substrate, where the bond is strong enough to withstand the full range of TFT fabrication conditions experienced during photolithography, thermal vacuum, reactive plasma, wet acid/base, and solvent processes. In other examples, the second adhesive can form a bond between the second carrier side and the second side of the carrier substrate, where the bond can be easily separated when desired. In still other examples, the second adhesive can initially behave like a liquid, but can later behave like a solid upon bonding the second flexible substrate and the carrier substrate to sustain stress of the joint and to provide sufficient shear strength between the second flexible substrate and the carrier substrate. In further examples, the second adhesive also can fix the position of the second flexible substrate during processing to minimize distortion.

In some embodiments, procedure 130 can comprise process 710 of applying a second protective layer to the second outer side, as illustrated in FIG. 7. In various examples, process 710 of applying a second protective layer to the second outer side can comprise applying a second protective layer to all of the second outer side. In other examples, process 710 of applying a second protective layer to the second outer side can comprise applying a second protective layer to a part of the second outer side. In some examples, process 710 is omitted so that no protective layer is applied to the second outer side, or the second flexible substrate is furnished with the protective layer.

In some examples, the second protective layer prevents scratches on the second flexible substrate. In other examples, the second protective layer prevents adhesive from covering at least a portion of the second flexible substrate and thus, reduces defects. In many examples, the second protective layer comprises blue low tack tape (e.g. from Semiconductor Equipment Corporation, part number 18133-7.50) or mylar. In the same or different examples, the second protective layer can be approximately 25 µm to approximately 100 µm thick. In some examples, the second protective material can be approximately 70 µm thick. In many examples, the second protective material can be applied by rolling the second protective material onto the outer surface of the second flexible substrate using a roller to remove air bubbles between the second protective layer and the second flexible substrate.

In some embodiments, procedure 130 continues with process 720 of bonding the second carrier side to the second side of the carrier substrate, as illustrated in FIG. 7. In some examples, process 720 of bonding the second carrier side to the second side of the carrier substrate comprises roll pressing the second carrier side of the second flexible substrate to the second side of the carrier substrate. In the same or different examples, the roll pressing can occur at a pressure greater than or equal to approximately 5 pounds per square inch (psi) and less than or equal to approximately 60 psi, at a temperature greater than or equal to approximately 30° C. and less than or equal to approximately 100° C., and/or at a feed rate greater than or equal to approximately 0.25 meters per minute and less than or equal to approximately one meter per minute. In other examples, the roll pressing can occur at other conditions.

In some embodiments, procedure 130 can comprise process 730 of curing the second adhesive. In various examples, process 730 of curing the second adhesive can comprise providing ultraviolet radiation and/or providing thermal radiation.

In many examples, providing ultraviolet radiation can comprise exposing the second adhesive to UV light for approximately 15 to 25 seconds at room temperature. In some examples, the second adhesive can be cured with UV light in the UV light range of approximately 200 nm (nanometers) to approximately 450 nm and with an intensity of approximately 75 milliWatts per square centimeter (mW/cm2). In the same or different examples, a Dymax 2000-EC UV Curing Flood Lamp, manufactured by Dymax Corporation of Torrington, Conn., can be used to cure the second adhesive.

In some examples, providing thermal radiation can comprise vacuum baking the second adhesive. In various examples, the temperature in an oven containing the flexible substrate can be ramped up over approximately two to three hours from room temperature to approximately 160° C. to approximately 190° C. The second adhesive can be baked for 50 minutes to 120 minutes at approximately 180° C. and at a pressure of approximately one mTorr to approximately one Torr. Then, the temperature in the oven can be lowered to between approximately 90° C. to approximately 115° C., and the second adhesive can be baked for approximately seven more hours to approximately nine more hours at the lower temperature. Other baking processes also can be used. In many examples, after the baking process is complete, the second flexible substrate is cleaned and placed in an oven at approximately 90° C. to 110° C. for a minimum of approximately two hours.

In some embodiments, procedure 130 can comprise a process 750 of cleaning the second flexible substrate. In many examples, process 750 of cleaning the second flexible substrate comprises applying a surfactant to at least the second flexible substrate, performing a quick-dump-rinse (QDR), and performing a spin-rinse-dry (SRD). In other examples, process 750 of cleaning the first flexible substrate comprises applying a surfactant to at least the first flexible substrate, performing a quick-dump-rinse (QDR), and performing a isopropyl alcohol (IPA) dry. In further examples, process 750 can comprise performing an ultrasonic clean in a solution of ammonium hydroxide (NH$_4$OH) and water (H$_2$O) at a ratio of 100 to 1.

Returning to FIGS. 1, 4, and 6, in some examples of procedures 115 and 125, the first flexible substrate can comprise a material and the second flexible substrate comprise the same material. In further examples of procedures 115 and 125, each of the first flexible substrate and the second flexible substrate can comprise at least one of a thermoplastic polymer and/or a thickness greater than 3 micrometers and less than 100 micrometers. In the same or different examples of procedures 115 and 125, the thermoplastic polymer comprises one or more of polyethylene naphthalate, polyethylene terephthalate, polyethersulfone, polyimide, polycarbonate, cyclic olefin copolymer, and/or liquid crystal polymer. In various examples of procedures 115 and 125, treating the first side of the carrier substrate to remove defects and treating the second side of the carrier substrate to remove defects can occur approximately simultaneously with each other.

Returning to FIGS. 1, 5, and 7, in some examples of procedures 120 and 130, both curing the first adhesive and curing the second adhesive can comprise at least the same one of providing ultraviolet radiation or providing thermal radiation. In some examples of procedures 120 and 130, each of the first protective layer and the second protective layer can comprise tape.

Referring back to FIG. 1, in some embodiments, method 100 can comprise procedure 135 of removing the first protective layer from the first outer side. In many examples, the protective layers can be removed slowly using tweezers. In many examples, during the removal process, the first protective material is kept as flat as possible to avoid de-bonding the first flexible substrate from the carrier substrate. In other examples, the first protective material can be released using UV light. In these examples, the first protective material loses its tack by undergoing a UV light exposure. In other examples, the first protective material can be peeled slowly from the first flexible substrate.

Referring back to FIG. 1, in some embodiments, method 100 can comprise procedure 140 of removing the second protective layer from the second outer side. In many examples, the protective layers can be removed slowly using tweezers. In many examples, during the removal process, the second protective material is kept as flat as possible to avoid de-bonding the second flexible substrate from the carrier substrate. In other examples, the second protective material can be released using UV light. In these examples, the second protective material loses its tack by undergoing a UV light exposure. In other examples, the second protective material can be peeled slowly from the second flexible substrate. In some embodiments of method 100, procedure 140 is omitted.

Referring back to FIG. 1, in some embodiments, method 100 can comprise procedure 145 of baking the first flexible substrate, the second flexible substrate, and the carrier substrate (referenced hereinafter as the "dual substrate assembly"). In many examples, procedure 145 can comprise baking the dual substrate assembly, the first adhesive, and the second adhesive. In some examples, procedure 145 can help stabilize the flexible substrates and the adhesives. In some examples, where the first adhesive and/or the second adhesive contains a solvent, procedure 145 can remove residual solvent.

In various examples, the temperature in an oven containing the dual substrate assembly can be ramped up over approximately two to three hours from room temperature to approximately 160° C. to approximately 190° C. The dual substrate assembly can be baked for 30 minutes to 120 minutes at approximately 180° C. and at a pressure of approximately one mTorr to approximately one Torr. Then, the temperature in the oven can be lowered to between approximately 90° C. to approximately 115° C., and the dual substrate assembly can be baked for approximately seven more hours to approximately nine more hours at the lower temperature. Other baking processes also can be used. After the baking process is complete, the first flexible substrate and the second flexible substrate can be cleaned and placed in an oven at approximately 90° C. to 110° C. for a minimum of approximately two hours.

In other examples, the first flexible substrate can comprise polyethylene terephthalate, and the baking the dual substrate assembly occurs at a condition comprising at least one of: a vacuum, a pressure of approximately 30 milliTorr, a temperature of approximately 150° C., or a time of approximately 1 hour. In still other examples, the first flexible substrate can comprise polyethylene naphthalate, and the baking the dual substrate assembly occurs at a condition comprising at least one of: a vacuum, a pressure of approximately 30 milliTorr, a temperature of approximately 200° C., or a time of approximately 1 hour. In many examples, the baking can be done using a vacuum bake oven. In various examples, the baking can be done using a Yamato Oven 3 or 4.

Referring back to FIG. 1, in some embodiments, method 100 can comprise procedure 150 of providing a barrier layer at the first flexible substrate and/or the second flexible substrate. In some examples, the barrier layer can be applied over or to at least a portion of only one of the first flexible substrate or the second flexible substrate. In other examples, the barrier layer is applied to over or to at least a portion of both the first flexible substrate and the second flexible substrate. In the same or different examples, the barrier layer can be applied over or to at least a portion of one of the carrier substrate, the first adhesive layer, or the second adhesive layer. In many examples, the barrier layer can comprise at least silicon nitride (SiN) or silicon dioxide ($SiO_2$). In various examples, the barrier layer can comprise a moisture diffusion barrier to minimize moisture uptake and expansion of the first flexible substrate and the second flexible substrate when exposed to moisture. TFT performance can degrade due to interaction with moisture and/or oxygen. Metal foil substrates offer an advantage of being inherently impermeable such that, in some examples, a barrier layer can be unnecessary with metal foil substrates. In some examples, the barrier layer can be baked for five minutes. In further examples, the barrier layer can be 300 nanometers (nm) thick.

Referring back to FIG. 1, in some embodiments, method 100 can comprise procedure 149 of performing a post apply bake (PAB) of the dual substrate assembly. In many examples, procedure 149 can further comprise baking the dual substrate assembly, the first adhesive, and the second adhesive. In many examples, procedure 149 can be performed immediately prior to procedure 150. In the same or different examples, procedure 149 can help to thermally stabilize the first flexible substrate and/or the second flexible substrate and remove excess moisture from the first flexible substrate and/or the second flexible substrate that either substrate may have absorbed between procedure 145 and procedure 150. Accordingly, in some examples, where there is a significant time interval between the performance of procedure 145 and procedure 150, performing procedure 149 can be increasingly helpful. Procedure 149 can mitigate shrinkage and/or curling of the first flexible substrate and/or the second flexible substrate during procedure 150.

In various examples, the temperature in an oven for the PAB of procedure 149 can be ramped up over approximately one to three hours from approximately 100° C. to approximately 200° C. at a rate of between approximately 0.5 to 1.5° C. per minute. The dual substrate assembly can be baked for approximately 60 minutes at approximately 200° C. and at a pressure of approximately one mTorr to approximately one Torr. Other baking processes also can be used. After the baking process is complete, the first flexible substrate and the second flexible substrate can be cleaned.

In many embodiments, the intrinsic stresses and differences between the CTE of the carrier substrate and the flexible substrates can be minimized to prevent undesired bowing of the dual substrate assembly. For example, in many embodiments, the curvature of the dual substrate assembly can be a function of the material properties of the first flexible substrate, the second flexible substrate, and the carrier substrate, such as Elastic modulus (E), Poisson ratio (v), thickness, and strain mismatch ($\in$) between the materials. The strain mismatch, $\in$, can be broken into two dominant components; the thermal mismatch resulting from built-in strain ($\in_{bi}$) and the difference between the coefficients of thermal expansion ($\alpha$) of the materials. Thus, the mismatch strain in the system can be described by the equation:

$$\in = (\alpha_1 - \alpha_2)\Delta T + \in_{bi}$$

where $\Delta T$ is the difference between room temperature and the process temperature. In many embodiments, $\Delta T$ is fixed by the process such that preventing bowing becomes a function of minimizing the intrinsic stresses and differences in the CTE of the carrier substrate and the flexible substrates.

Referring back to FIG. 1, in some embodiments, method 100 can comprise procedure 155 of forming the electronic devices over the first flexible substrate. In many embodiments, the scale of method 100 is not limited to geometry or size of tools for processing. In some examples, dry etching can be used when forming the electronic devices over the first flexible substrate. In other examples, wet chemistries can be used when forming the electronic devices over the first flexible substrate. In the same or different examples, the wet chemistries can comprise a buffered oxide etch (BOE). In some examples, forming the electronic devices over the first flexible substrate can comprise using a metal-ion-free (MIF) developer to strip the photoresist. In some examples, forming the electronic devices over the first flexible substrate can comprise using a metal-ion-free (MIF) developer to strip the photoresist. In the same or different examples, forming the electronic devices over the first flexible substrate can comprise applying surfactant to the first flexible substrate and the second flexible substrate. In many embodiments, the dual substrate assembly can sustain its aforementioned bond integrity throughout the entirety of procedure 155.

Referring back to FIG. 1, in some embodiments, method 100 can comprise procedure 160 of debonding the first flexible substrate with the electronic devices from the carrier substrate. In many examples, procedure 160 of debonding the first flexible substrate can provide a clean separation from the carrier substrate so as not to damage or degrade the performance of the electronic devices of the first flexible substrate.

In many embodiments, debonding the first flexible substrate with the electronic devices from the carrier substrate comprises curing the first adhesive with ultraviolet radiation. In other embodiments, debonding the first flexible substrate with the electronic devices from the carrier substrate comprises crosslinking the first adhesive. In further embodiments, debonding the first flexible substrate with the electronic devices from the carrier substrate comprises curing the first adhesive with ultraviolet radiation and crosslinking the first adhesive.

In various embodiments, debonding the first flexible substrate with the electronic devices from the carrier substrate comprises applying a solvent to the first adhesive. In some examples, applying a solvent to the first adhesive can require extended debonding time due to the solvent diffusion limitations based upon the limited area of the first adhesive between the carrier substrate and the first flexible substrate that is exposed to the solvent.

In some embodiments, debonding the first flexible substrate with the electronic devices from the carrier substrate comprises heating the carrier substrate to induce a requisite reduction in adhesion force, typically by decomposition of the first adhesive. In some embodiments, debonding the first flexible substrate with the electronic devices from the carrier substrate comprises performing laser ablation of the adhesive to cause thermal decomposition of the polymer as the laser energy is converted to heat. In some embodiments, debonding the first flexible substrate with the electronic devices from the carrier substrate comprises performing a backside excimer laser-induced release by melting or ablating a thin polymer layer at the interface of the carrier substrate and the first flexible substrate.

In some embodiments, debonding the first flexible substrate with the electronic devices from the carrier substrate comprises mechanically debonding the first flexible substrate from the carrier substrate using a thin wire or blade. In some embodiments, the wire can be thin enough and/or the first adhesive can be thick enough so that a wire can pass in between the carrier substrate and the first flexible substrate.

Figure 8:
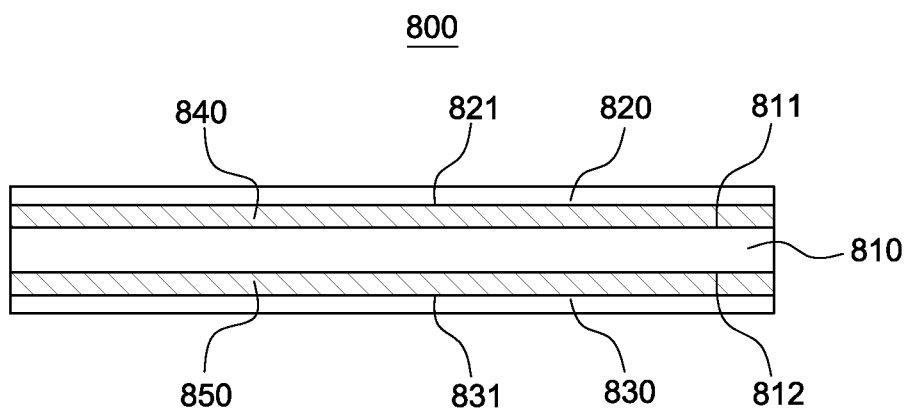
FIG. 8 illustrates a cross-sectional view of an example of a structure, according to the embodiment of FIG. 1.

Referring back to the figures, FIG. 8 illustrates a cross-sectional view of an example structure 800, according to the first embodiment. Structure 800 can be similar to the composite substrate described earlier with respect to FIGS. 1-7. For example, in many embodiments, structure 800 can comprise carrier substrate 810 having first side 811 and second side 812. In various embodiments, structure 800 can comprise first flexible substrate 820 having first carrier side 821. In the same embodiments, structure 800 can comprise second flexible substrate 830 having second carrier side 831. In some embodiments, first side 811 of carrier substrate 810 is bonded to first carrier side 821, and second side 812 of carrier substrate 810 is bonded to second carrier side 831.

In further embodiments, first flexible substrate 820 and second flexible substrate 830 comprise a thermoplastic polymer. In many embodiments, the thermoplastic polymers comprise at least one of polyethylene naphthalate, polyethylene terephthalate, polyethersulfone, polyimide, polycarbonate, cyclic olefin copolymer, or liquid crystal polymer. In some embodiments, first flexible substrate 820 and second flexible substrate 830 comprise a thickness greater than 3 micrometers and less than 100 micrometers.

In some embodiments, carrier substrate 810 comprises a material having a glass transition point greater than or equal to approximately 300° C. In other embodiments, the material comprises at least one of alumina ($Al_2O_3$), silicon, steel, sapphire, barium borosilicate, soda lime silicate, or alkali silicate. In various embodiments, carrier substrate 810 comprises a thickness greater than or equal to approximately 0.5 millimeters and less than or equal to approximately 2.0 millimeters.

In various embodiments, structure 800 further comprises first adhesive 840 and second adhesive 850. In the same or different embodiments, first adhesive 840 and/or second adhesive 850 comprise Henkel NS122 and/or a thickness greater than or equal to approximately 3 micrometers and less than or equal to approximately 50 micrometers. In further embodiments, first adhesive 840 and/or second adhesive 850 comprise a pressure sensitive adhesive and/or a thickness greater than or equal to approximately 3 micrometers and less than or equal to approximately 250 micrometers.

In many embodiments, first flexible substrate 820 creates a first force acting on carrier substrate 810. In the same or different embodiments, second flexible substrate 830 creates a second force acting on carrier substrate 810. In many embodiments, the second force compensates for the first force. In some embodiments, the second force compensates for a majority of the first force. In other embodiments, the second force compensates for a minority of the first force.

In many embodiments, while first flexible substrate 820 is bonded to carrier substrate 810, first flexible substrate 820 comprises a first variation in flatness. In the same or different embodiments, while second flexible substrate 830 is bonded to carrier substrate 810, second flexible substrate 830 comprises a second variation in flatness. In many embodiments, each of the first variation in flatness and the second variation in flatness are substantially zero. In various embodiments, the first variation in flatness and the second variation in flatness can be the same. In other embodiments, the first variation in flatness and the second variation in flatness can be different.

Figure 9:
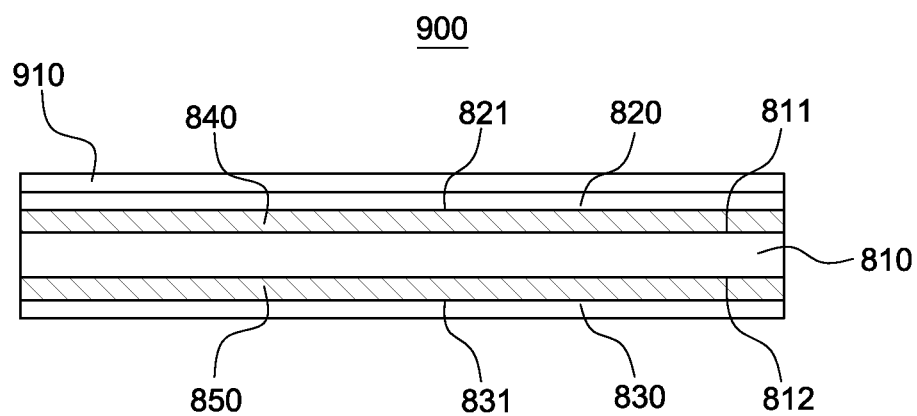
FIG. 9 illustrates a cross-sectional view of an example of electronic devices formed on a structure, according to the embodiment of FIG. 1.

FIG. 9 illustrates an example of structure 900, which compromises structure 800 (FIG. 8) after performing procedure 155 of method 100 (FIG. 1), according to the first embodiment. In many embodiments, structure 900 of FIG. 9 comprises electronic device layer 910. In some embodiments, the electronic devices can be semiconductor devices. In some embodiments, the electronic devices can be electrophoretic displays. In other embodiments, the electronic devices can be TFTs. In many embodiments, similar processing conditions can be utilized to fabricate TFT arrays on bonded flexible substrates and traditional rigid silicon wafers.

Figure 10:
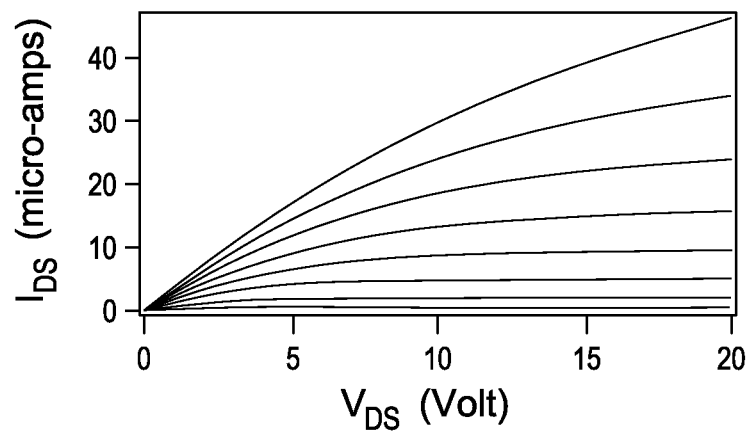
FIG. 10 provides exemplary current-voltage transfer characteristics for a typical test thin-film transistor fabricated on heat stabilized polyethylene naphthalate first flexible substrate using a 180° C. hydrogenated amorphous silicon process, the gate steps from −5 volts to 20 volts, provided according to the embodiment of FIG. 1.
Figure 11:
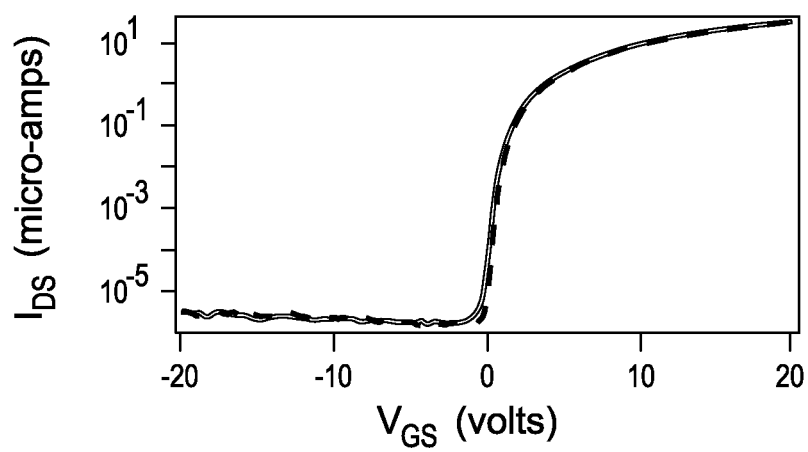
FIG. 11 provides an exemplary hysteresis curve for a gate voltage sweep from −20 volts to 20 volts, with a drain voltage fixed at 10 volts and exhibiting a very low hysteresis of <0.12 volts, for a thin-film transistor provided according to the embodiment of FIG. 1.

For example, 32 individual test transistors with 96 μm channel width (W) and 9 μm channel length (L) where (W/L=10.67) were distributed at different locations on a 150 mm wafer were formed on a structure similar to structure 900 of FIG. 9. The electrical performance of the test transistors was assessed by examining the parameters of effective saturation mobility ($\mu_{sat}$), threshold voltage ($V_t$), drive current ($I_{drive}$), and hysteresis. FIG. 10 shows the current voltage transfer characteristics for one of the TFTs formed on heat stabilized PEN(HS-PEN) according to method 100. The drain current as a function of drain voltage ($I_{ds}$–$V_{ds}$) measurement runs a 0 volts (V) to 20 V sweep on the drain with each gate step, which varies from −5 V to 20 V. FIG. 11 shows the hysteresis for a gate voltage sweep from −20 V to 20 V at a fixed drain voltage of 10 V for the same TFT. The performance of the TFT shown in FIG. 10 and FIG. 11 exhibits a mean saturation mobility of 0.84 $cm^2$/V-second (V-sec), threshold voltage of 0.66 V, sub-threshold slope of 0.38, a sub and an on/off ratio of greater than $10^9$. Other TFTs could exhibit on/off ratios greater than $10^6$ or $10^8$. The device performance is predictable as there is very low hysteresis (less than 0.12 V) in current-voltage trace and retrace measurements. These properties are consistent with the average properties for TFTs fabricated on HS-PEN based on several lots consisting of eight wafers as shown in Table 1.

TABLE 1

| Parameter | Rigid Silicon | HS-PEN | Stainless Steel |
| --- | --- | --- | --- |
| Saturation Mobility (cm2/V-sec) | 0.91 ± 0.37 | 0.77 ± 0.08 | 0.79 ± 0.04 |
| Threshold Voltage (V) | 0.32 ± 0.28 | 0.49 ± 0.28 | 0.43 ± 0.24 |
| Drive Current (μA) | 23 ± 8.8 | 27 ± 2.2 | 24 ± 2.5 |

Additionally, these average performance metrics for hydrogenated amorphous silicon (a-Si:H) TFTs fabricated on bonded HS-PEN can be compared with those fabricated on bonded stainless steel (SS) and rigid silicon using an identical baseline TFT process. The performance of TFTs on HS-PEN and SS are equivalent to those fabricated on rigid silicon.

For full TFT array characterization, each TFT in the array was tested at a relevant condition for an active matrix backplane. The array map data used a probe needle to bias each individual pixel capacitor to −20 V (corresponding to a bias of +20 V on both the gate and drain) and the current passing through the transistor is measured. The mean drive current for a pixel is approximately 25 microAmpere (μA). This average performance was utilized as a reference to assess shorts (TFT has greater than double mean current) and open (TFT current is less than 5 μA) pixels. FIGS. 12-14 illustrate a TFT array drive current test map for a quarter video graphics array (QVGA) fabricated on HS-PEN, SS, and silicon substrates. The shorts are represented by square white dots and opens by square black dots. For TFT arrays fabricated on silicon, there are no apparent shorts and opens in the array map as shown in FIG. 12. Fabrication on TFT arrays on HS-PEN or SS using method 100 did not adversely impact the manufacturing yield. A typical array contains 6 to 10 defects (opens and shorts) as illustrated in FIG. 13 and FIG. 14. Additionally, the drive current histograms are shown to the right of each array map in FIGS. 12-14. An ideal, defect-free histogram for an array map is a narrow, normal distribution. The defects are detected in histograms as a skew in distribution or multiple peaks.

Figure 15:
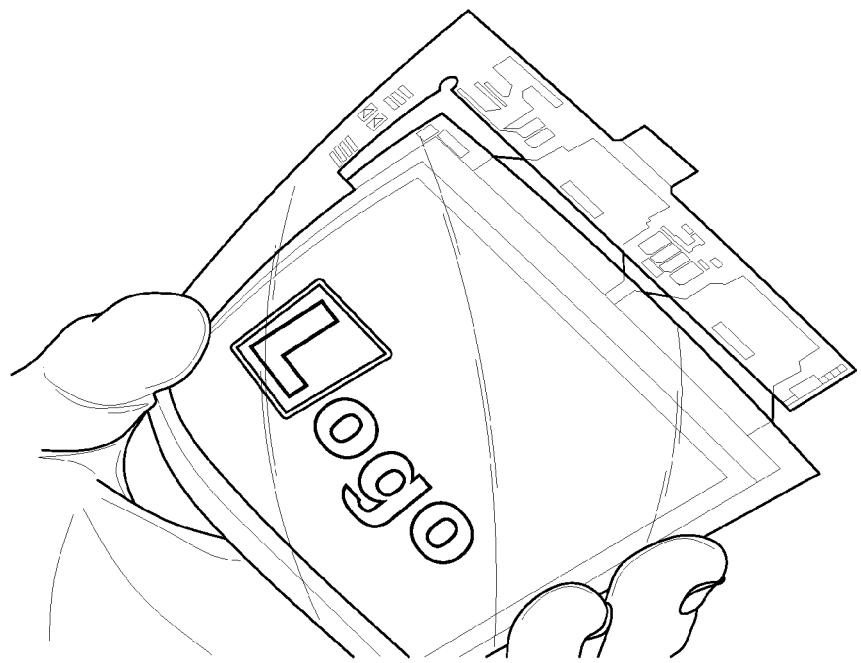
FIG. 15 shows an exemplary electrophoretic display that is built on a heat stabilized polyethylene naphthalate first flexible substrate, provided according to the embodiment of FIG. 1.

FIG. 15 shows electrophoretic displays (EPDs) that utilize TFT backplanes fabricated on plastic substrates, according to method 100. For this example, the pixel pitch is 240 μm and the supply voltage is about 10 V for the TFT backplane. The electrophoretic frontplane (E-Ink) was integrated to a debonded TFT backplane to produce a 320×240 pixel (3.8 inch diagonal) display. The display shows there are only three rows and column lineouts for the HE-PEN substrate. The display exhibits good contrast ratio and gray scale (4-bit) and fast image switching speed (about 0.35 seconds). Similar results were found for various examples employing SS foils for the first flexible substrate.

Figure 16:
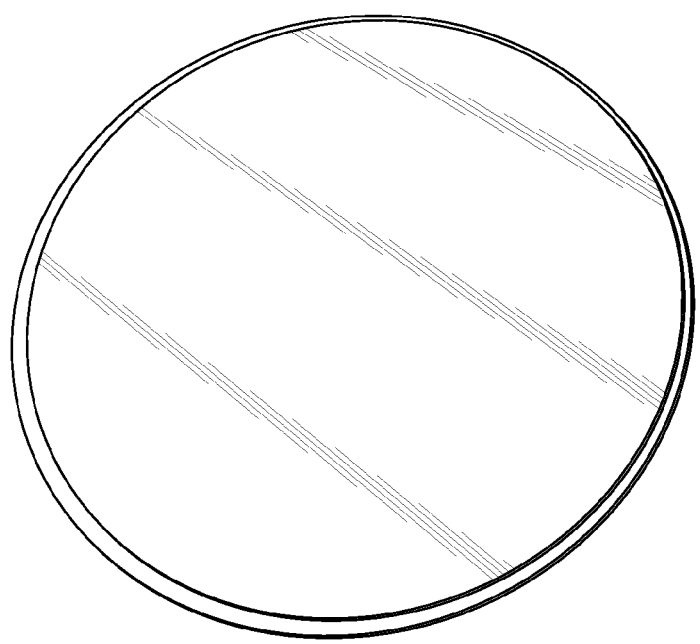
FIG. 16 shows an exemplary structure having a heat stabilized polyethylene naphthalate first flexible substrate bonded to the carrier substrate prior to thin-film transistor fabrication, provided according to the embodiment of FIG. 1.
Figure 17:
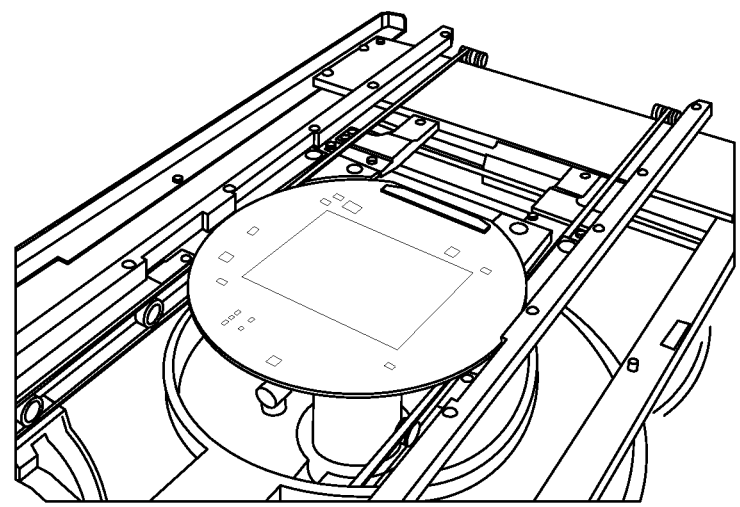
FIG. 17 shows an exemplary structure having a heat stabilized polyethylene naphthalate first flexible substrate bonded to the carrier substrate while undergoing processing by an automated photoresist coater tool, according to the embodiment of FIG. 1.
Figure 18:
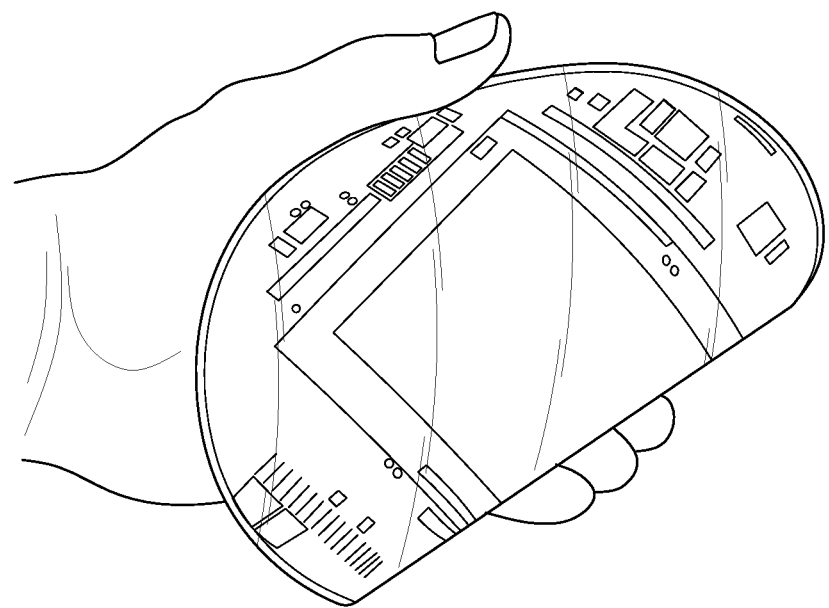
FIG. 18 shows an exemplary structure having a heat stabilized polyethylene naphthalate first flexible substrate after process completion and debonding, according to the embodiment of FIG. 1.

Returning to the figures, FIGS. 16-18 provide images of the dual substrate assembly at various different stages of processing, according to the first embodiment. FIG. 16 provides an image of the dual substrate assembly prior to forming electronic devices over the first flexible substrate. FIG. 17 provides an image of the dual substrate assembly while undergoing processing by an automated photoresist coater tool to form a TFT on the first flexible substrate. In some embodiments, the ability to utilize automated tools can improve yield and decrease device to device variability. FIG. 18 provides an image showing the first flexible substrate with a TFT after debonding the first flexible substrate from the carrier substrate.

Figure 19:
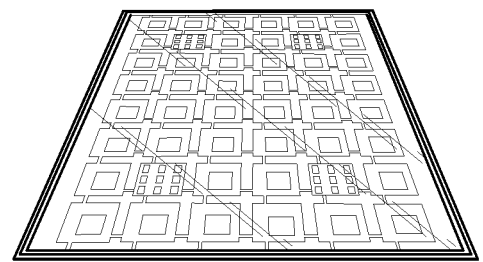
FIG. 19 shows a GEN II size heat stabilized polyethylene naphthalate first flexible substrate after active stack deposition and patterning, bonded to a glass carrier substrate, according to the embodiment of FIG. 1.
Figure 20:
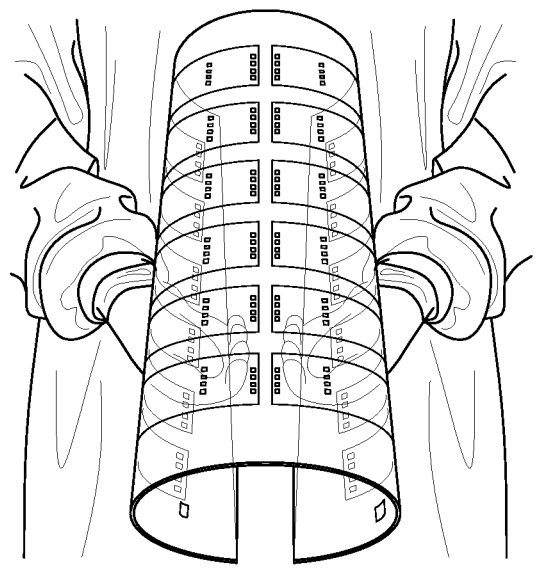
FIG. 20 shows a debonded GEN II size heat stabilized naphthalate first flexible substrate after metal deposition and patterning, according to the embodiment of FIG. 1.

FIG. 19 and FIG. 20 provide images of dual substrate assemblies scaled up with a first flexible substrate comprising GEN II size (370 mm×470 mm) HS-PEN. FIG. 19 shows the HS-PEN first flexible substrate after active stack deposition and patterning. In many embodiments, the first flexible substrate can be processed using automated TFT fabrication tools. FIG. 20 shows the first flexible substrate after debonding from the carrier substrate.

Figure 21:
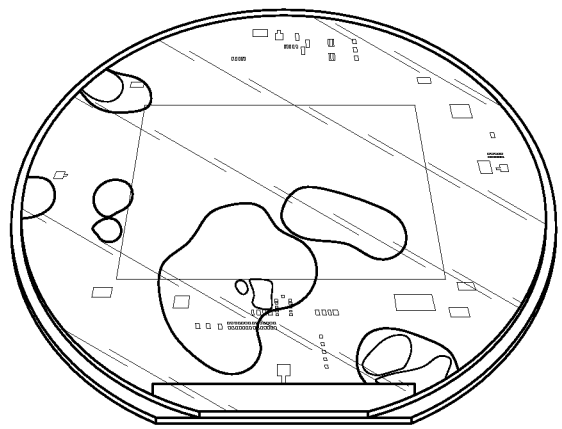
FIG. 21 shows a heat stabilizing polyethylene naphthalate first flexible substrate bonded to a silicon wafer where the substrate has undergone catastrophic blistering.

In some embodiments, where attempting to bond flexible substrates to a carrier substrate by a method other than method 100, one of two major failure modes can occur leading to degradation in process performance. The first common failure mode is blistering of the adhesive, as illustrated in the image of FIG. 21. The blistering in FIG. 21 occurred during plasma enhanced chemical vapor deposition (PECVD) of a a-Si:H semiconductor channel layer. Blistering tends to occur preferentially at particle-defect and bubble-defect sites within the adhesive. Blistering is further exacerbated by outgassing of the adhesive during thermal and/or vacuum processing steps. The second common failure mode is excessive bending of the dual substrate assembly caused by bowing, as described above.

In various embodiments, method 100 (FIG. 1) and structures 800 and 900 (FIGS. 8 and 9) could be used for at least paper-like electronic newspapers, cell phones, large area radio frequency communication devices, wearable electronics, low-cost photovoltaic cells, sensors, structural health monitors, conformal x-ray imagers, artificial muscles, biological tissues, and radio-frequency identification (RFID) tags, among other uses. In further embodiments, method 100 and structures 800 and 900 could be used for flexible flat panel display manufacturing, flexible semiconductor manufacturing, flexible electronic manufacturing/processing, flexible solar manufacturing, and flexible sensor manufacturing.

Figure 22:
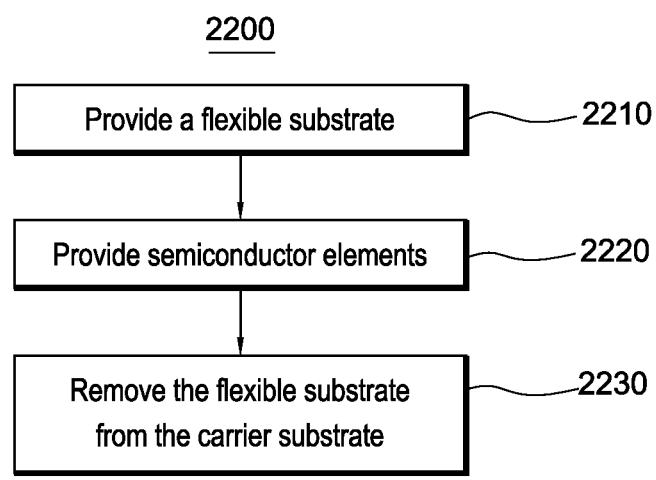
FIG. 22 illustrates an example of a method of providing a semiconductor device, according to another embodiment.

Turning to the figures, FIG. 22 illustrates an example of a method 2200 of providing a semiconductor device, according to another embodiment. In the same or different embodiments, method 2200 can be considered a method of providing a thin film transistor on a flexible substrate. Method 2200 is merely exemplary and is not limited to the embodiments presented herein. Method 2200 can be employed in many different embodiments or examples not specifically depicted or described herein.

Figure 23:
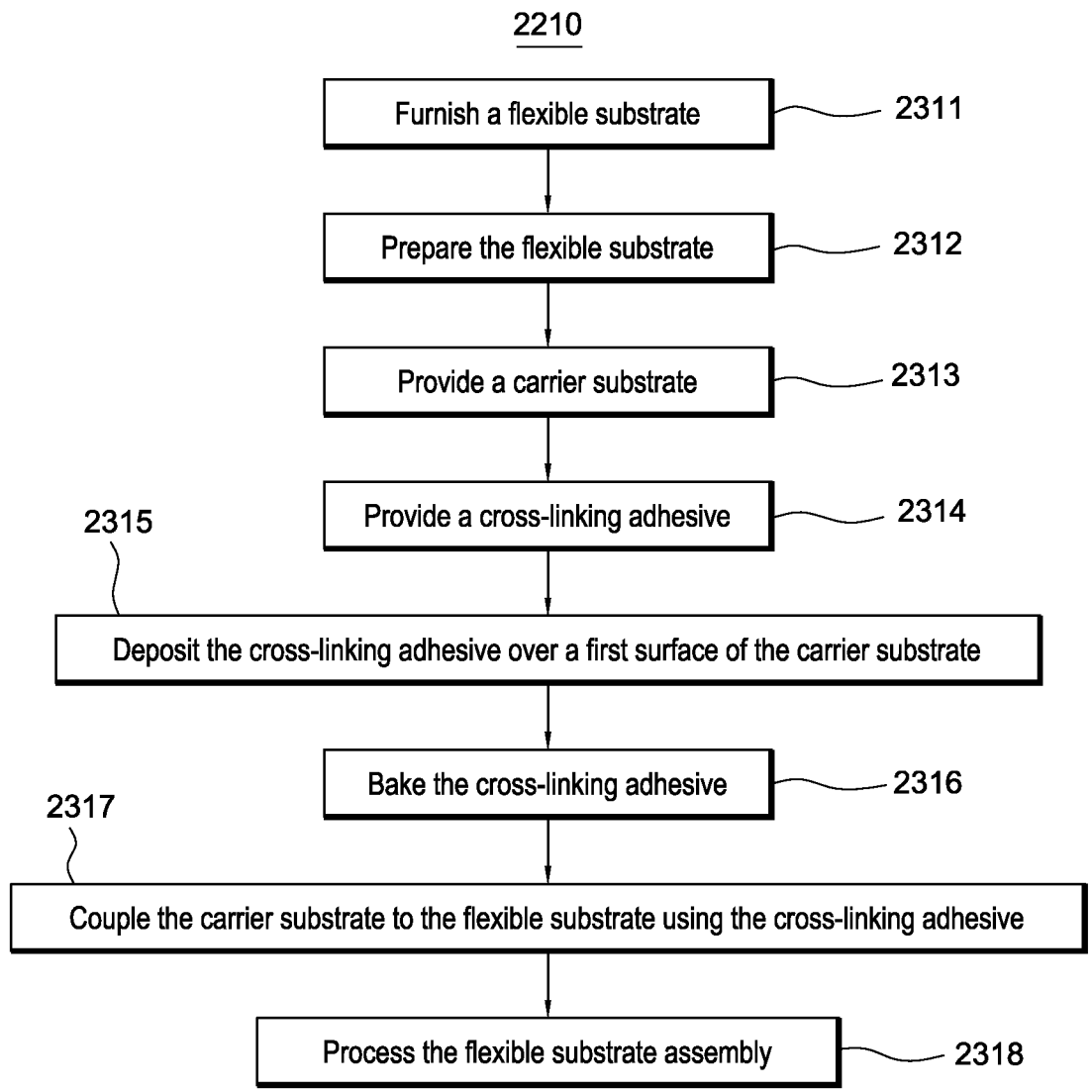
FIG. 23 illustrates an example of a procedure of providing a flexible substrate, according to the embodiment of FIG. 22.

Method 2200 includes a procedure 2210 of providing a flexible substrate. FIG. 23 is a flow chart illustrating procedure 2210 of providing a flexible substrate, according to the embodiment of FIG. 22.

Procedure 2210 includes a process 2311 of furnishing a flexible substrate. In some embodiments, process 2311 can include furnishing a flexible substrate with a low elastic modulus. For example, a low elastic modulus can be considered an elastic modulus of less than approximately five Giga-Pascals (GPa).

In many examples, the flexible substrate is a plastic substrate. For example, flexible substrates can include polyethylene naphthalate (PEN), polyethylene terephthalate (PET), polyethersulfone (PES), polyimide, polycarbonate, cyclic olefin copolymer, or liquid crystal polymer.

In many examples, the flexible substrate can include a coating at one or more sides of the flexible substrate. The coating can improve the scratch resistance of the flexible substrate and/or help prevent outgassing or oligomer crystallization on the surface of the substrate. Moreover, the coating can planarize the side of the flexible substrate over which it is located. The coating also can help decrease distortion. In some examples, the coating is located only at the side of the flexible substrate where the electrical device will be fabricated. In other examples, the coating is at both sides of the flexible substrate. In various embodiments the flexible substrate can be provided pre-planarized. For example, the flexible substrate can be a PEN substrate from DuPont Teijin Films of Tokyo, Japan, sold under the tradename "planarized Teonex® Q65." In other embodiments, a flexible substrate can be planarized after being provided. For example, method 4800 (FIG. 48) provides a method of planarizing a substrate.

The thickness of the flexible or plastic substrate can be in the range of approximately 25 micrometers (μm) to approximately 300 μm. In the same or different embodiments, the thickness of the flexible or plastic substrate can be in the range of approximately 100 μm to approximately 200 μm.

In some examples, the flexible substrate can be provided by cutting a sheet of a plastic substrate from a roll of the plastic material using a paper cutter or a pair of ceramic scissors. In various examples, after cutting the plastic substrate, the cut sheet is blown clean with a nitrogen gun. In some embodiments of procedure 2210, either or both of the cutting and blowing processes can be part of a process 2312, described below, instead of being part of process 2311.

Figure 24:
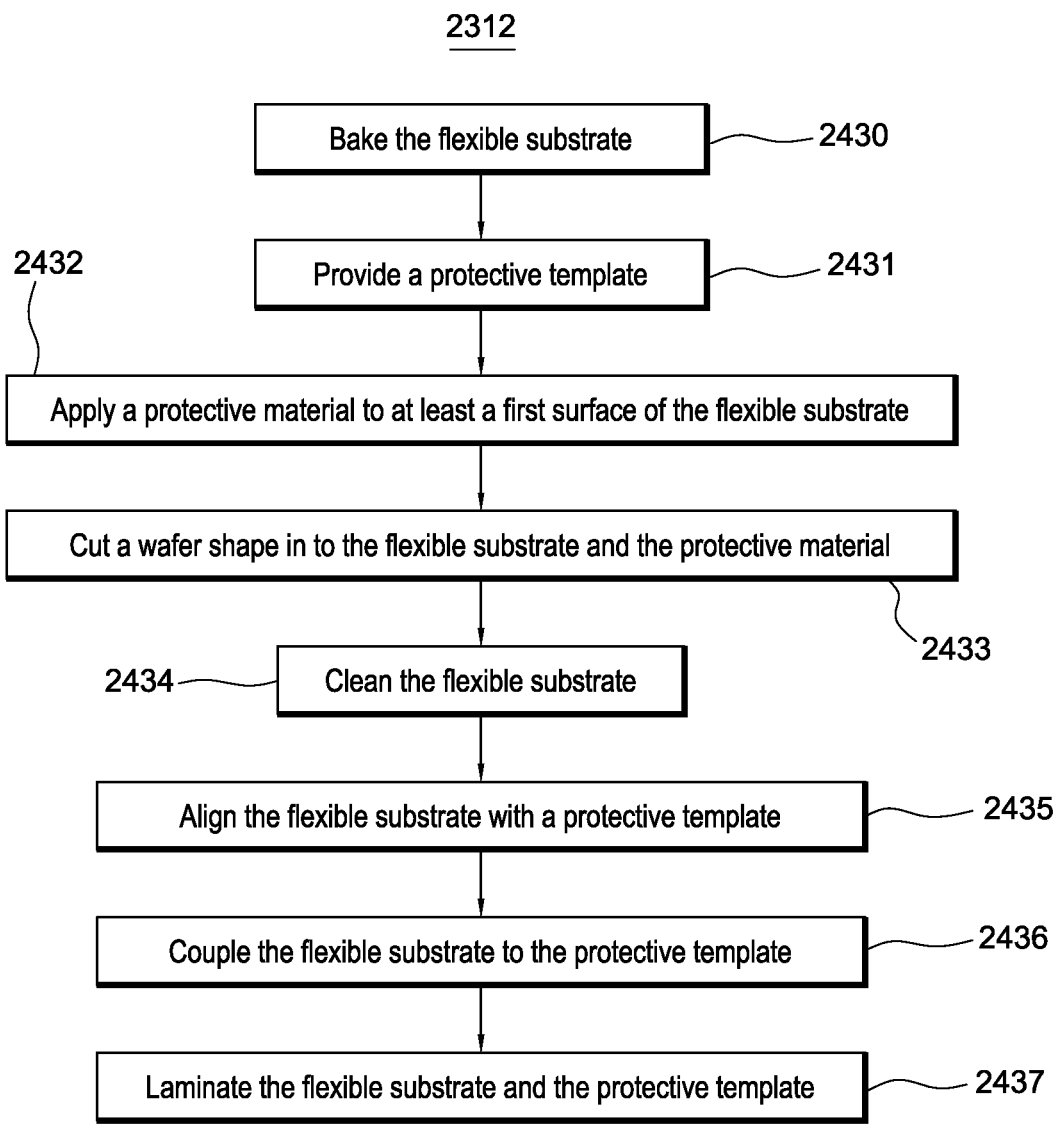
FIG. 24 illustrates an example of a process of preparing the flexible substrate, according to the embodiment of FIG. 22.

Procedure 2210 of FIG. 23 continues with process 2312 of preparing the flexible substrate. FIG. 24 is a flow chart illustrating process 2312 of preparing the flexible substrate, according to the embodiment of FIG. 22.

Process 2312 of FIG. 23 can include an activity 2430 of baking the flexible substrate. Baking the flexible substrate can help release oligomers and other chemicals in the flexible substrate that could potentially leach out later during method 2200 (FIG. 22).

In some examples, the flexible substrate can be baked using a vacuum bake process. For example, the temperature in an oven containing the flexible substrate can be ramped up over approximately two to three hours to approximately 160 degrees Celsius (° C.) to approximately 200° C. The flexible substrate can be baked for one hour at approximately 160° C. to approximately 200° C. and at a pressure of approximately one milliTorr (mTorr) to approximately ten mTorr. Then, the temperature in the oven can be lowered to between approximately 90° C. to approximately 115° C., and the flexible substrate can be baked for approximately eight more hours. Other baking processes can be also be used. After the baking process is complete, the flexible substrate can be wiped clean of any residues or chemicals that were baked off.

Subsequently, process 2312 of FIG. 24 includes an activity 2431 of providing a protective template. The protective template can act as both a guide for the placement of the flexible substrate as well as a protective layer between the flexible substrate and the rollers and/or handling mechanisms of various processing equipment. In some examples, the protective template is a sheet of mylar or any inexpensive plastic.

The protective template can be 50 μm to 15 mm thick and cut to a length of approximately 0.5 m (meters) to approximately 1.5 m. In various embodiments, as part of activity 2431, the protective template is folded in half and run through rollers (e.g., a hot roll laminator) to help lock in the fold. A line trace of a carrier substrate can also be made on the back side of the protective sheet as part of activity 2431. Additionally, the protective template can be baked at approximately 90° C. to approximately 110° C. for approximately five minutes to approximately ten minutes to help flatten the protective template.

Process 2312 of FIG. 24 continues with an activity 2432 of applying a protective material to at least a portion of a first surface of the flexible substrate. In some embodiments, a protective material can be applied over at least a portion of a planarized surface of the flexible substrate. In some examples, the protective material is not applied to a portion of the flexible substrate.

The protective material prevents scratches and adhesive from covering the planarized surface of the flexible substrate and, thus, reduces defects. In some examples, blue low tack tape (e.g., from Semiconductor Equipment Corporation, part number 18133-7.50) or mylar could be used as the protective material. The protective material can be approximately 25 μm to approximately 100 μm thick. For example, the protective material can be approximately 70 μm thick. In some examples, the protective material is applied by rolling the protective material onto the planarized surface of the flexible substrate using a roller to remove air bubbles between the protective material and the flexible substrate.

Subsequently, process 2312 of FIG. 24 includes an activity 2433 of cutting the flexible substrate and protective material into the shape of a wafer. A punch cut template can be used to press the wafer shape into the flexible substrate (with the planarized side, if any, up) and/or the protective material. In one embodiment, the punch cut template is used to create a temporary or permanent impression in the protective material and the flexible substrate at the same time.

If the pressing of the punch cut template cuts completely through the flexible substrate, the flexible substrate is scrapped because the press cut can create cracks in a coating on the flexible substrate that propagate throughout the flexible substrate. After the wafer shape is outlined into the flexible substrate and/or the protective material using the press, the flexible substrate and the protective material are cut simultaneously with each other. In some examples, the flexible substrate and protective material are cut using ceramic scissors approximately one millimeter outside the impression made by the punch cut template.

Figure 25:
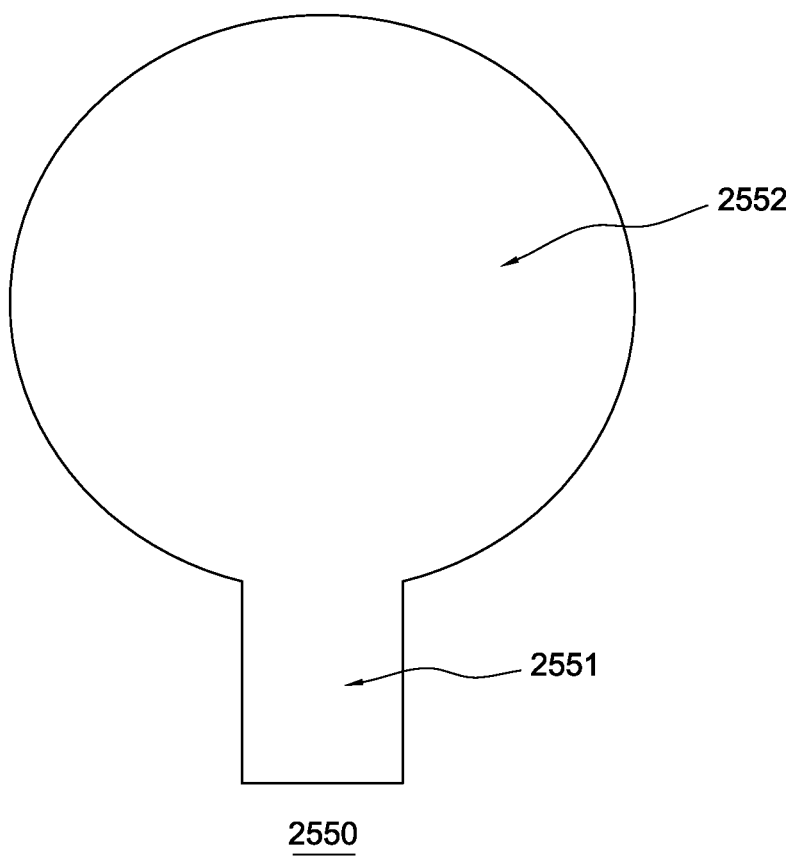
FIG. 25 illustrates a top view of an example of the flexible substrate according to the embodiment of FIG. 22.

In some examples, the flexible substrate includes a tab extending from the wafer shape in the flexible substrate and the protective material. The tab can be used to help align the flexible substrate to a carrier substrate when traveling through a laminator in process 2317 of FIG. 23. FIG. 25 illustrates a top view of a flexible substrate 2550, according to a embodiment of FIG. 22. Flexible substrate 2550 can include a body 2552 and tab 2551. In many examples, body 2552 can have a circular shape. Although not illustrated in FIG. 25, the protective material is located over flexible substrate 2550 also includes a similarly shaped tab. In one embodiment, the tab is not part of the punch cut template and is cut freehand or freestyle into the flexible substrate and the protective material.

Referring back to FIG. 24, process 2412 of FIG. 24 continues with an activity 2434 of cleaning the flexible substrate. In some examples, the second or non-planarized side of the flexible substrate (i.e., the side without the protective material) is dry wiped to remove any oligomers, other chemicals, or particles. Afterwards, the planarized side of the flexible substrate having the protective material is blown clean with a nitrogen gun. In other examples, both sides of are dry wiped and/or blown clean.

Next, process 2312 of FIG. 24 includes an activity 2435 of aligning the flexible substrate with a protective template. In some examples, the flexible substrate having the wafer shape with the tab is aligned with the line trace of a carrier substrate drawn or made on the protective template in activity 2431. The line trace of the carrier substrate is typically slightly larger than the wafer shape of the flexible substrate.

Subsequently, process 2312 of FIG. 24 includes an activity 2436 of coupling the flexible substrate to the protective template. In some embodiments, the flexible substrate is attached to the protective template by attaching a portion of the tab of the flexible substrate to the protective template. For example, a piece of double-sided tape can couple the tab of the flexible substrate to the protective template. In some examples, a portion of the protective material is peeled off of and removed from the tab, and the double-sided tape is coupled to the exposed portion of the tab of the flexible substrate. In some examples, the portion of the protective material can be peeled using tweezers and can be cut from the protective template using a pair of ceramic scissors. In other examples, in activity 2432 of FIG. 24, the protective material is not applied to the portion the tab to which the double-sided tape will be attached so peeling and removal of a portion of the protective material is not necessary.

Figure 26:
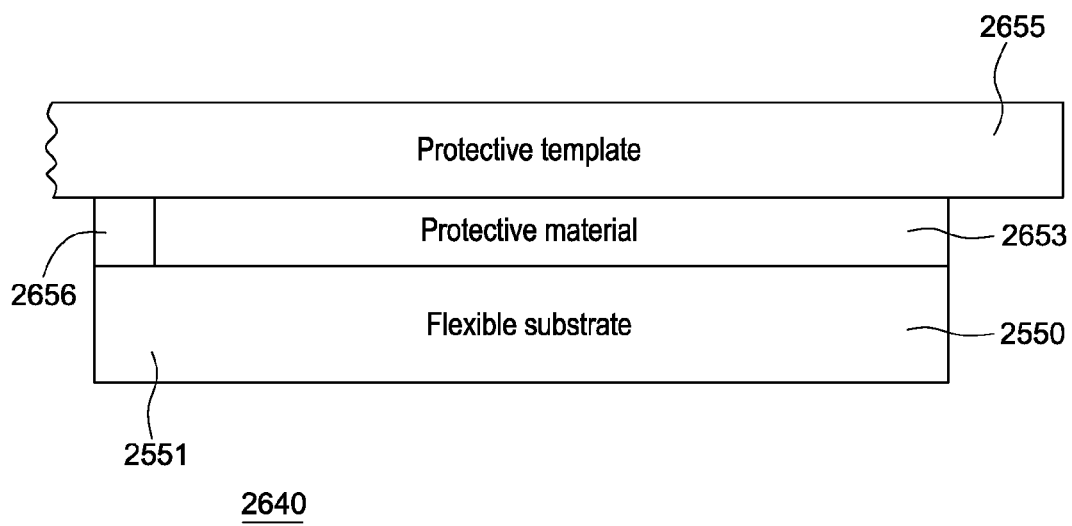
FIG. 26 illustrates a partial cross-sectional view of an example of a flexible substrate assembly after attaching the flexible substrate of FIG. 4 to a protective template, according to the embodiment of FIG. 22.

After coupling the flexible substrate to the protective coating, the protective template is then folded over the flexible substrate. FIG. 26 illustrates a partial cross-sectional view of a flexible substrate assembly 2640 after attaching flexible substrate 2550 to a protective template 2655, according to the embodiment of FIG. 22. In this example, a tape 2656 is coupled to flexible substrate 2550 and protective template 2655. A protective material 2653 is coupled to flexible substrate 2550, as described previously.

In some examples, only one side of the flexible substrate is attached to the protective template. In other examples, both sides of the flexible substrate are attached to the protective template.

Next, process 2312 of FIG. 24 includes an activity 2437 of laminating the flexible substrate, the protective material, and the protective template. The flexible substrate and the protective material are located between the two folded halves of the protective template. The flexible substrate, the protective material, and the protective template can be laminated using a hot roll laminator to remove air bubbles between the protective material and the protective template and also between the protective material and the flexible substrate. In some examples, the flexible substrate and the protective template are placed over a guide sheet (e.g., a Lexan® guide sheet) and fed into the hot roll laminator. As an example, the tab of the flexible substrate and the protective material can be fed first into the laminator. The flexible substrate and the protective template are laminated at a pressure of approximately 120 kPa (kilopascals) to approximately 160 kPa and at a temperature of approximately 90° C. to approximately 110° C. The lamination speed can be approximately one meter per minute to approximately two meters per minute.

After laminating the flexible substrate and protective template, process 2312 is complete. Referring back to FIG. 23, procedure 2210 of FIG. 23 includes a process 2313 of providing a carrier substrate. In many embodiments, the carrier substrate can be a 6, 8, 12, or 18 inch wafer or panel. In some embodiments the carrier substrate can be a panel of approximately 370 mm by 470 mm.

The carrier substrate can include a first surface and a second surface opposite the first surface. In some examples, at least one of the first surface and the second surface has been polished. Polishing the surface that is not subsequently coupled to the flexible substrate improves the ability of a vacuum or air chuck to handle the carrier substrate. Also, polishing the surface that is subsequently coupled to the flexible substrate removes topological features of the surface of the carrier substrate that could cause roughness of the flexible substrate assembly in the z-axis after the coupling with the flexible substrate.

In various embodiments, the carrier substrate comprises at least one of the following: alumina ($Al_2O_3$), silicon, low CTE glass, steel, sapphire, barium borosilicate, soda lime silicate, an alkali silicate, or another material that is CTE matched to the flexible substrate. The CTE of the carrier substrate should be matched to the CTE of the flexible substrate. Non-matched CTEs can create stress between the carrier substrate and the flexible substrate.

For example, the carrier substrate could comprise sapphire with a thickness between approximately 0.7 mm and approximately 1.1 mm. The carrier substrate could also comprise 96% alumina with a thickness between approximately 0.7 mm and approximately 1.1 mm. In a different embodiment, the thickness of the 96% alumina is approximately 2.0 mm. In another example, the carrier substrate could be a single crystal silicon wafer with a thickness of at least approximately 0.65 mm. In still a further embodiment, the carrier substrate could comprise stainless steel with a thickness of at least approximately 0.5 mm. In some examples, the carrier substrate is slightly larger than the flexible substrate.

Next, procedure 2210 of FIG. 23 includes a process 2314 of providing a cross-linking adhesive. In some examples, the cross-linking adhesive outgases at a rate of less than approximately 2×10-4 Torr-liters per second. In some examples, the cross-linking adhesive is thermally and/or UV (ultraviolet) light curable.

In various embodiments, the cross-linking adhesive is a cross-linking acrylic adhesive. In the same or different embodiment, the cross-linking adhesive is a cross-linking pressure sensitive acrylic adhesive or a cross-linking viscoelastic polymer. In some examples, the CTE of the adhesive is very large compared to the CTE of the flexible substrate and the carrier substrate. However, the CTE of the adhesive is not important because the adhesive does not create any stress (i.e., viscoelasticity) between the flexible substrate and carrier substrate because the layer of adhesive is so thin compared to the thickness of the flexible substrate and carrier substrate.

Subsequently, procedure 2210 of FIG. 23 includes a process 2315 of depositing the cross-linking adhesive over a first surface of the carrier substrate. In many embodiments, depositing the cross-linking adhesive over a first surface of the carrier substrate can be performed using at least one of the following methods: spin-coating, spray-coating, extrusion coating, preform lamination, slot die coating, screen lamination, and screen printing.

For example, the carrier substrate can be coated with the cross-linking adhesive. The carrier substrate and the cross-linking adhesive can be spun to distribute the cross-linking adhesive over a first surface of the carrier substrate. In some embodiments, the cross-linking adhesive is spin coated on the carrier substrate by spinning the carrier substrate with the cross-linking adhesive at approximately 900 rpm (revolutions per minute) to 1100 rpm for approximately 20 seconds to approximately 30 seconds and then spinning the carrier substrate with the cross-linking adhesive at approximately 3400 rpm to approximately 3600 rpm for approximately 10 seconds to 30 seconds. In a different embodiment, the carrier substrate with the cross-linking adhesive is spun at approximately 600 rpm to approximately 700 rpm to coat the surface of the carrier substrate and then spun at approximately 3400 rpm to approximately 3600 rpm to control the thickness of the cross-linking adhesive.

Prior to spin coating, the cross-linking adhesive can be dispensed onto or over a geometric center of the carrier substrate. In a different embodiment, the cross-linking adhesive can be dispensed onto or over the carrier substrate while the carrier substrate is spinning.

The thickness of the cross-linking adhesive over the carrier substrate after the depositing procedure can be between approximately three μm and approximately thirty μm. In the same or different embodiment, the thickness of the cross-linking adhesive over the carrier substrate after the depositing procedure can be between approximately ten μm and approximately fifty μm.

Procedure 2210 of FIG. 23 continues with a process 2316 of baking the cross-linking adhesive. In some embodiments, the cross-linking adhesive can be baked to remove solvents. For example, the cross-linking adhesive can be baked at 80° C. for thirty minutes and then baked for fifteen minutes at 130° C.

In other examples, the cross-linking adhesive is not baked. For example, if the cross-linking adhesive does not include any solvents, a bake is not necessary. Moreover, if the cross-linking adhesive is very viscous, solvents may even be added to the cross-linking adhesive to decrease the viscosity before the adhesive is deposited in process 2315.

Figure 27:
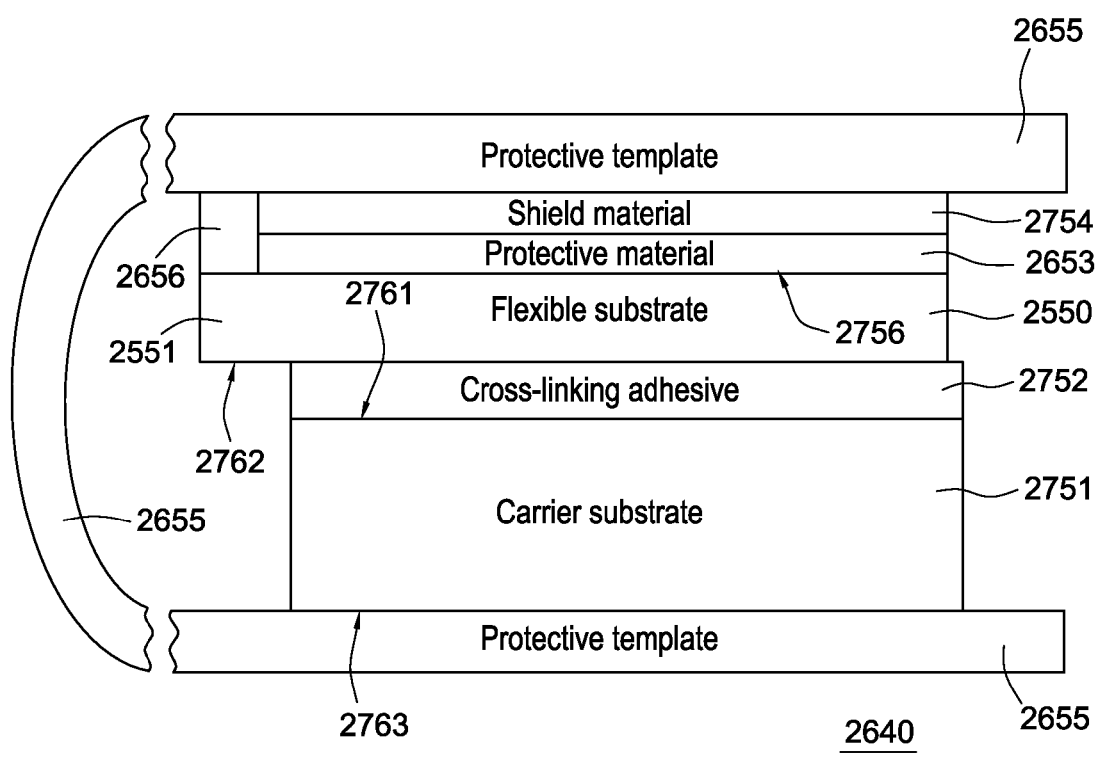
FIG. 27 illustrates a partial cross-sectional view of an example of the flexible substrate assembly of FIG. 5 after coupling a carrier substrate to the flexible substrate assembly, according to the embodiment of FIG. 22.

Afterwards, the carrier substrate can be placed on the protective template. The flexible substrate is already coupled to one portion (or half) of the protective template as shown in FIG. 27, and the carrier substrate with cross-linking adhesive can be placed on another portion (or half) of the protective template. In some examples, the cross-linking adhesive is still in liquid form at this point. Thus, the carrier substrate coated with the cross-linking adhesive can be stored horizontally for approximately eight to approximately twelve hours before being coupled with the flexible substrate.

Next, procedure 2210 of FIG. 23 includes a process 2317 of coupling the carrier substrate to the flexible substrate using the cross-linking adhesive while both substrates are located between the protective template halves. The second surface of the flexible substrate can be placed over the first surface of the carrier substrate with the adhesive located between the second surface of the flexible substrate and the first surface of the carrier substrate.

In some examples, the carrier substrate is coupled to the flexible substrate using the cross-linking adhesive by laminating the flexible substrate assembly between the protective template halves to remove air bubbles between the carrier substrate and the flexible substrate. Laminating the flexible substrate involves first aligning the carrier substrate with the flexible substrate so that, when laminated, the carrier substrate and the flexible substrate are aligned. Then, the aligned structure can be fed through a hot roll laminator, which can be the same laminator of activity 2437 of FIG. 24. The flexible substrate assembly can be laminated at an approximate speed of 0.4 to 0.6 meters per minute.

Also, in various embodiments, the protective material may stick to the protective template when laminated. To avoid this problem, a shield material can be located between the protective template and the protective material before the lamination of activity 2437 and/or activity 2432. The shield material can be, for example, wax paper. In one embodiment, the shield material is originally coupled to the protective material when acquired from the manufacturer.

In the same or different embodiments, some of the cross-linking adhesive can be squeezed out from between the carrier and flexible substrates during lamination and adhere to the first side or the top of the flexible substrate, particularly because the carrier substrate and the overlying cross-linking adhesive layer is slightly larger than the flexible substrate. The presence of the protective material, however, prevents this problem from occurring. The cross-linking adhesive that squeezes out and adheres to the top of the protective material (instead of the flexible substrate) is inconsequential because the protective material is eventually removed and discarded.

FIG. 27 illustrates a partial cross-sectional view of flexible substrate assembly 2640 after coupling a carrier substrate 2751 to flexible substrate assembly 2640, according to the embodiment of FIG. 22. In this embodiment, a cross-linking adhesive 2752 couples a surface 2761 of carrier substrate 2751 to a surface 2762 of flexible substrate 2550. Protective material 2653 is located over a surface 2756 of flexible substrate 2550. A shield material 2754 is located between protective material 2653 and protective template 2655. Protective template 2655 is folded such that protective template 2655 is also located under a surface 2763 of carrier substrate 2751. Tape 2656 couples protective template 2655 to tab 2551 of flexible substrate 2550.

Figure 28:
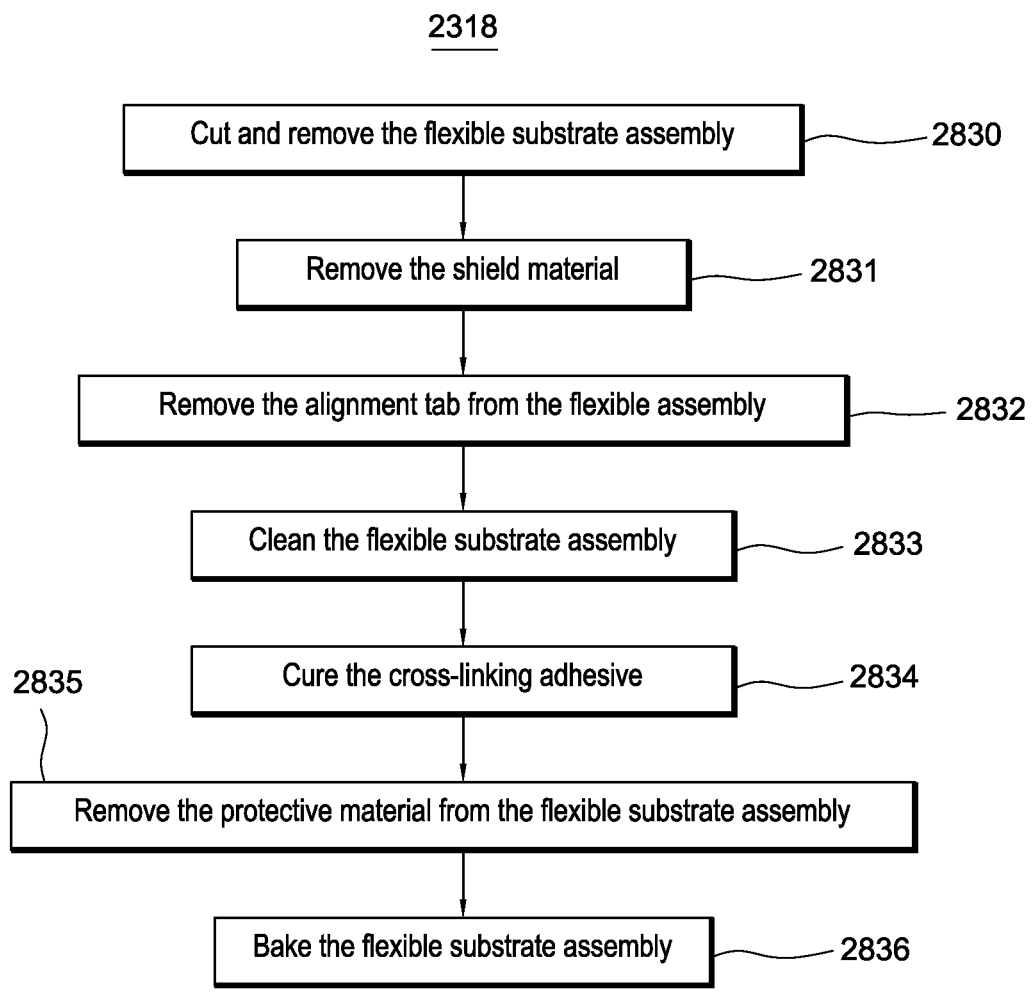
FIG. 28 illustrates an example of a process of processing the flexible substrate assembly of FIG. 5, according to the embodiment of FIG. 22.

Referring again back to FIG. 23, procedure 2210 continues with a process 2318 of processing the flexible substrate assembly. FIG. 28 is a flow chart illustrating process 2318 of processing the flexible substrate assembly, according to the embodiment of FIG. 22.

Figure 29:
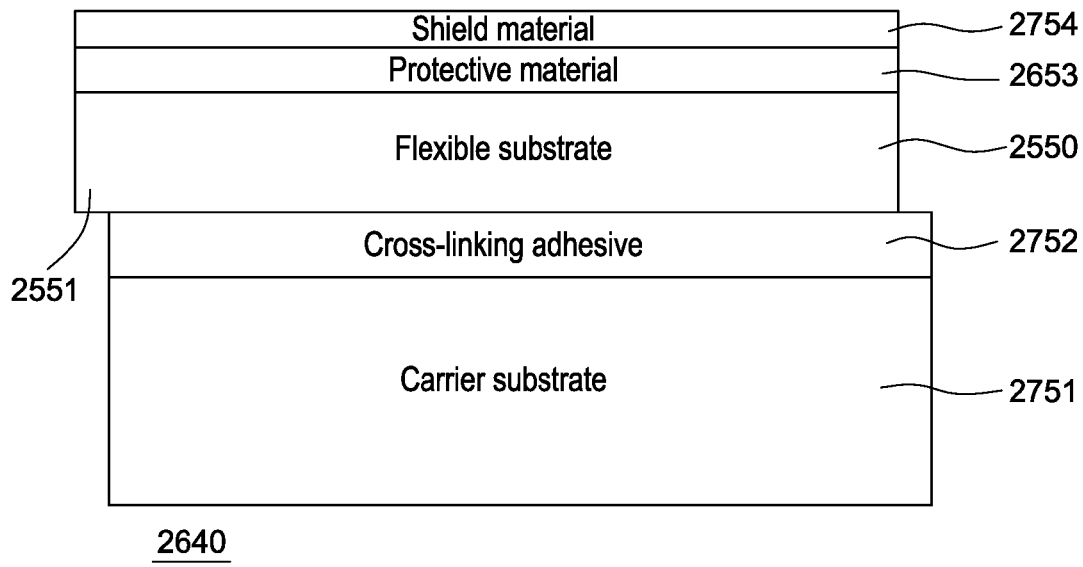
FIG. 29 illustrates a cross-sectional view of an example of the flexible substrate assembly of FIG. 5 after cutting the flexible substrate assembly, according to the embodiment of FIG. 22.

Process 2318 of FIG. 28 includes an activity 2830 of cutting the flexible substrate assembly. In some examples, a pair of ceramic scissors is used to cut the protective template and across the alignment tab of the flexible substrate located between the protective template, but the alignment tab is not removed entirely. After cutting the flexible substrate assembly, the protective template can be peeled away from or otherwise removed from the shield material and the carrier substrate by hand. FIG. 29 illustrates a cross-sectional view of flexible substrate assembly 2640 after cutting the flexible substrate assembly and removing the protective template, according to the embodiment of FIG. 22. More specifically, in FIG. 29, protective template 2655 (FIGS. 26 & 27), and tape 2656 (FIGS. 26 & 27) of flexible substrate 2550 have been removed.

Referring again to FIG. 28, the next activity in process 2318 is an activity 2831 of removing the shield material by hand. In some examples, the flexible substrate assembly is placed at an edge of a table with the shield material facing the table. The flexible substrate assembly is slowly moved off the table while the shield layer is removed (e.g., peeled) from the flexible substrate assembly. That is, the shield layer can be removed by pulling the shield material downward away from the edge of the table while the flexible substrate assembly is moved horizontally off the table. In some examples, if the flexible substrate is not properly centered on or otherwise aligned with the carrier substrate after removing the shield layer, the flexible substrate can be slid into alignment with the carrier substrate.

Figure 30:
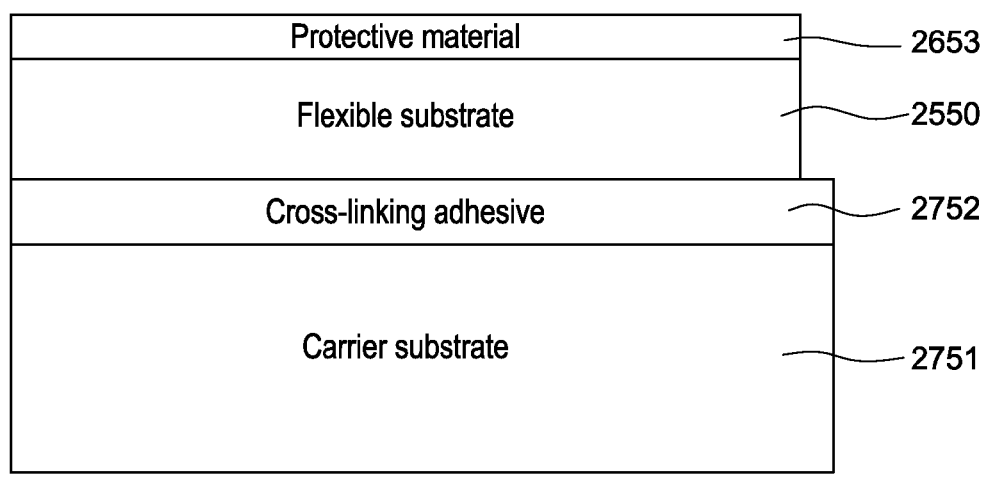
FIG. 30 illustrates a cross-sectional view of an example of the flexible substrate assembly of FIG. 5 after removing an alignment tab, according to the embodiment of FIG. 22.

Subsequently, process 2318 of FIG. 28 includes an activity 2832 of removing the alignment tab from the flexible assembly. In some examples, the alignment tab can be cut from the flexible substrate using ceramic scissors. The cut should be made slowly as any movement of the flexible substrate in the z-direction (relative to the carrier substrate) might cause de-lamination of the flexible substrate from the carrier substrate. If de-lamination occurs, the flexible substrate assembly can be re-laminated. FIG. 30 illustrates a cross-sectional view of flexible substrate assembly 2640 after removing the alignment tab, according to the embodiment of FIG. 22.

Next, process 2318 of FIG. 28 includes an activity 2833 of cleaning the flexible substrate assembly. In some examples, the flexible substrate assembly is cleaned with hexanes. The hexanes can be applied by spinning the flexible substrate assembly and spraying the hexanes on the protective material. After the protective material is cleaned, the exposed surface and edge of the carrier substrate is wiped clean with hexanes.

Procedure 2318 of FIG. 28 continues with an activity 2834 of curing the cross-linking adhesive. In the same or different embodiment, the cross-linking adhesive is UV cured. For example, the flexible substrate assembly can be exposed to UV light for approximately 15 to 25 seconds and room temperature to cure the cross-linking adhesive. In some embodiments, the cross-linking adhesive can be cured with UV light in the UV light range of approximately 320 nm (nanometers) to approximately 390 nm and with an intensity of approximately 75 mW/cm2 (milliWatts per square centimeter). A Dymax 2000-EC UV Curing Flood Lamp, manufactured by Dymax Corporation of Torrington, Conn., can be used to cure the cross-linking adhesive.

In various examples, the cross-linking adhesive is thermally cured during the baking in activity 2836. In some examples, the edges of the cross-linking adhesive are UV cured, and the rest of the cross-linking adhesive is thermally cured during the baking of activity 2836.

Figure 31:
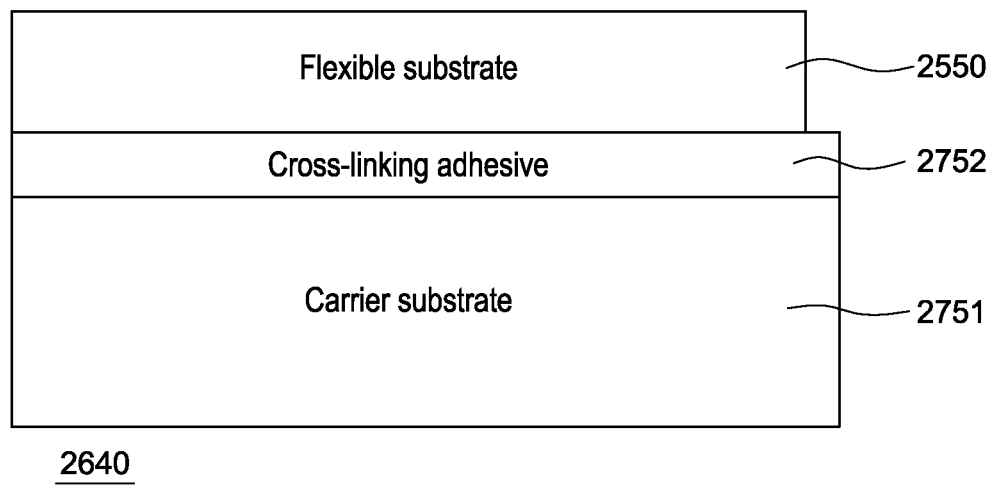
FIG. 31 illustrates a cross-sectional view of an example of the flexible substrate assembly of FIG. 5 after removing a protective material from the flexible substrate assembly, according to the embodiment of FIG. 22.

Subsequently, process 2318 of FIG. 28 includes an activity 2835 of removing the protective material from the flexible substrate assembly. In some examples, the protective material can be slowly removed using tweezers. During the removal process, the protective material is kept as flat as possible to avoid de-laminating the flexible substrate from the carrier substrate. In other examples, the protective material can be releasable by UV light. In these examples, the protective material would lose its tack during a UV light exposure. FIG. 31 illustrates a cross-sectional view of flexible substrate assembly 2640 after removing the protective material from the flexible substrate assembly, according to the embodiment of FIG. 22.

Next, process 2318 of FIG. 28 includes an activity 2836 of baking the flexible substrate assembly. Baking the flexible substrate assembly can help decrease the distortion, bow, and warp in the flexible substrate. In some embodiments, baking can also cure the adhesive.

In some examples, the flexible substrate assembly can be baked using a vacuum bake process. For example, the temperature in an oven containing the flexible substrate assembly can be ramped up over two to three hours to approximately 160° C. to approximately 190° C. The flexible substrate assembly can be baked for approximately 50 minutes to 70 minutes at 180° C. and with a pressure of approximately 1 mTorr to approximately 10 mTorr. The temperature in the oven can then be lowered to between approximately 90° C. to 115° C., and the flexible substrate assembly can be baked for approximately seven more hours to approximately nine more hours. Other baking processes can be also be used. After the baking process is complete, the flexible substrate assemblies are cleaned and placed in an oven at approximately 90° C. to 110° C. for a minimum of approximately two hours.

After baking the flexible substrate assembly, process 2318 is complete, and therefore, procedure 2210 is also complete. Procedure 2210, as described herein, and similar procedures can allow fabrication of one or more electrical components on a flexible substrate with zero or at least minimal distortion (e.g. approximately the limits of the sensitivity of an Azores 5200, manufactured by Azores Corporation of Wilmington, Mass.). Prior art methods of fabricating electrical components on the flexible substrate suffer from significant distortion problems that can lead to handling errors, photolithographic alignment errors, and line/layer defects.

Figure 32:
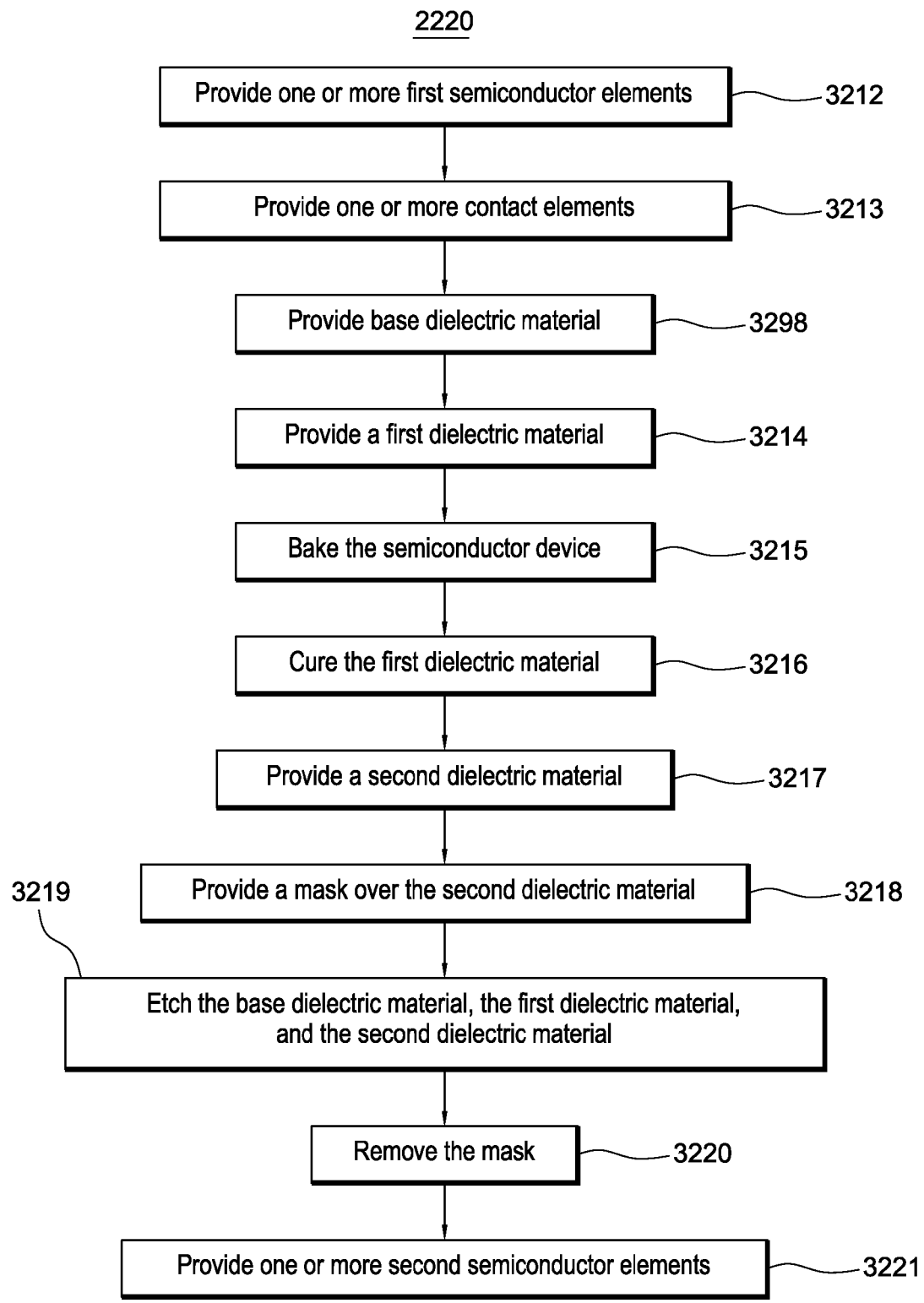
FIG. 32 illustrates an example of a procedure of providing semiconductor elements, according to the embodiment of FIG. 22.

Referring back to FIG. 22, method 2200 includes a procedure 2220 of providing semiconductor elements. FIG. 32 is a flow chart illustrating procedure 2220 of providing semiconductor elements, according to the embodiment of FIG. 22.

Figure 33:
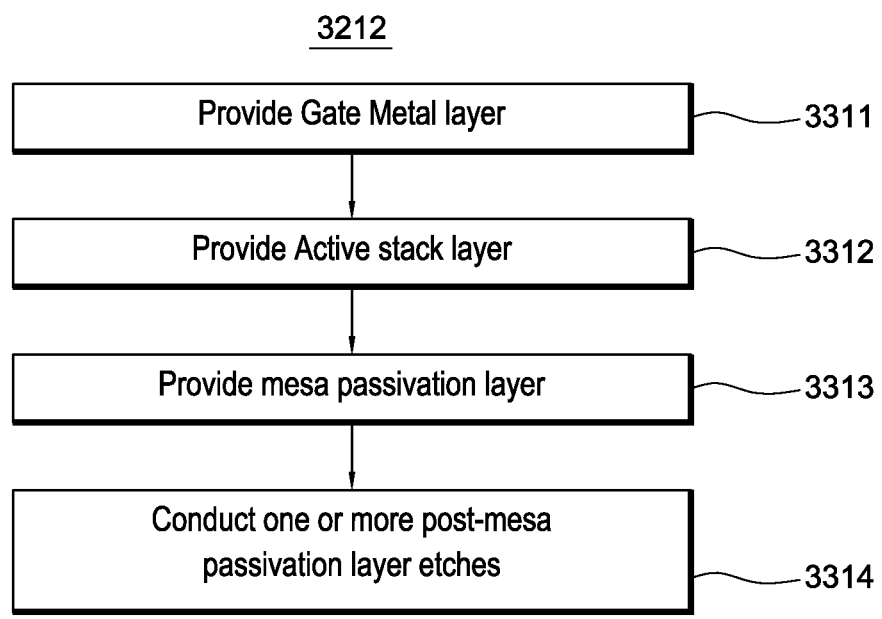
FIG. 33 illustrates an example of a process of providing one or more first semiconductor elements, according to the embodiment of FIG. 22.

Procedure 2220 of FIG. 32 includes a process 3212 of providing one or more first semiconductor elements. FIG. 33 is a flow chart illustrating process 3212 of providing one or more first semiconductor elements, according to the embodiment of FIG. 22.

Figure 50:
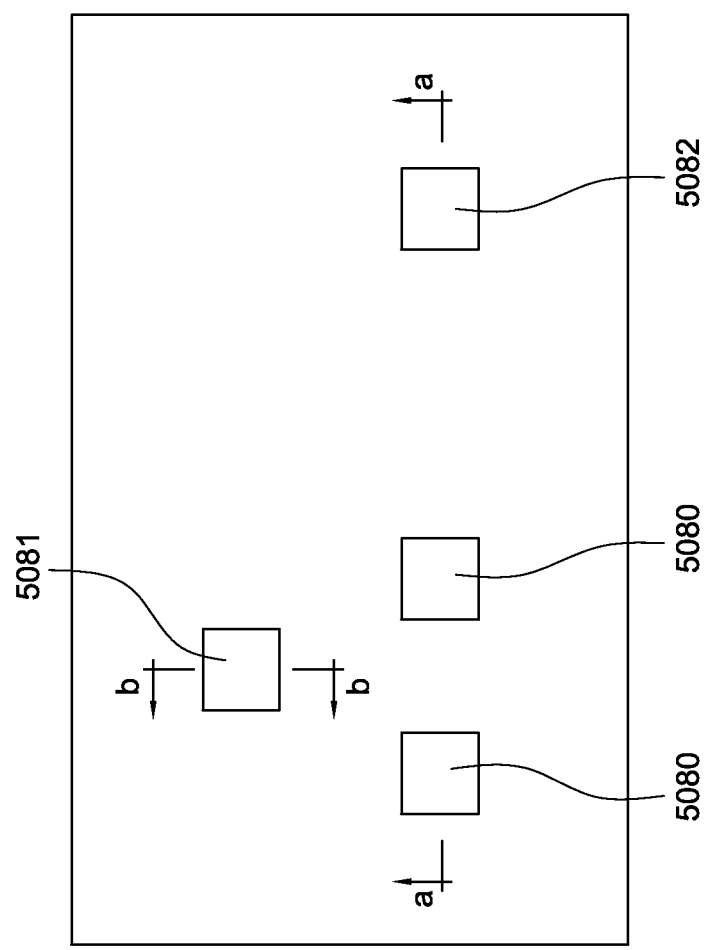
FIG. 50 illustrates a top view of a portion of a semiconductor device, according to the embodiment of FIG. 22.

Process 3212 in FIG. 33 includes an activity 3311 of providing a gate metal layer. FIG. 34 illustrates a cross-sectional view of a device build area of an example of a semiconductor device 3450 after providing a gate metal layer, according to the embodiment of FIG. 22. As can be seen in FIG. 50, the cross-sectional view of the device build area is the cross-sectional view of a portion of semiconductor device 3450 taken at the "a" lines. The device build cross sectional view comprises a cross-sectional view of a-Si contact areas 5080 and via area 5082. In addition, FIG. 35 illustrates a cross-sectional view of a gate contact build area of an example of semiconductor device 3450 after providing a gate metal layer, according to the embodiment of FIG. 22. As can be seen in FIG. 50, the cross-sectional view of the gate contact build area is the cross-sectional view of a portion of semiconductor device 3450 taken at the "b" lines. The gate contact build cross sectional view comprises a cross-sectional view of gate contact area 5081. FIG. 50 is merely exemplary and is not limited to the embodiments presented herein.

Referring to FIGS. 34 and 35, for example, an approximately 0.30 µm thick silicon nitride passivation layer 3452 is provided over flexible substrate assembly 2640. Silicon nitride passivation layer 3452 can be provided over flexible substrate 2550 (FIG. 31) of flexible substrate assembly 2640. In some embodiments, flexible substrate 2550 may baked prior to the deposition of silicon nitride passivation layer 3452.

In addition, a patterned metal gate layer 3453 can be provided over silicon nitride passivation layer 3452. Patterned metal gate layer 3453 can comprise molybdenum. In some examples, an approximately 0.15 µm layer of molybdenum can be deposited over silicon nitride passivation layer 3452 and then pattern etched to form patterned metal gate layer 3453. For example, molybdenum can be deposited over silicon nitride passivation layer 3452 by sputtering. In some examples, molybdenum can be deposited using a KDF 744, manufactured by KDF Electronic, Inc., of Rockleigh, N.J. In the same or different examples, patterned metal gate layer 3453 can be etched using an AMAT 8330, manufactured by Applied Material, Inc. of Santa Clara, Calif.

Subsequently, process 3212 of FIG. 33 includes an activity 3312 of providing an active stack. FIGS. 36 and 37 illustrate an example of semiconductor device 3450 after providing an active stack, according to the embodiment of FIG. 22.

Referring to FIGS. 36 and 37, for example a silicon nitride gate dielectric 3654 can be formed over patterned metal gate layer 3453 and silicon nitride passivation layer 3452. Referring to FIG. 36, for example, in the device build area of semiconductor device 3450, a patterned amorphous silicon (a-Si) layer 3655 can be provided over silicon nitride gate dielectric 3654, and a patterned silicon nitride intermetal dielectric (IMD) layer 3656 can be provided over a-Si layer 3655.

In some examples, as shown in FIGS. 36 and 37, silicon nitride gate dielectric 3654 can be deposited onto semiconductor device 3450 over metal gate layer 3453 and silicon nitride passivation layer 3452 by way of plasma-enhanced chemical vapor deposition (PECVD). In the same or different examples, silicon nitride gate dielectric 3654 can be approximately 0.30 µm thick.

With reference to FIG. 36, as an example, a-Si layer 3655 can be deposited over silicon nitride gate dielectric 3654 by way of PECVD. In the same or different examples, a-Si layer 3655 can be approximately 0.08 µm thick.

Also, as an example, silicon nitride IMD layer 3656 can be deposited over a-Si layer 3655 by way of PECVD. In the same or different examples, silicon nitride IMD layer 3656 can be approximately 0.10 µm thick.

In some examples, silicon nitride gate dielectric 3654, a-Si layer 3655, and silicon nitride IMD layer 3656 can all be deposited via PECVD using an AMAT P5000, manufactured by Applied Materials, Inc. of Santa Clara, Calif. In the same or different examples, the temperature at which silicon nitride gate dielectric 3654, a-Si layer 3655, and silicon nitride IMD layer 3656 are deposited onto semiconductor device 3450 is greater than approximately 180° C. For example, the temperature at which silicon nitride gate dielectric 3654, a-Si layer 3655, and silicon nitride IMD layer 3656 are deposited onto semiconductor device 3450 is from approximately 180° C. to approximately 250° C. As an example, the temperature at which silicon nitride gate dielectric 3654, a-Si layer 3655, and silicon nitride IMD layer 3656 are deposited onto semiconductor device 3450 is from approximately 188° C. to approximately 193° C. Furthermore, the deposition of silicon nitride gate dielectric 3654, a-Si layer 3655, and silicon nitride IMD layer 3656 onto semiconductor device 3450 can be done at approximately vacuum.

After silicon nitride gate dielectric 3654, a-Si layer 3655, and silicon nitride IMD layer 3656 are deposited onto semiconductor device 3450, the resulting layers can be etched. For example, silicon nitride can be etched using a 10:1 buffered oxide etch (BOE). In addition, a-Si layer 3655 can be etched using an AMAT 8330. In some examples, silicon nitride IMD layer 3656 and a-Si layer 3655 are etched so that a-Si layer 3655 is exposed, i.e., a-Si layer 3655 is not completely covered by silicon nitride IMD layer 3656.

Figure 38:
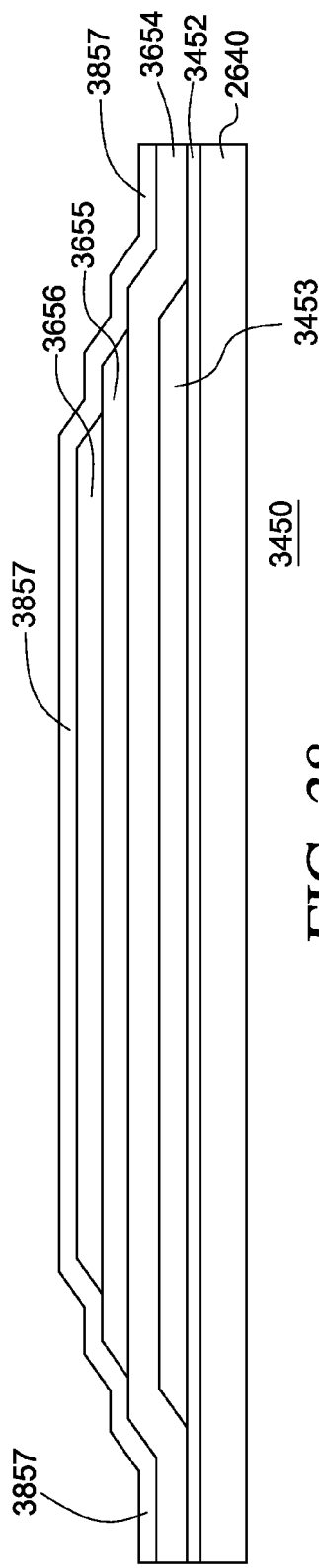
FIG. 38 illustrates a cross-sectional view of an example of the device build area of the semiconductor device of FIG. 13 after providing a mesa passivation layer, according to the embodiment of FIG. 22.
Figure 39:
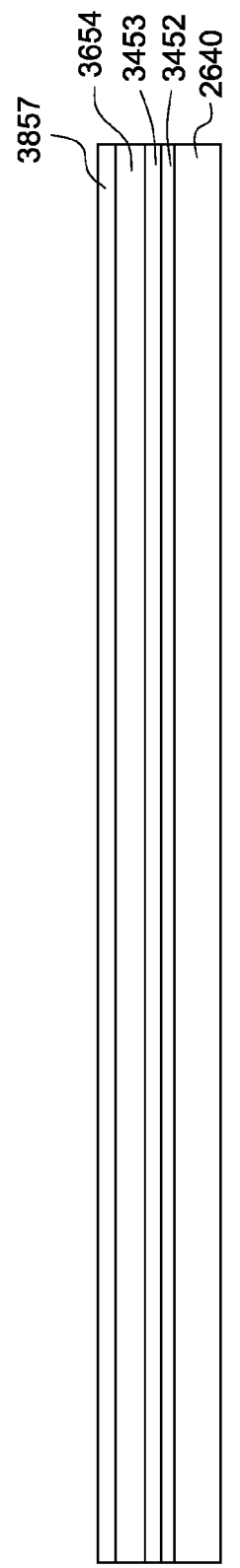
FIG. 39 illustrates a cross-sectional view of an example of the gate contact build area of the semiconductor device of FIG. 14 after providing the mesa passivation layer, according to the embodiment of FIG. 22.

Next, process 3212 of FIG. 33 includes an activity 3313 of providing a mesa passivation layer. FIGS. 38 and 39 illustrate an example of semiconductor device 3450 after providing a mesa passivation layer, according to the embodiment of FIG. 22.

With reference to FIG. 38, as an example, in the device build area of semiconductor device 3450, mesa passivation layer 3857 is deposited onto semiconductor device 3450 over silicon nitride gate dielectric 3654, a-Si layer 3655, and silicon nitride IMD layer 3656. Mesa passivation layer 3857 can comprise silicon nitride. Mesa passivation layer 3857 can be deposited over a-Si layer 3655 to passivate and/or encapsulate the surface of a-Si layer 3655, thereby preventing contamination of the surface of a-Si layer 3655 and lowering leakage currents along the surface of a-Si layer 3655. With reference to FIG. 39, as an example, in the gate contact build area of semiconductor device 3450, mesa passivation layer 3857 can be deposited over silicon nitride gate dielectric 3654.

Mesa passivation layer 3857 can be deposited onto semiconductor device 3450 by way of PECVD. As an example, mesa passivation layer 3857 can be approximately 0.10 µm thick. In the same or different examples, mesa passivation layer 3857 can be deposited via PECVD using an AMAT P5000.

Subsequently, process 3212 of FIG. 33 includes an activity 3314 of conducting one or more post-mesa passivation layer etches. FIGS. 40 and 41 illustrate cross-sectional views of semiconductor device 3450 after one or more post-mesa passivation layer etches have been conducted. For example, FIG. 41 illustrates semiconductor device 3450 after a contact gate etch has taken place in the gate contact build region of semiconductor device 3450. In the same or different examples, FIG. 40 illustrates semiconductor device 3450 after a contact a-Si etch has taken place in the device build region of semiconductor device 3450.

The contact gate etch of the gate contact build region of semiconductor device 3450 can etch away silicon nitride. For example, the contact gate etch can etch away mesa passivation layer 3857 and silicon nitride gate dielectric 3654. In many examples, the metal gate layer 3453 underneath silicon nitride gate dielectric 3654 functions as an etch stop for the etching process. The contact gate etch of the contact gate build region can be performed in a Tegal 903, manufactured by Tegal Corporation of Petaluma, Calif. After the contact gate etch, gate contact 4191 is formed on semiconductor device 3450. Gate contact 41 is associated with gate contact area 5081 of FIG. 50.

The contact a-Si etch of the device build region of semiconductor device 3450 can etch away silicon nitride. For example, the contact a-Si etch can etch away mesa passivation layer 3857 and silicon nitride IMD layer 3656. The silicon nitride layers can be etched using a 10:1 BOE. a-Si layer 3655 under silicon nitride layer 3656 can act as an etch stop for the etching process. After the contact a-Si etch, a-Si contacts 4090 are formed on semiconductor device 3450. a-Si contacts 4090 are associated with a-Si contact areas 5080 of FIG. 50. In this embodiment, the contact a-Si etch and the contact gate etch can be separate etches using separate etch masks.

Figure 42:
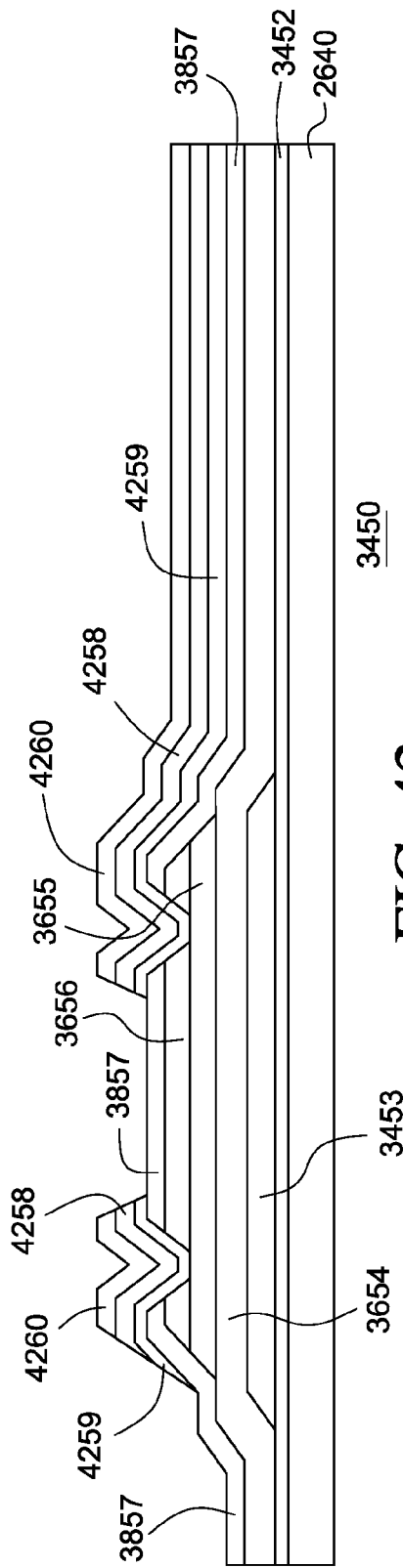
FIG. 42 illustrates a cross-sectional view of an example of the device build area of the semiconductor device of FIG. 13 after providing one or more contact elements, according to the embodiment of FIG. 22.
Figure 43:
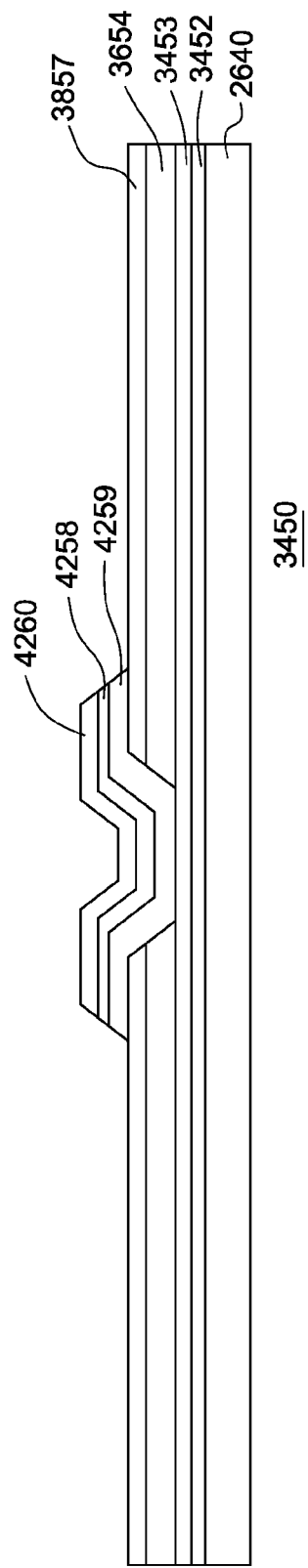
FIG. 43 illustrates a cross-sectional view of an example of the gate contact build area of the semiconductor device of FIG. 14 after providing one or more contact elements, according to the embodiment of FIG. 22.

After activity 3314, process 3212 of FIG. 33 is completed. With reference to FIG. 32, procedure 2220 continues with a process 3213 of providing one or more contact elements. FIG. 42 illustrates a cross-sectional view of a device build region of an example of semiconductor device 3450 after process 3213 has been completed. In addition, FIG. 43 illustrates a cross-sectional view of a gate contact build region of an example of semiconductor device 3450 after process 3213 has been completed.

In the example illustrated in FIG. 42, N+ a-Si layer 4259 is provided over portions of mesa passivation layer 3857, a-Si layer 3655, and silicon nitride IMD layer 3656. As illustrated in FIG. 42, diffusion barrier 4258 is provided over N+ a-Si layer 4259, and metal layer 4260 is provided over diffusion barrier 4258. Similarly, in the example of FIG. 43, N+ a-Si layer 4259 is provided over portions of mesa passivation layer 3857, silicon nitride gate dielectric 3654, and gate metal layer 3453. Also shown in FIG. 43, diffusion barrier 4258 is provided over N+ a-Si layer 4259, and metal layer 4260 is provided over diffusion barrier 4258.

N+ a-Si layer 4259 may be provided by way of PECVD. As an example, N+ a-Si layer 4259 can be approximately 0.05 μm thick. In the same or different examples, N+ a-Si layer 4259 can be deposited via PECVD using an AMAT P5000.

As an example, diffusion barrier 4258 can include tantalum (Ta). In the same or different examples, metal layer 4260 can include aluminum (Al). Diffusion barrier 4258 can help prevent movement of atoms from metal layer 4260, such as, for example, Al atoms, from diffusing into N+ a-Si layer 4259, and subsequently a-Si layer 3655. Diffusion barrier 4258 and metal layer 4260 can be deposited over N+ a-Si layer 4259 by way of sputtering. In some examples, diffusion barrier 4258 and metal layer 4260 can be deposited using a KDF 744.

After, N+ a-Si layer 4259, diffusion barrier 4258, and metal layer 4260 have been deposited onto semiconductor device 3450, the three layers are etched. As an example, the three layers can be etched using an AMAT 8330. In some examples, N+ a-Si layer 4259, diffusion barrier 4258, and metal layer 4260 are etched using a single recipe for all three of the layers. As an example, the N+ a-Si layer 4259, diffusion barrier 4258, and metal layer 4260 are etched using boron trichloride ($BCl_3$) with a flow rate of approximately 140 sccm (standard cubic centimeters per minute) and chlorine gas ($Cl_2$) with a flow rate of approximately 10 sccm at a pressure of approximately 20 mTorr for 1 minute and 45 seconds. Next, the $Cl_2$ is increased to 30 sccm, while the pressure is dropped to 10 mTorr for 15 minutes. Next, the $BCl_3$ rate is decreased to 30 sccm, and the pressure is increased to 15 mTorr. Finally, the $BCl_3$ and the $Cl_2$ flow rates are brought to zero, and oxygen ($O_2$) is brought in at 50 sccm with a pressure of 50 mTorr for 60 minutes.

In various embodiments, procedure 2220 can include a process 3298 of providing a base dielectric material. The base dielectric material can provide a uniform surface (e.g., a wetting layer) for the spin-on dielectric material (e.g., dielectric layer 4561 (FIG. 45)). In some examples, the base dielectric material can include silicon oxide or silicon nitride (e.g., base dielectric material 4599). In many examples, the base dielectric material can be provided using a process similar or identical to the process used to provide the second dielectric material (i.e., process 3217), as described below. In other embodiments, procedure 2220 does not include process 3298 or providing a base dielectric material.

Subsequently, procedure 2220 includes a process 3214 of providing a first dielectric material. The first dielectric material can be provided over the one or more contact elements of process 3213. In some examples, the first dielectric material can be an organic siloxane-based dielectric material, organosiloxane dielectric material, and/or siloxane-based dielectric material. In various embodiments, the first dielectric material can be organic. Using an organic siloxane-based dielectric material can allow for thicker films and more flexible films than with a non-organic siloxane-based dielectric material. In some examples, the first dielectric material can be used as an interlayer dielectric. In the other examples, the first dielectric material can be used as an intralayer dielectric.

Table 2 illustrates properties of an example of a dielectric material that can be used as the first dielectric material in process 3214, according to an embodiment.

TABLE 2

| Properties | Dielectric Material |
| --- | --- |
| Cure temperature | ~400° C. (when deposited over low temperature polysilicon)<br>~350° C. (when deposited over amorphous silicon (a-Si))<br><200° C. (when deposited over a flexible substrate) |
| Film Thickness | 1.5 μm to 3.5 μm |
| Transmittance | >95% |
| Planarization | >95% |
| Resistance to plasma induced damage | Fluorine-based plasma (e.g., Sulfur hexaflourine ($SF_6$), carbon tetra fluorine ($CF_4$), trifluoromethane ($CHF_3$), $O_2$ plasma used for removing photoresist, and ashing |
| Adhesion | Aluminum (Al), chromium (Cr), indium tin oxide (ITO), silicon nitride (SiN), organic layers |
| Outgassing | Low (less than typical CVD chamber pressures) |
| Moisture uptake | Low moisture uptake |
| Dispense tool | Spin or slot die coaters, screen printers, spray coating |

As used in Table 2, film thickness refers to the desired thickness of the dielectric material that displays the other properties in the table. Transmittance refers to the percentage of light that is transmitted through the dielectric material. Planarization refers to the degree of planarization (DOP) of the dielectric material. Resistance to plasma induced damage indicates the plasmas that will not damage this film. Adhesion means the dielectric material can be coupled to at least these other materials. Outgassing can refer to outgassing pressure of the dielectric material or the rate at which the dielectric material outgases. Moisture uptake can refer to the rate at which moisture is absorbed by the dielectric material. Dispense tools refers to equipment that can be used to apply the dielectric material.

Table 3 illustrates properties of a second example of a dielectric material that can be used as the first dielectric material in process 3214, according to an embodiment.

TABLE 3

| Properties | Dielectric Material |
| --- | --- |
| Film Thickness | 1 μm to 4 μm |
| Cure temperature | ~180° C. |
| Etch Chemistry | Standard plasma etch chemistries |
| Etch Rate | >0.25 μm per minute |
| Feature Size | <5 μm |
| Dielectric Constant (k) | <4.0 |
| Breakdown Voltage | >5 megavolts per centimeter (MV/cm) |
| Heat Resistance | ≥250° C. |
| Adhesion | Al, ITO, molybdenum (Mo), photoresist |
| Moisture Uptake | <0.2 wt % over 2 hours |
| Planarization | >95% |
| Outgassing | No |
| Transparency | >95% |

As used in Table 3, etch chemistries refers to etch chemistries that can be used to etch the dielectric material. Etch rate is the minimum etch rate of the dielectric material when using the etch chemistries. Feature size refers to the smallest size of an element or feature formed with the dielectric material. Breakdown voltage is the voltage per length at which the dielectric material begins acting as a conductor. Heat resistance is the lowest temperature that the material can withstand before becoming unstable.

Figure 44:
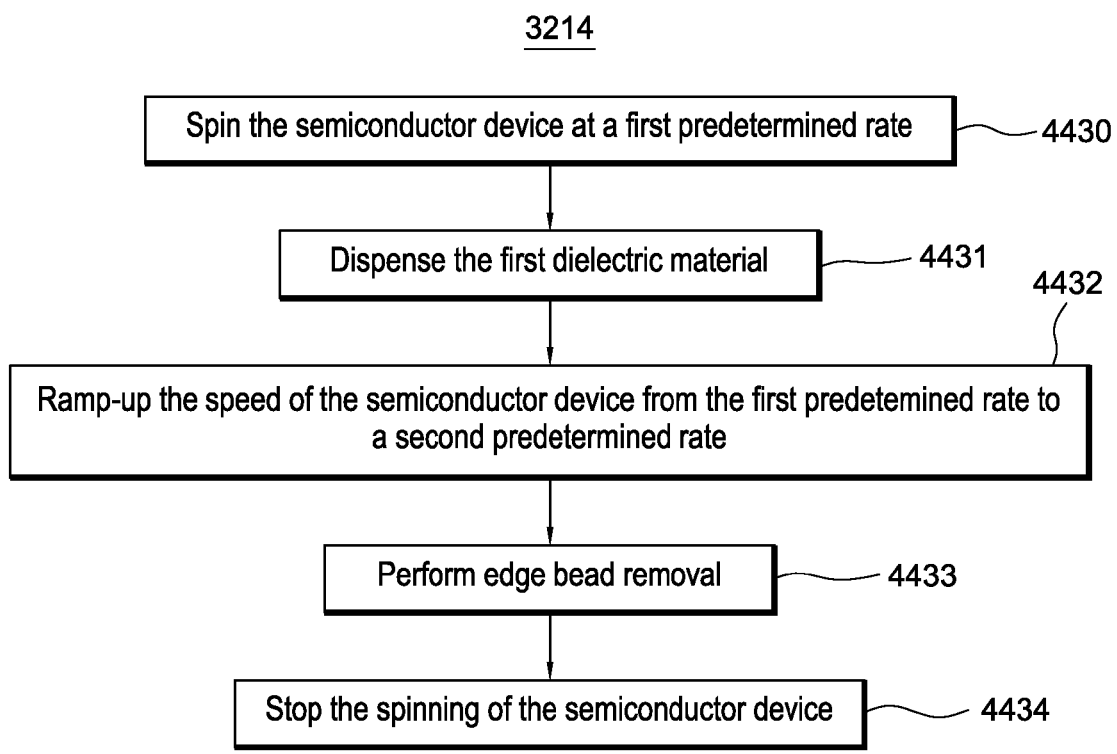
FIG. 44 illustrates an example of a process of providing a first dielectric material, according to the embodiment of FIG. 22.

FIG. 44 illustrates an example of process 3214 of providing a first dielectric material. In various embodiments, the first dielectric material can be a spin-on-dielectric. Accordingly, in these examples, the dielectric can be applied to the semiconductor device by spin-coating the first dielectric material over the first metal layer and various silicon nitride layers. In various embodiments, the application of the first dielectric material can be performed in a Rite Track 8600 available from Rite Track, Inc., of West Chester, Ohio.

Referring to FIG. 44, process 3214 can include an activity 4430 of spinning the semiconductor device at a first predetermined rate. In some examples, the first predetermined spin rate is between approximately 500 rpm and approximately 2000 rpm. In same or different embodiment, the first predetermined rate is approximately 1000 rpm.

Subsequently, process 3214 can include an activity 4431 of dispensing the first dielectric material. In some examples, the first dielectric material is dispensed over the substrate while the substrate is spinning at the first predetermined rate. In some examples, the first dielectric material can be dispensed using a syringe. If the substrate is a six inch diameter wafer, approximately 4 mL (milliliters) can be dispensed over the semiconductor device. In some examples, the pressure in the tip of the syringe during dispensing can be approximately 15 kPa. In the same or different embodiment, after the syringe dispenses the first dielectric material, the syringe has suck back pressure of approximately 1 kPa. The suck back pressure of the syringe prevents dripping additional amounts of the first dielectric material from the syringe after the dispensing process is complete. For a 6-in wafer, the dispensing process takes approximately 3 seconds. The semiconductor device is spun at the first predetermined rate until activity 4431 is complete.

In various embodiments, a dynamic dispensing process is used. That is, the substrate is spinning while the first dielectric material is dispensed. In some examples, the first dielectric material is dispensed at the center of the substrate. In other examples, at the beginning of the dispensing process, the syringe is located over the center of the substrate and moves from the center of the substrate to the edge of the substrate at a constant rate of approximately thirty to approximately sixty millimeters per second while the substrate is spinning. In other embodiments, a static dispensing process is used. That is, the substrate is not spun during the dispensing process.

Next, process 3214 includes an activity 4432 of ramping-up the speed of the semiconductor device from the first predetermined rate to a second predetermined rate. In some examples, the second predetermined spin rate is between approximately 2000 rpm and approximately 4000 rpm. In the same or different embodiment, the second predetermined rate is approximately 2600 rpm. Spinning the semiconductor device at the second predetermined rate of approximately 2600 rpm for approximately thirty seconds can distribute the first dielectric material with a thickness of approximately two µm over the surface of the semiconductor device. Different thicknesses of the first dielectric material can be achieved by using different second predetermined rates.

Figure 51:
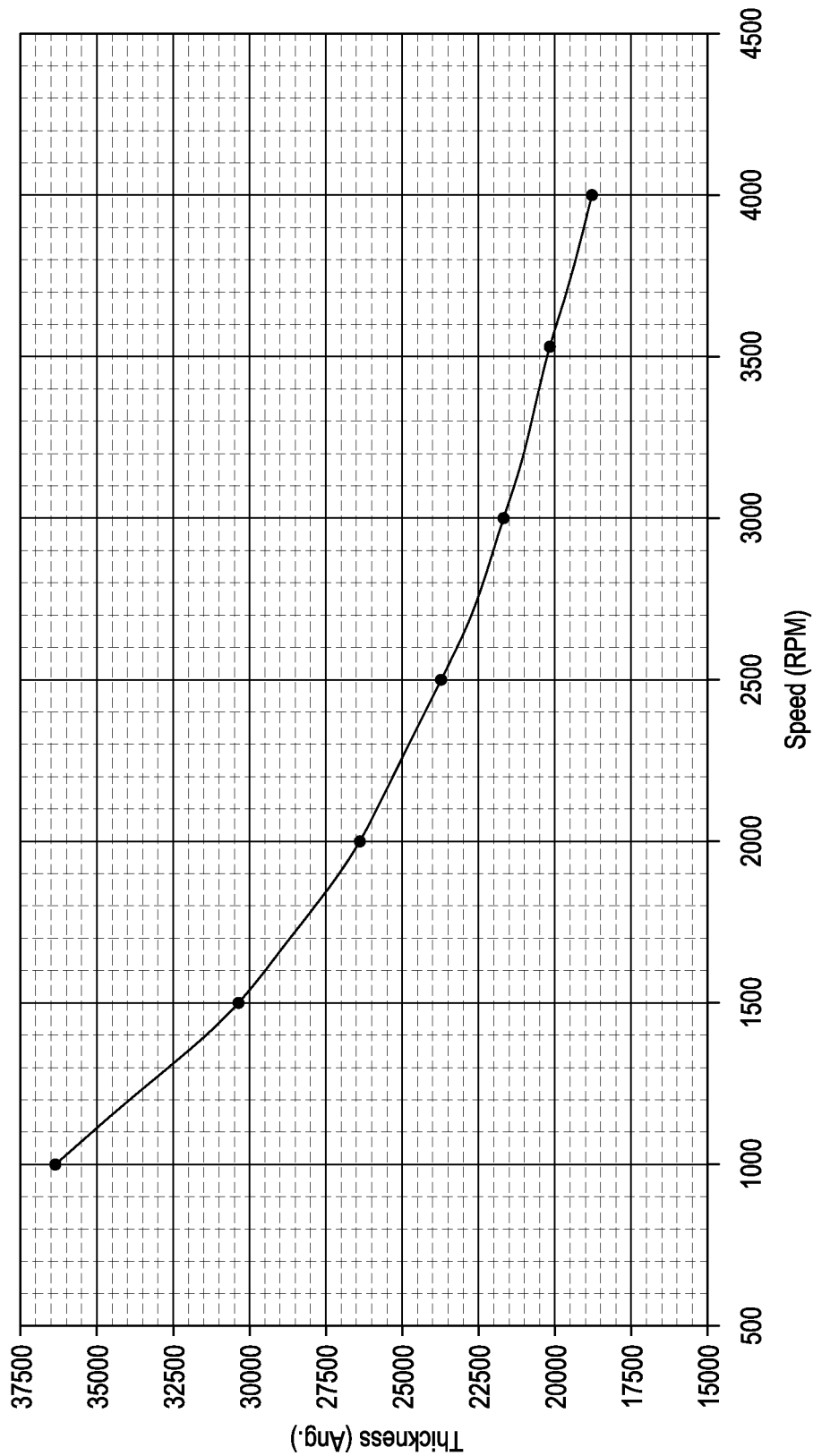
FIG. 51 illustrates a graph of thickness of a dielectric material versus spin rate of a substrate.

FIG. 51 is an illustration of thickness of the first dielectric material versus the spin rate (i.e., speed) of the semiconductor material.

Process 3214 can further include an activity 4433 of performing edge bead removal. In some examples, during activities 4431 and 4432, the first dielectric material flows outward due to the centrifugal force toward the edge of the substrate and creates a ridge (i.e., the edge bead) on the top side edge of the semiconductor device. The edge bead, when dried, could flake off and increase defects of the semiconductor device and/or damage the manufacturing equipment. Accordingly, the edge bead is removed in activity 4433. In some examples, the equipment used in activities 4431 and 4432 can include an edge bead removal device. In some examples, a solvent is sprayed on the edge bead to remove the first dielectric material around the edge of the substrate. In some examples, while the semiconductor device is spun at a third predetermined rate, a solvent is sprayed over, for example, approximately five to approximately six millimeters inside the edge of the substrate. In some examples, removing the first dielectric material from the edges of the substrate also helps to ensure that when a second dielectric material is provided over the first dielectric material (process 3217 of FIG. 32), the edges of the first dielectric material are capped by a second dielectric material.

In some examples, cyclohexanone, propylene glycol monomethyl ether acetate (PGMEA), or other edge bead removing solvents can be used. In some examples, the semiconductor device is rotated at a third predetermined rate of approximately 1000 rpm during the edge bead removal process. In some examples, the semiconductor device is spun at the third predetermined rate for approximately thirty seconds, and solvent is sprayed on the bead edge during this time.

Subsequently, process 3214 continues with an activity 4334 of stopping the spinning of the semiconductor device. After the spinning of the semiconductor device is stopped, process 3214 is complete.

Referring back to FIG. 32, procedure 2220 includes a process 3215 of baking the semiconductor device. In some examples, baking the semiconductor device includes baking the first dielectric material of process 3214, the base dielectric material of process 3298, the one or more contact elements of process 3213, the one or more first semiconductor elements of process 3212, and the substrate of procedure 2210. One of the purposes of the bake is to cause evaporation of the solvents from the edge bead process. Baking the semiconductor device can also increase planarization, decrease film defects, and cross-link the first dielectric material.

In various embodiments, the baking of the semiconductor device is performed using a two bake sequence. The baking process can be performed at atmospheric pressure using a hot plate. Process 3215 can be performed, for example, in a Rite Track 8800.

The first bake is a bake for approximately sixty seconds at approximately 160° C. In an alternative example, the first bake can be an approximately sixty second bake at approximately 150° C. After the first bake is complete, in some examples, the semiconductor device is allowed to cool for approximately thirty seconds before the second bake. The semiconductor device can be allowed to cool at room temperature (and not using a chill plate). The semiconductor device is allowed to cool, in these examples, because the handling system uses polytetrafluoroethylene (e.g., Teflon® material from E. I. du Pont de Nemours and Company of Wilmington, Del.) coated chucks to handle the semiconductor device. Placing a hot semiconductor device on the polytetrafluoroethylene coated chuck can damage the chuck. If other equipment is used, the cooling process can possibly be skipped.

After letting the semiconductor device cool, the semiconductor device can be baked for a second time on a hot plate. In some embodiments, the second bake can be for approximately sixty seconds at a temperature greater than approximately 160° C. because 160° C. is the boiling point of PGMEA. For example, if the first bake was at the 160° C., the second bake can be for approximately sixty seconds at approximately 170° C. If the first bake was at the 150° C., the second bake can be for approximately sixty seconds at approximately 200° C. After the second bake is complete, the semiconductor device can be cooled again for thirty seconds. In other embodiments, other sequences of bakes can be performed.

After the baking is complete, the next process in procedure 2220 is a process 3216 of curing the first dielectric material.

Curing of the first dielectric material can improve the cross-linking of the first dielectric material. In some examples, the curing can be performed in a convection oven in a nitrogen atmosphere at atmospheric pressure (i.e., approximately one atmosphere).

In various examples, the semiconductor device can be placed in the oven. Afterwards, the temperature in the oven can be ramped-up to approximately 200° C., and the semiconductor device can be baked for approximately one hour at approximately 200° C. The temperature is ramped-up a rate of approximately 1-2° C. per minute to minimize outgassing of the first dielectric material of process 3214. After the bake is complete, the temperature is slowly ramped down (e.g., 1-2° C. per minute) to room temperature.

In another embodiment, a baking procedure with five separate bakes can be used. The first bake can be a bake at approximately 60° C. for approximately ten minutes. The ramp-up time to approximately 60° C. from room temperature is approximately ten minutes. After baking at approximately 60° C., the temperature is ramped-up over approximately thirty-two minutes to approximately 160° C. The semiconductor device is baked for approximately thirty-five minutes at approximately 160° C.

The temperature of the convection oven is then increased to approximately 180° C. over approximately ten minutes after the 160° C. bake. The semiconductor device is baked for approximately twenty minutes at approximately 180° C.

After baking at 180° C., the temperature is ramped-up over approximately fifty minutes to approximately 200° C. The semiconductor device is baked for approximately sixty minutes at approximately 200° C. Finally, in this bake procedure, the temperature in the oven is ramped-down to approximately 60° C. over approximately seventy minutes. The semiconductor device is baked for approximately ten minutes at approximately 60° C. After baking is complete, the semiconductor device is allowed to cool to approximately room temperature before proceeding with procedure 2220 of FIG. 32. The baking of the semiconductor device can help anneal the one or more contact elements.

Subsequently, procedure 2220 includes a process 3217 of providing a second dielectric material. In some examples, providing the second dielectric material can include depositing the second dielectric material over the organosiloxane dielectric layer (i.e., the first dielectric material of process 3214). In some examples, the second dielectric material can comprise silicon nitride. In the same or different examples, the second dielectric material can include silicon oxynitride ($SiO_xN_y$), silicon oxide, and/or silicon dioxide ($SiO_2$). In some examples, a low temperature PECVD process can be used to deposit the second dielectric material. In some examples, as part of providing the second dielectric material, the first dielectric material is capped by the second dielectric material. In some examples, the edges of the first dielectric material can be capped by the second dielectric material so the first dielectric material is not exposed to any subsequent oxygen ($O_2$) plasma ashings. Oxygen plasma ashings can degrade the first dielectric material in some examples.

The second dielectric material can be deposited with a thickness of approximately 0.1 μm to approximately 0.2 μm. The second dielectric material can be deposited to protect the first dielectric material from later etches.

The next process in procedure 2220 is a process 3218 of providing a mask over the second dielectric material. The mask applied in process 3218 can be an etch mask for an etching activity of process 3219 of FIG. 32.

In some examples, process 3218 can include applying a patterned photoresist over the siloxane-based dielectric layer (i.e., the first dielectric material of process 3214) or patterning a mask over the organic siloxane-based dielectric (i.e., the first dielectric material of process 3214). Similarly, process 3218 can include providing a patterned mask over the organosiloxane dielectric layer (i.e., the first dielectric material of process 3214).

In some examples, the mask covers one or more portions of the first dielectric material and the second dielectric material that are not to be etched. The mask can be provided with a thickness such that the mask is not etched through during the etching process of process 3219 of FIG. 32. In some examples, the mask can have a thickness of approximately 3.5 μm or approximately 2.5 μm to approximately 5.0 μm.

In some examples, the mask comprises photoresist. In some examples, the photoresist can be AZ Electronic Materials MiR 900 Photoresist, manufactured by AZ Materials of Luxembourg, Luxembourg. In some examples, the photoresist is coated over the second dielectric material using the Rite Track 8800. For example, the semiconductor device can be vapor primed and spin-coated with the mask (e.g., the photoresist). After coating the semiconductor device, the semiconductor device is baked at approximately 105° C. for approximately sixty seconds.

Next, the semiconductor device is aligned to the correct position with a template and exposed to UV (ultraviolet) light to transfer the mask image from the template to the mask. After exposing the mask, the semiconductor device is baked for approximately ninety seconds at approximately 110° C. The mask is then developed using an approximately ninety second puddle with standard development chemicals to remove the portions of the photoresist that were not exposed to the UV light.

After the development is completed, the last portion of providing the mask over the second dielectric material is performing a photoresist reflow process on the mask. Photoresist reflow is the process of heating the mask after the photoresist has been developed to cause the photoresist to become at least semi-liquid and flow.

In some examples, the semiconductor device is baked at approximately 2240° C. for approximately sixty seconds. This photoresist reflow process will decrease the sharpness of the edges of the mask, and thus, when etched in process 3219 of FIG. 32, the vias in the first dielectric and the second dielectric will have sloped sides. In some examples, the sloped sizes are at an angle of approximately thirty degrees from horizontal.

Next, procedure 2220 includes a process 3219 of etching the base dielectric material, the first dielectric material, and the second dielectric material. The base dielectric material, the first dielectric material, and the second dielectric material are etched to create vias in the base dielectric material, the first dielectric material, and the second dielectric material.

In some examples, the base dielectric material, the first dielectric material, and the second dielectric material are etched in the same process using the same etch mask. In other examples, the first dielectric material is etched in a first process, and the second dielectric is etched in a second process, and the base dielectric is etched in a third process.

In these other examples, a mask can be applied to the base dielectric material; the base dielectric material can be etched; and the mask can be removed before the first dielectric material is provided in process 3214 of FIG. 32. Subsequently, a mask can be applied to the first dielectric material; the first dielectric material can be etched; and the mask can be removed before the second dielectric material is provided in process 3217 of FIG. 32. Then, a mask can be applied to the second dielectric material, and the second dielectric material can be etched. In another example, the second dielectric material can be etched using the mask of process 3218; the mask can be removed; and the patterned second dielectric material can be used as the mask for patterning the first dielectric material.

In many embodiments, the base dielectric material, the first dielectric material, and the second dielectric material are plasma etched. In the same or different embodiments, the base dielectric material, the first dielectric material, and the second dielectric material are reactive ion etched (RIE). In some examples, the base dielectric material, the first dielectric material, and the second dielectric material are etched with a fluorine-based etchant. In some examples, the etchant can be trifluoromethane ($CHF_3$), sulfur hexafluoride ($SF_6$), or other fluorine-based etchants.

In some examples where there is no base dielectric material (i.e., process 3298 is skipped), the first material can be the organosiloxane dielectric material described previously, and the second material can be silicon nitride. In these examples, the first dielectric material and the second dielectric material can be RIE etched with sulfur hexafluoride ($SF_6$) for approximately four minutes. If sulfur hexafluoride is used as the etchant, the etching can be performed in a plasma chamber with a 1:2 ratio of sulfur hexafluoride to oxygen ($O_2$).

The etch rate of the sulfur hexafluoride for the first dielectric material and the second dielectric material are approximately the same (i.e., approximately 0.5 μm per minute). The etch rate of the second dielectric material, however, is marginally greater than the first dielectric material. In some example, the pressure in the plasma chamber during etching is approximately 50 mTorr to approximately 400 mTorr. The RIE etch can be performed in a Tegal 901, manufactured by Tegal Corporation of Petaluma, Calif.

The second dielectric material can be etched before the first dielectric material; the first dielectric material can be etched before the base dielectric material. In many examples, the metal layer underneath the base dielectric material functions as an etch stop for the etching process. If sulfur hexafluoride is used as the etchant, the metal layer can be aluminum. In this embodiment, the metal layer cannot be molybdenum or tantalum because sulfur hexafluoride etches these two metals. In a different embodiment, the metal layer can include molybdenum and/or tantalum if the etch for the overlying second dielectric layer is a timed etch.

Figure 45:
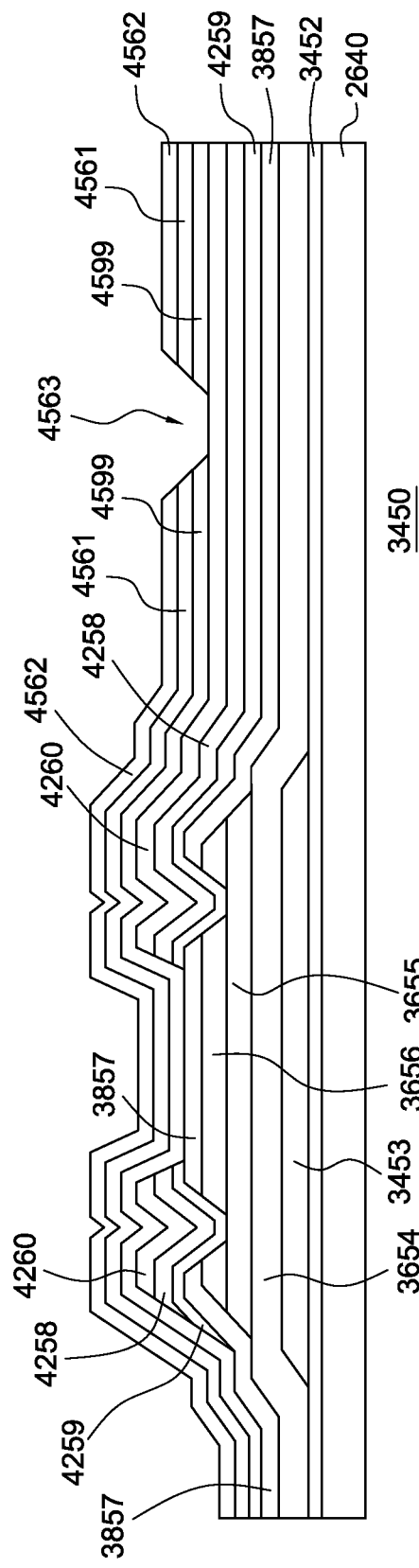
FIG. 45 illustrates a cross-sectional view of an example of the device build area of the semiconductor device of FIG. 13 after etching a first dielectric material and a second dielectric material, according to the embodiment of FIG. 22.

A buffered oxide etch (BOE) and chlorine based etchants cannot be used in some examples because they do not etch the first dielectric material when it comprises an organosiloxane dielectric material. FIG. 45 illustrates a cross-sectional view of the device build area of an example of semiconductor device 3450 after etching etch base dielectric material 4599, first dielectric material 4561 and second dielectric material 4562. After process 3219 in FIG. 32, semiconductor device 3450 can include vias 4563, as shown in FIG. 45. Vias 4563 are associated with via area 4582 of FIG. 50. The mask over second dielectric layer 4562 is not shown in FIG. 45.

Referring again to FIG. 32, the next process in procedure 2220 is a process 3220 of removing the mask. In some examples, the mask is removed by ashing the mask (e.g., the photoresist) at a temperature below 110° C. If the mask is ashed at a temperature above 110° C., cracking can occur in the first dielectric material. Accordingly, in some examples, ashing of the mask is performed at a temperature in the range of approximately 70° C. to approximately 90° C. In the same or different example, the ashing of the mask is performed at a temperature in the range of approximately 77° C. to approximately 84° C.

The ashing can be performed at a pressure of no greater than approximately 300 mTorr. Oxygen ($O_2$) can flow through in the chamber during the ashing process at a rate of approximately 50 sccm. In various examples, the ashing procedure can be performed in a Tegal 901. After ashing the mask, the semiconductor device can be rinsed with deionized water and spin dried. In some examples, the rinsing can be performed in a quick dump rinser, and the drying can be performed in a spin rinse dryer.

In other examples, a wet strip can be used to remove the photoresist. In some embodiments, an N-methylpyrrolidinone (NMP) based stripper can be used.

The next process in procedure 2220 of FIG. 42 is a process 3221 of providing one or more second semiconductor elements. Examples of one or more second semiconductor elements can include a second metal layer, an indium tin oxide (ITO) layer, and a silicon nitride layer.

Figure 46:
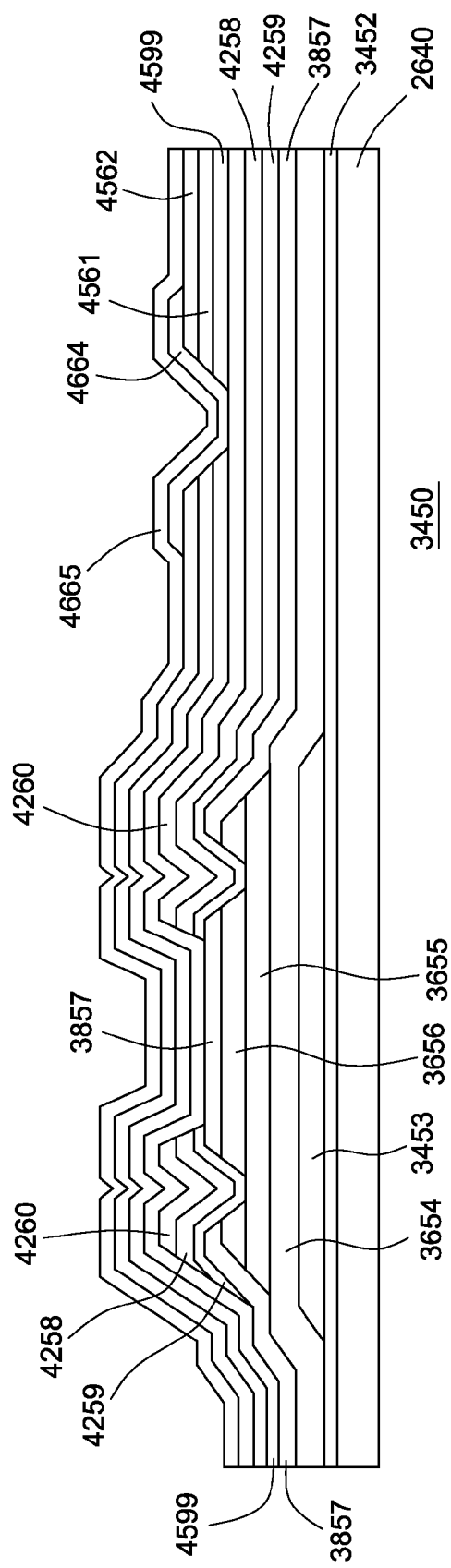
FIG. 46 illustrates a cross-sectional view of an example of the device build area of the semiconductor device of FIG. 13 after providing a second metal layer and an ITO layer, according to the embodiment of FIG. 22.

As an example, FIG. 46 illustrates a cross-sectional view of the device build area of an example of semiconductor device 3450 after providing a second metal layer 4664 and an ITO layer 4665. Second metal layer 4664 can be deposited over second dielectric material 4562 and at least partially in vias 4563 (FIG. 45). Second metal layer 4664 can comprise molybdenum and can be approximately 0.15 μm thick. In some examples, second metal layer 4664 can be deposited by sputtering using a KDF 744.

ITO layer 4665 can be deposited over second metal layer 4664. ITO layer 4665 can comprise indium tin oxide and can be approximately 0.05 μm thick. In some examples, ITO layer can be deposited by sputtering using a KDF 744.

In some examples, second metal layer 4664 is pattern etched. Then ITO layer 4665 can be deposited onto second metal layer 4664 and then pattern etched. As an example, second metal layer 4664 and ITO layer 4665 can be etched using an AMAT 8330.

Figure 47:
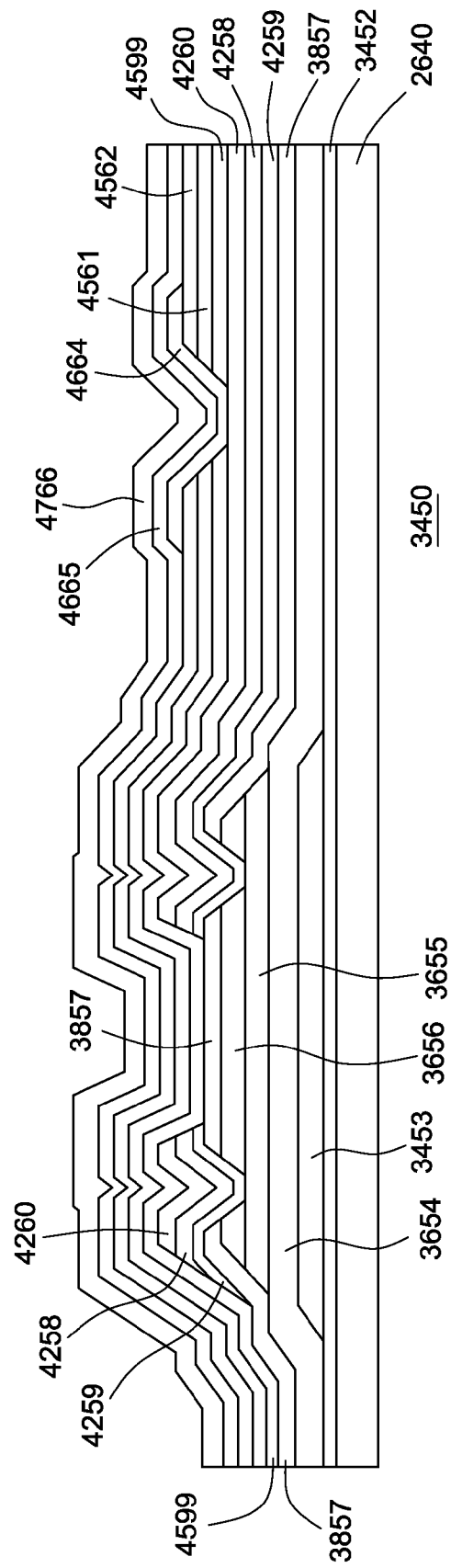
FIG. 47 illustrates a cross-sectional view of an example of the device build area of the semiconductor device of FIG. 13 after providing a silicon nitride layer, according to the embodiment of FIG. 22.

FIG. 47 illustrates a cross-sectional view of the device build area of an example of semiconductor device 2450 after providing a silicon nitride layer 4766. Silicon nitride layer 4766 can be deposited over ITO layer 4665 and can be approximately 0.10 μm thick. In some examples, silicon nitride layer 4766 can be deposited via PECVD using an AMAT P5000. In the same or other examples, silicon nitride layer 4766 can be etched using a Tegal 901, with ITO layer 4665 being the stop layer.

After process 3221, procedure 2220 is complete. With reference to FIG. 22, the next procedure of method 2200 is a procedure 2230 of removing the flexible substrate, including the semiconductor elements coupled to the flexible substrate, from the carrier substrate. In some examples, the flexible substrate can be removed from the carrier substrate by peeling the flexible substrate from the carrier substrate by hand.

Figure 48:
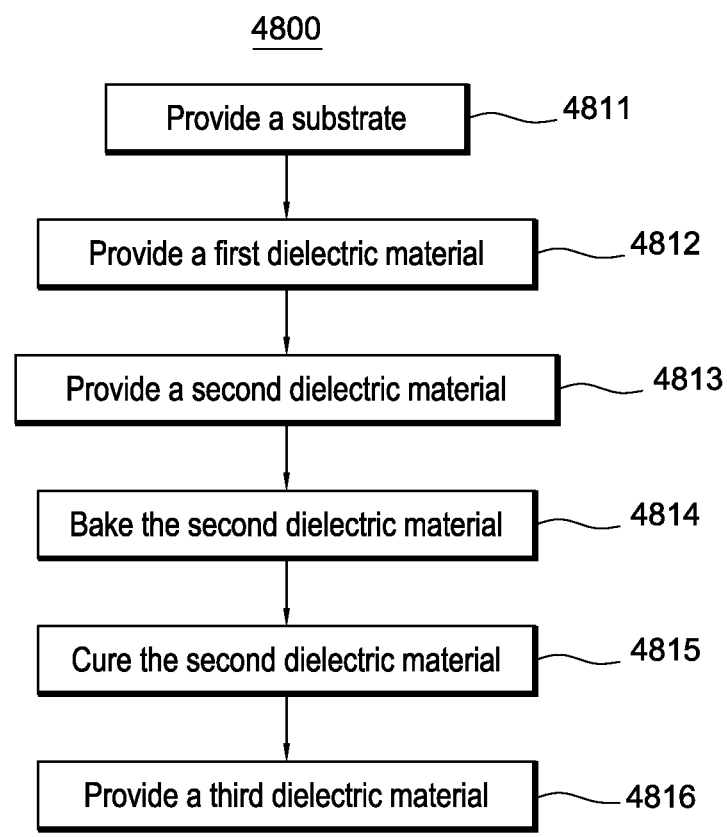
FIG. 48 illustrates an example of a method of planarizing a flexible substrate, according to a further embodiment.

Turning to another embodiment, FIG. 48 illustrates an example of a method 4800 of planarizing a flexible substrate. In the same or different embodiments, method 4800 can be considered a method of etching an organosiloxane dielectric material. Method 4800 can also be considered a method of etching an organic siloxane-based dielectric or a method of etching a siloxane-based dielectric material. Method 4800 is merely exemplary and is not limited to the embodiments presented herein. Method 4800 can be employed in many different embodiments or examples not specifically depicted or described herein.

Referring to FIG. 48, method 4800 includes a procedure 4811 of providing a substrate. Procedure 4811 can be similar or identical to process 2311 of FIG. 23. The substrate can be similar or identical to substrate 2550 of FIG. 25. In yet other embodiments, Procedure 4811 can be similar or identical to method 2210 of FIG. 22, and the substrate can be similar or identical to substrate 2550, which can be a portion of flexible substrate assembly 2640.

Method 4800 can continue with a procedure 4812 of providing a first dielectric material. In some examples, the first dielectric material can be similar or identical to second dielectric material 4562 of FIG. 45 and process 3217 of FIG. 32. For example, second dielectric material 4562 can comprise a silicon nitride layer with a thickness of approximately 0.1 µm to approximately 0.2 µm.

The next procedure in method 4800 is a procedure 4813 of providing a second dielectric material. The second dielectric material can be similar or identical to the first dielectric material 4561 of FIG. 45. Procedure 4813 can be similar or identical to process 3214 of FIG. 32.

Method 4800 continues with a procedure 4814 of baking the second dielectric material. In some examples, procedure 4814 can be similar or identical to process 3215 of FIG. 32.

Subsequently, method 4800 includes a procedure 4815 of curing the second dielectric material. In some examples, procedure 4815 can be similar or identical to process 3216 of FIG. 32.

In other examples, a different baking procedure with five separate bakes in a convection oven can be used. The first bake can be a bake at approximately 40° C. for approximately ten minutes. The ramp-up time from room temperature to approximately 40° C. is approximately two minutes. After baking at 40° C., the temperature is ramped-up over approximately thirty-two minutes to approximately 160° C. Then, the flexible substrate is baked for approximately thirty-five minutes at approximately 160° C.

The temperature of the convection oven is then increased to approximately 180° C. over approximately ten minutes after the 160° C. bake. The flexible substrate is baked for approximately twenty minutes at approximately 180° C.

After baking at 180° C., the temperature is ramped-up over approximately fifty minutes to approximately 230° C. Alternatively, the temperature is ramped-up at approximately 2° C. per minute to approximately 230° C. The flexible substrate is baked for approximately fifteen hours at approximately 230° C. In further embodiments, the temperature can be ramped-up at approximately 2° C. per minute to between approximately 180° C. and approximately 200° C.

Finally, in this bake procedure, the temperature in the oven is ramped-down to approximately 60° C. over approximately eighty-five minutes. The flexible substrate is baked for approximately ten minutes at approximately 60° C. After baking is complete, the flexible substrate is allowed to cool to approximately room temperature before proceeding with method 4800 of FIG. 48.

Method 4800 continues with a procedure 4816 of providing a third dielectric material. In some examples, the third dielectric material can be deposited with a thickness of approximately 0.2 µm to approximately 0.4 µm. In some examples, the third dielectric material can be an approximately 0.3 µm thick layer of silicon nitride. After depositing the third dielectric material, the flexible substrate can be in-situ baked for approximately five minutes at approximately 180° C. In some examples, the third dielectric material can be similar or identical to nitride passivation layer 3452 of FIG. 34.

Figure 49:
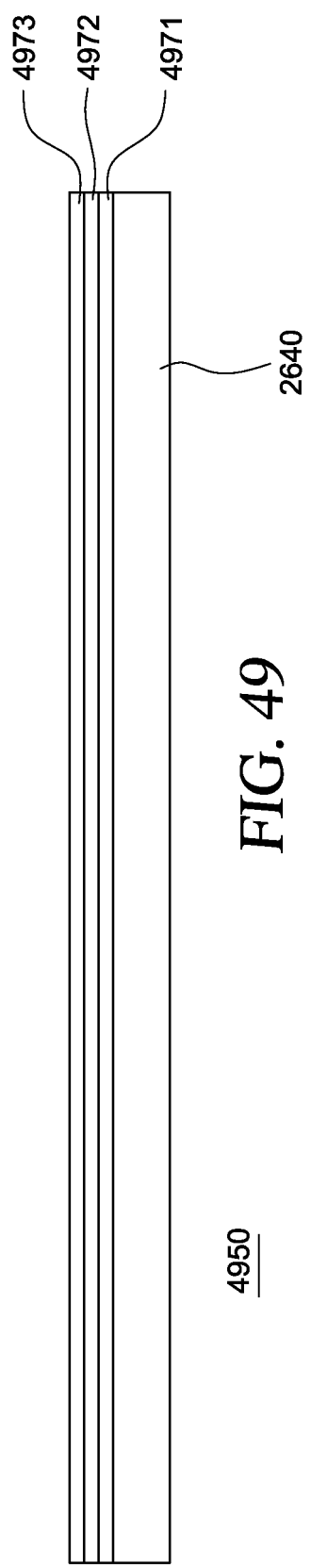
FIG. 49 illustrates a cross-sectional view of an example of a semiconductor device according to the method of FIG. 27, according to the embodiment of FIG. 48.

FIG. 49 illustrates an example of a semiconductor device 4950 after providing the third dielectric material, according to the embodiment of FIG. 48. In these examples, first dielectric material 4971 is provided over flexible substrate assembly 2640. Second dielectric material 4972 is provided over first dielectric material 4971, and third dielectric material 4973 is provided over second dielectric material 4972.

After providing the third dielectric layer, method 4800 is complete. The resulting semiconductor device (4950 of FIG. 49) can be used as the flexible substrate provided in procedure 2210 of method 2200.

Figure 52:
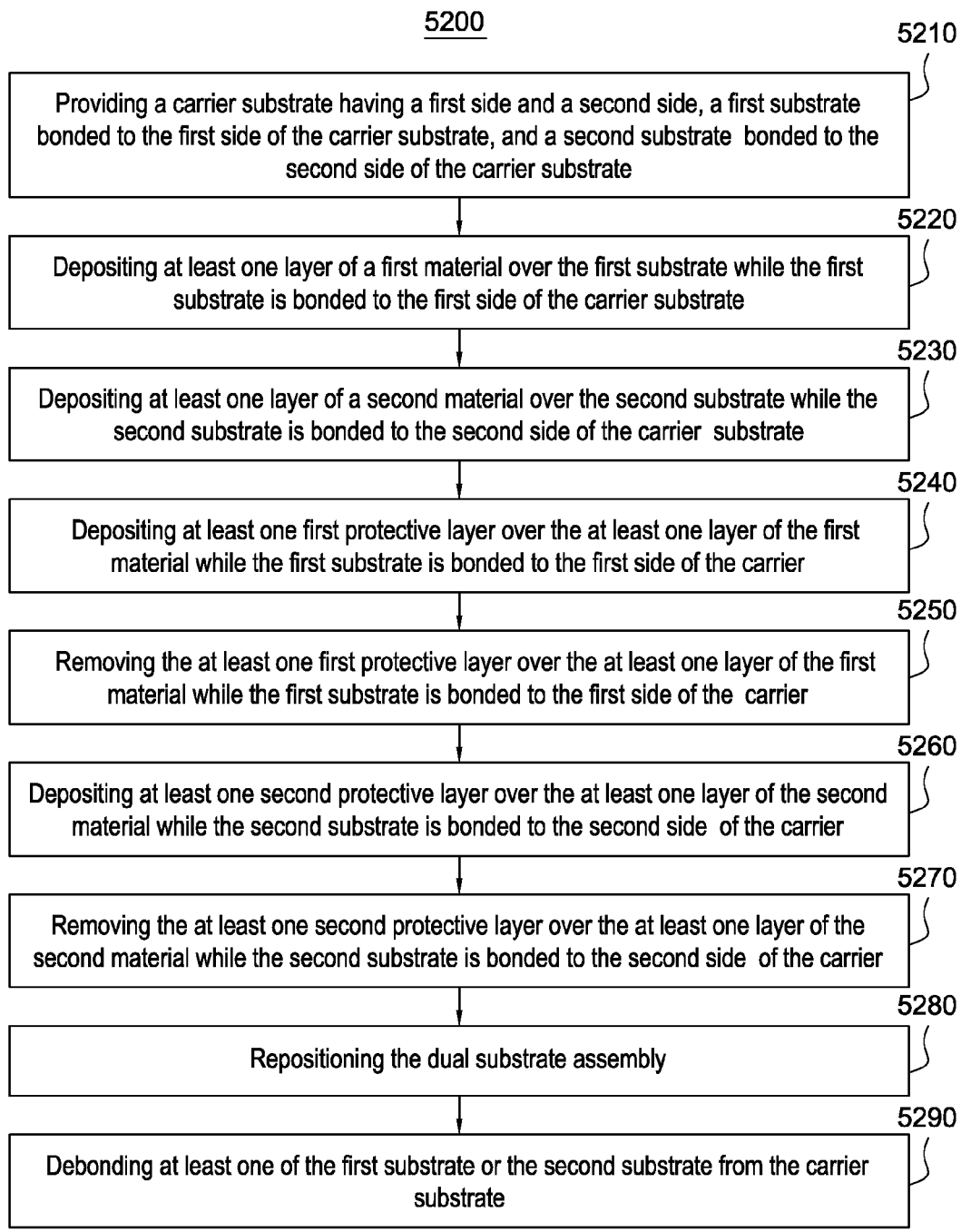
FIG. 52 illustrates a flow chart for an embodiment of a method of manufacturing at least one first electronic device and at least one second electronic device.

Turning to the figures, FIG. 52 illustrates a flow chart for an embodiment of method 5200 of manufacturing at least one first electronic device and at least one second electronic device. Method 5200 is merely exemplary and is not limited to the embodiments presented herein. Method 5200 can be employed in many different embodiments or examples not specifically depicted or described herein. In some embodiments, the activities, the procedures, and/or the processes of method 5200 can be performed in the order presented. In other embodiments, the activities, the procedures, and/or the processes of the method 5200 can be performed in any other suitable order. In still other embodiments, one or more of the activities, the procedures, and/or the processes in method 5200 can be combined or skipped.

Referring to FIG. 52, in many embodiments, method 5200 can comprise procedure 5210 of providing a carrier substrate having a first side and a second side, a first substrate bonded to the first side of the carrier substrate, and a second substrate bonded to the second side of the carrier substrate (referred to herein as the "dual substrate assembly"). In various embodiments, performing procedure 5210 can be similar to performing procedures 110, 115, 120, 125, 130, 135, 140, 145, and 150 of method 100 (FIG. 1). In the same or different embodiments, any of procedures 110, 115, 120, 125, 130, 135, 140, 145, and/or 150 of method 100 (FIG. 1) can be performed in the order presented, can be performed in any suitable order, and/or can be omitted. In various embodiments, one or more of procedures 110, 115, 120, 125, 130, 135, 140, 145, and 150 of method 100 (FIG. 1) can be performed simultaneously with one or more other procedure of procedures 110, 115, 120, 125, 130, 135, 140, 145, and 150 of method 100 (FIG. 1). In many embodiments, the carrier substrate of procedure 5210 can be similar or identical to the carrier substrate of process 210 (FIG. 2), as described above.

Referring back to FIG. 52, in many embodiments, the first substrate and/or the second substrate of method 5200 can comprise a flexible substrate. In some embodiments, the first substrate can comprise a first flexible substrate. In the same or different embodiments, the second substrate can comprise a second flexible substrate. In many embodiments, the first substrate and/or the second substrate of method 5200 can be similar or identical to the first flexible substrate of procedure 115, as described above.

In the same or different embodiments, the first flexible substrate and/or the second flexible substrate can comprise a material. The material can comprise a thermoplastic polymer, and the thermoplastic polymer can comprise at least one of polyethylene naphthalate, polyethylene terephthalate, polyethersulfone, polyimide, polycarbonate, cyclic olefin copolymer, or liquid crystal polymer. In many embodiments, the first flexible substrate and/or the second flexible substrate can comprise same or different thermoplastic polymer(s).

Referring back to FIG. 52, in other embodiments, the first substrate can comprise the flexible substrate and the second substrate can comprise a rigid substrate, or vice versa. In the same or different embodiments, the rigid substrate can comprise at least one of a variety of rigid semiconductor-related materials.

Referring back to FIG. 52, the first substrate and/or second substrate can be bonded by an adhesive to the carrier substrate as part of procedure 5210. In the same or different embodiments, the adhesive can comprise Henkel NS122 and/or a pressure sensitive adhesive. In many embodiments, the adhesive can be similar to the adhesive of process 220 (FIG. 2), as described above.

Referring back to FIG. 52, in many embodiments, method 5200 can continue with procedure 5220 of depositing at least one layer of a first material over the first substrate while the first substrate is bonded to the first side of the carrier substrate. In various embodiments, procedure 5220 can comprise performing procedure 2220 (FIG. 22), as described above, for the first substrate. In other embodiments, procedure 5220 can comprise depositing at least one layer over the first substrate in accordance with any of a variety of semiconductor-related materials.

Figure 55:
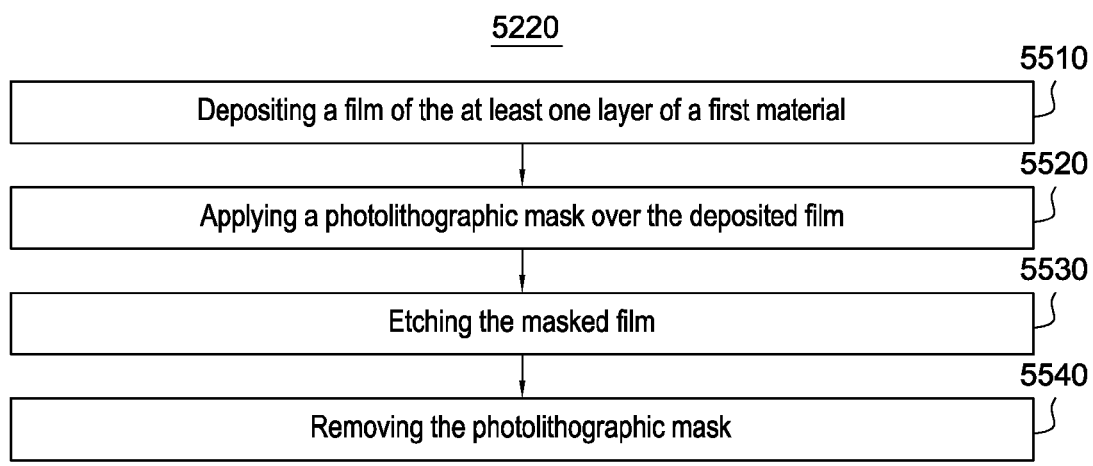
FIG. 55 illustrates a flow chart of a procedure of depositing at least one layer of a first material over a first substrate while the first substrate is bonded to a first side of a carrier substrate, according to one embodiment.

In various embodiments, procedure 5220 can include various processes, as illustrated in FIG. 55. Turning to FIG. 55, in some embodiments, procedure 5220 can comprise process 5510 of depositing a film of the at least one layer of a first material. In the same or different embodiments, procedure 5220 can continue with process 5520 of applying a photolithographic mask over the deposited film. In the same or different embodiments, procedure 5220 can continue with process 5530 of etching the masked film. Then, procedure 5220 can proceed with process 5540 of removing the photolithographic mask. In many embodiments, procedure 5220 can comprise performing one or more of the processes of procedure 5220 one or more times.

Referring back to FIG. 52, in many embodiments, method 5200 can comprise procedure 5230 of depositing at least one layer of a second material over the second substrate while the second substrate is bonded to the second side of the carrier substrate. In various embodiments, procedure 5230 can comprise performing procedure 2220 (FIG. 22), as described above, for the second substrate. In other embodiments, procedure 5230 can comprise depositing at least one layer over the second substrate in accordance with any of a variety of semiconductor-related materials. In many embodiments, procedure 5230 can comprise processes similar or identical to procedure 5220, as described above. In many embodiments, procedure 5230 can comprise performing one or more of the processes of procedure 5230 one or more times.

In many embodiments, procedure 5220 and procedure 5230 can be similar to or different from each other. In the same or different embodiments, the photolithographic mask of procedure 5220 can be different from the photolithographic mask of procedure 5230. In many embodiments, procedure 5280, as described below, can be performed between performing procedure 5220 and procedure 5230. In many embodiments, procedure 5220 and procedure 5230 can be considered dual but independent processes.

Referring back to FIG. 52, in many embodiments, method 5200 can comprise procedure 5240 of depositing at least one first protective layer over the at least one layer of the first material while the first substrate is bonded to the first side of the carrier. The at least one protective layer can protect the partially or completely formed electric devices at the first substrate while all or a part of the electronic devices at the second substrate are being formed. In various embodiments, procedure 5240 can be performed using one or more of spin-coating, spray-coating, extrusion-coating, preform laminating, slot die coating, screen laminating, and/or screen printing. In some embodiments, the at least one first protective layer can be configured to be removable and/or can comprise a photoresist film. In many embodiments, the photoresist film can be fairly thick (e.g., approximately 1 to approximately 20 micrometers) and/or can be easily removed.

In some embodiments, the at least one first protective layer can comprise tape having an adhesive. In the same or different embodiments, the adhesive can have a low tack. For example, in some embodiments, the first protective layer can comprise blue low tack tape (e.g. from Semiconductor Equipment Corporation, part number 18133-7.50). In other embodiments, the at least one first protective layer can comprise a mylar sheet having an adhesive and/or can comprise a material deposited via chemical vapor deposition.

Referring back to FIG. 52, in the same or different embodiments, method 5200 can comprise procedure 5250 of removing the at least one first protective layer over the at least one layer of the first material while the first substrate is bonded to the first side of the carrier. In many embodiments, the at least one first protective layer can be removed mechanically and/or using at least a wet chemistry, an ashing process, or with a dry etchant.

Referring back to FIG. 52, in the same or different embodiments, method 5200 can comprise procedure 5260 of depositing at least one second protective layer over the at least one layer of the second material while the second substrate is bonded to the second side of the carrier. In many embodiments, procedure 5260 can be similar or identical to procedure 5240, as described above. In the same or different embodiments, the at least one second protective layer can be similar or identical to the at least one first protective layer. The at least one second protective layer can protect the partially or fully formed electronic devices at the second substrate while all or part of the electronic devices at the first substrate are being formed.

Referring back to FIG. 52, in the same or different embodiments, method 5200 can comprise procedure 5270 of removing the at least one second protective layer over the at least one layer of the second material while the second substrate is bonded to the second side of the carrier. In many embodiments, procedure 5270 can be similar or identical to procedure 5250, as described above.

Referring back to FIG. 52, in many embodiments, the first electronic device at the first side of the carrier substrate and at the first substrate, and the second electronic device at the second side of the carrier substrate and at the second substrate can comprise the same type(s) of electronic device(s) and/or the exact same electronic device(s). In some embodiments, the type of electronic device can comprise at least one integrated circuit, flexible display, and the like. In other embodiments, the first electronic device and the second electronic device can comprise one or more different types of electronic devices.

In many embodiments, where there are multiple first electronic devices and/or second electronic devices, at least one of the first electronic devices can comprise the same type of electronic device as at least one of the second electronic devices, or vice versa. In other embodiments, where there are multiple first electronic devices and/or second electronic devices, each of the electronic devices can comprise different types of electronic devices. In other embodiments, where there are multiple first electronic devices and/or second devices, each of the electronic devices can be the same type of electronic devices.

Referring back to FIG. 52, in some embodiments, procedure 5220 can comprise: depositing a first gate metal layer over the first substrate while the first substrate is bonded to the first side of the carrier substrate; depositing a first silicon comprising layer over the first gate metal layer while the first substrate is bonded to the first side of the carrier substrate; depositing a first contact element over the first silicon comprising layer while the first substrate is bonded to the first side of the carrier substrate, wherein the first contact element comprises a first diffusion barrier; depositing a first dielectric material over the first contact element while the first substrate is bonded to the first side of the carrier substrate, wherein the first dielectric material comprises an organic siloxane-based dielectric material; depositing a second dielectric material over the first dielectric material while the first substrate is bonded to the first side of the carrier substrate, wherein the second dielectric material comprises silicon nitride; and baking the second dielectric material, the first dielectric material, the contact element, the first silicon comprising layer, the gate metal layer, the first substrate, and the carrier substrate while the first substrate is bonded to the first side of the carrier substrate.

Referring back to FIG. 52, in the same or different embodiments, procedure 5230 can comprise: depositing a second gate metal layer over the second substrate while the second substrate is bonded to the second side of the carrier substrate; depositing a second silicon comprising layer over the second gate metal layer while the second substrate is bonded to the second side of the carrier substrate; depositing a second contact element over the second silicon comprising layer while the second substrate is bonded to the second side of the carrier substrate, wherein the second contact element comprises a second diffusion barrier; depositing a third dielectric material over the second contact element while the second substrate is bonded to the second side of the carrier substrate, wherein the third dielectric material comprises an organic siloxane-based dielectric material; depositing a fourth dielectric material over the third dielectric material while the second substrate is bonded to the second side of the carrier substrate, wherein the fourth dielectric material comprises silicon nitride; and baking the fourth dielectric material, the third dielectric material, the contact element, the second silicon comprising layer, the gate metal layer, the second substrate, and the carrier substrate while the second substrate is bonded to the second side of the carrier substrate.

Referring back to FIG. 52, in the same or different embodiments, procedure 5220 can further comprise providing a base dielectric material before providing the first dielectric material. The base dielectric material can comprise silicon oxide. In the same or different embodiments, procedure 5230 can further comprise providing a base dielectric material before providing the third dielectric material. The base dielectric material can comprise silicon oxide.

Referring back to FIG. 52, in many embodiments, at least a portion of procedure 5230 is performed before completing procedure 5220, or vice versa. In these two embodiments, at least a portion of the electronic devices at opposite sides of the carrier substrate can be formed sequentially with each other in an alternating manner. In the same or different embodiments, at least a portion of procedure 5220 is performed concurrently with at least a portion of procedure 5230. In this embodiment, at least a portion of the electronic devices at opposite sides of the carrier substrate can be formed simultaneously with each other.

In many embodiments, where performing at least a portion of procedure 5230 before completing procedure 5220, procedure 5280, as described below, can be performed at least once. In the same or different embodiments, where performing at least a portion of procedure 5220 before completing procedure 5230, procedure 5280, as described below, can be performed at least once. In the same or different embodiments, where performing at least a portion of procedure 5220 concurrently with at least a portion of procedure 5230, procedure 5280, as described below, can be performed at least once.

In many embodiments, procedure 5220 and/or procedure 5230 can be performed while processing the dual substrate assembly coupled to a chuck and/or on pins. In many embodiments, the chuck and/or pins can be designed so as not to contact active areas of devices of the dual substrate assembly. In further embodiments, the chucks and/or pins can comprise a type of alumina. In the same or different embodiments, the chucks and/or pins can be coated with at least one protective film. In the same or different embodiments, coating the chucks and/or pins with at least one protective film can be helpful where processing incorporates at least one of plasma-enhanced chemical vapor deposition or reactive-ion etching. In the same or different embodiments, the protect film can comprise aluminum oxide. In many embodiments, the chuck can be a mechanical chuck. In the same or different embodiments, the chuck can be an electrostatic chuck. In other embodiments, the chuck can be a vacuum chuck.

In the same or different embodiments, at least the first protective layer of procedure 5240 and/or the second protective layer of procedure 5260 can provide a barrier between the contact points of the chuck and/or pins. Here, the processes of procedure 5220 and 5230 are interleaved with each other, and procedure 5240 can be performed one or more times in between the various processes of procedure 5220 to protect the partially or fully formed electronic devices at the first substrate, for which one or more processes of procedure 5240 are performed, and procedure 5250 is performed after the one or more processes of procedure 5240 are performed and before additional process(es) of procedure 5220 are performed. Similarly, as the processes of procedures 5220 and 5230 are interleaved with each other, procedure 5260 can be performed one or more times in between the various processes of procedure 5230 to protect the electronic devices at the second substrate while one or more processes of procedure 5220 are performed, and procedure 5270 is performed after the one or more processes of procedure 5220 are performed and before additional process(es) of procedure 5230 are performed.

In other embodiments, procedure 5220 and/or procedure 5230 can be performed while processing the dual substrate assembly on edge. In these embodiments, at least a portion of procedure 5220 and at least a portion of procedure 5230 can be performed simultaneously.

In other embodiments, procedure 5220 and/or procedure 5230 can be performed while processing the dual substrate assembly on air tracks. In some embodiments, the air tracks can comprise Metapor® CE 100 white air cushions. In these embodiments, procedures 5240, 5250, 5260, and 5270 can be omitted from method 5200.

Referring back to FIG. 52, in many embodiments, method 5200 can comprise a procedure 5280 of repositioning the dual substrate assembly. In many embodiments of method 5200, procedure 5280 can be performed at least once.

In some embodiments, procedure 5280 can comprise rotating the dual substrate assembly about the x-axis or the y-axis of the dual substrate assembly (i.e., either of the axes of the plane, which is parallel to the top and bottom sides, or major surfaces of the dual substrate assembly). In some embodiments, the dual substrate assembly can be rotated 180 degrees about the x-axis and/or y-axis of the dual substrate assembly. In other embodiments, the dual substrate assembly can be rotated at other orientations about the x-axis and/or y-axis of the dual substrate assembly.

In further embodiments, procedure 5280 can comprise rotating the dual substrate assembly about the z-axis of the dual substrate assembly (i.e. the axis perpendicular to the top and bottom sides, or major surfaces of the dual substrate assembly). In many embodiments, the dual substrate assembly can be rotated any amount about the z-axis between ±360 degrees. In still other embodiments, procedure 5280 can comprise rotating the dual substrate assembly in some combination of rotations about at least the x-axis, the y-axis, or the z-axis, as described above.

Referring back to FIG. 52, in many embodiments, method 5200 can comprise a procedure 5290 of debonding at least one of the first substrate and/or the second substrate from the carrier substrate. In some embodiments, procedure 5290 can be similar or identical to procedure 160 of method 100 (FIG. 1)

Figure 53:
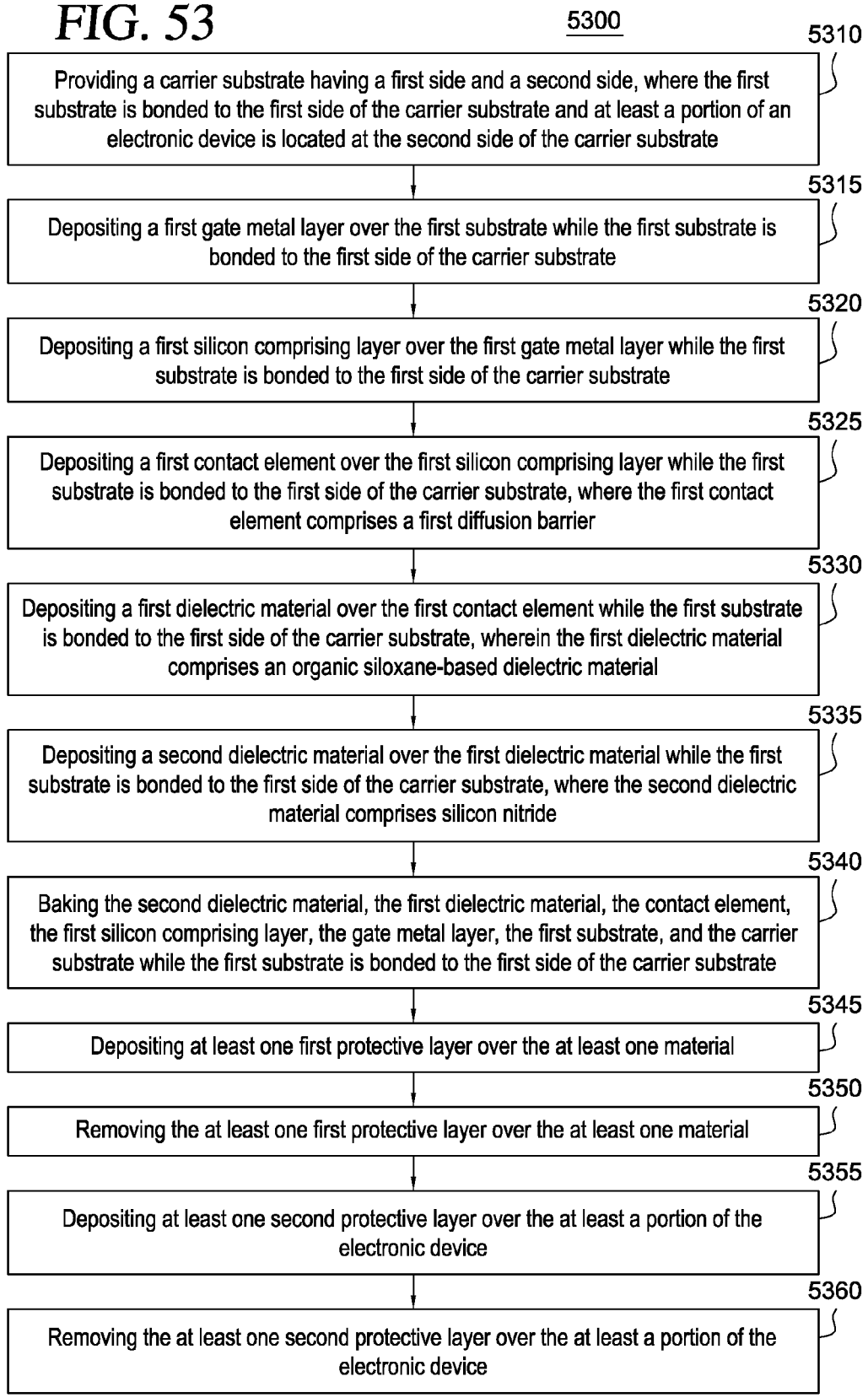
FIG. 53 illustrates a flow chart for an embodiment of a method of depositing at least one material over a first substrate.

Referring now back to the figures, FIG. 53 illustrates a flow chart for an embodiment of method 5300 of depositing at least one material over a first substrate. Method 5300 is merely exemplary and is not limited to the embodiments presented herein. Method 5300 can be employed in many different embodiments or examples not specifically depicted or described herein. In some embodiments, the activities, the procedures, and/or the processes of method 5300 can be performed in the order presented. In other embodiments, the activities, the procedures, and/or the processes of the method 5300 can be performed in any other suitable order. In still other embodiments, one or more of the activities, the procedures, and/or the processes in method 5300 can be combined or skipped.

Referring to FIG. 53, in many embodiments, method 5300 can comprise procedure 5310 of providing a carrier substrate having a first side and a second side, where the first substrate is bonded to the first side of the carrier substrate and at least a portion of an electronic device is located at the second side of the carrier substrate.

In some embodiments, the first substrate can be bonded to the first side of the carrier substrate by an adhesive. In the same or different embodiments, the adhesive can be similar to the adhesive of process 220 (FIG. 2).

In many embodiments, at least a portion of at least one electronic device can be formed and located at the second side of the carrier substrate. In other embodiments, at least a portion of at least a first electronic device and all of at least a second electronic device can be formed and located at the second side of the carrier substrate. In many embodiments, the electronic device(s) can be similar or identical to the electronic devices described above with respect to method 5200 (FIG. 52).

Referring back to FIG. 53, in many embodiments, method 5300 can comprise procedure 5315 of depositing a first gate metal layer over the first substrate while the first substrate is bonded to the first side of the carrier substrate. In some embodiments, procedure 5315 can be similar to activity 3311 (FIG. 33).

Referring back to FIG. 53, in many embodiments, method 5300 can comprise procedure 5320 of depositing a first silicon comprising layer over the first gate metal layer while the first substrate is bonded to the first side of the carrier substrate. In some embodiments, procedure 5320 can be similar or identical to activity 3212 (FIG. 32), as described above. In further embodiments, procedure 5320 can further comprise performing activity 3313 (FIG. 33) and activity 3314 (FIG. 33), as described above.

Referring back to FIG. 53, in many embodiments, method 5300 can comprise a procedure 5325 of depositing a first contact element over the first silicon comprising layer while the first substrate is bonded to the first side of the carrier substrate, where the first contact element comprises a first diffusion barrier. In some embodiments, procedure 5325 can be similar or identical to process 3213 (FIG. 32).

Referring back to FIG. 53, in many embodiments, method 5300 can comprise procedure 5330 of depositing a first dielectric material over the first contact element while the first substrate is bonded to the first side of the carrier substrate, wherein the first dielectric material comprises an organic siloxane-based dielectric material. In some embodiments, performing procedure 5330 can be similar or identical to performing processes 3214, 3215, and 3216 (FIG. 32).

Referring back to FIG. 53, in many embodiments, method 5300 can comprise procedure 5335 of depositing a second dielectric material over the first dielectric material while the first substrate is bonded to the first side of the carrier substrate, where the second dielectric material comprises silicon nitride. In some embodiments, performing procedure 5335 can be similar or identical to performing processes 3217 and 3218 (FIG. 32).

Referring back to FIG. 53, in many embodiments, method 5300 can comprise procedure 5340 of baking the second dielectric material, the first dielectric material, the contact element, the first silicon comprising layer, the gate metal layer, the first substrate, and the carrier substrate while the first substrate is bonded to the first side of the carrier substrate. In some embodiments, procedure 5340 can be similar or identical to procedure 4814 (FIG. 48).

In many embodiments, the first substrate of procedure 5310 in method 5300 comprises a first flexible substrate. In some embodiments, the first flexible substrate of method 5300 can be similar to the first flexible substrate of method 5200 (FIG. 52), as described above.

Referring back to FIG. 53, in many embodiments, the electronic device of procedure 5310 in method 5300 can comprise a second substrate. In the same or different embodiments, the second substrate can comprise a second flexible substrate. In many embodiments, the second flexible substrate of method 5300 can be similar or identical to the second flexible substrate of method 5200 (FIG. 52).

In the same or different embodiments of method 5300 in FIG. 53, the electronic device further can comprise a second gate layer over the second flexible substrate. In other embodiments, the electronic device further can comprise a second silicon comprising layer over a second gate layer over the second flexible substrate. In other embodiments, the electronic device further can comprise a second contact element over a second silicon comprising layer over a second gate layer over the second flexible substrate, where the second contact element comprises a second diffusion barrier. In other embodiments, the electronic device further can comprise a third dielectric material over a second contact element over a second silicon comprising layer over a second gate layer over the second flexible substrate, where the second contact element comprises a second diffusion barrier and the third dielectric material comprises an organic siloxane-based dielectric material. In other embodiments, the electronic device further can comprise a fourth dielectric material over a third dielectric material over a second contact element over a second silicon comprising layer over a second gate layer over the second flexible substrate, where the second contact element comprises a second diffusion barrier, the third dielectric material comprises an organic siloxane-based dielectric material, and the fourth dielectric material comprises silicon nitride.

In many embodiments, the first flexible substrate can comprise a material. In the same or different embodiments, the second flexible substrate can comprise the same material. In the same or different embodiments, the material can comprise one or more of polyethylene naphthalate, polyethylene terephthalate, polyethersulfone, polyimide, polycarbonate, cyclic olefin copolymer, and/or liquid crystal polymer.

In other embodiments, the second substrate can comprise a rigid substrate. In many embodiments, the rigid substrate can comprise one or more of alumina, silicon, steel, sapphire, borosilicate, soda lime silicate, alkali silicate, and/or a polymer.

In many embodiments, the portion of the electronic device comprises a second portion of a second electronic device, and the first material comprises at least a portion of a first electronic device. In the same or different embodiments, the first electronic device and the second electronic device can comprise the same type of electronic device. In other embodiments, the first electronic device can comprise a different type of electronic device than the second electronic device. In many embodiments, the type of electronic device can comprise at least one of the types of electronic devices provided for above in method 5200.

Referring back to FIG. 53, in many embodiments, method 5300 can comprise procedure 5345 of depositing at least one first protective layer over the at least one material. In some embodiments, procedure 5345 can be similar or identical to procedure 5240 (FIG. 52), as described above. In the same or different embodiments, the at least one first protective layer of procedure 5345 can be similar or identical to the at least one first protective layer of procedure 5240 (FIG. 52).

Referring back to FIG. 53, in many embodiments, method 5300 can comprise procedure 5350 of removing the at least one first protective layer over the at least one material. In some embodiments, procedure 5350 can be similar or identical to procedure 5250 (FIG. 52). Procedure 5345 and 5350 can be optional for method 5300, and/or these two procedures can be performed between each of procedures 5315, 5320, 5325, 5330, 5335, and 5340 if processing at the second side of the carrier substrate needs to be performed after each of procedures 5315, 5320, 5325, 5330, 5335, and 5340 and before the next listed procedure.

Referring back to FIG. 53, in many embodiments, method 5300 can comprise procedure 5355 of depositing at least one second protective layer over the at least a portion of the electronic device. In some embodiments, procedure 5355 can be similar or identical to procedure 5260 (FIG. 52), as described above, but performed for the at least a portion of the electronic device instead of a second substrate.

Referring back to FIG. 53, in many embodiments, method 5300 can comprise procedure 5360 of removing the at least one second protective layer over the at least a portion of the electronic device. In some embodiments, procedure 5360 can be similar to procedure 5270 (FIG. 52), as described above. In another embodiment, procedures 5355 and 5360 are performed between procedures 5310 and 5315 to protect the electronic devices at the second side of the carrier substrate while processing the first substrate at the first side of the carrier substrate during procedures 5315, 5320, 5325, 5330, and 5340.

Figure 54:
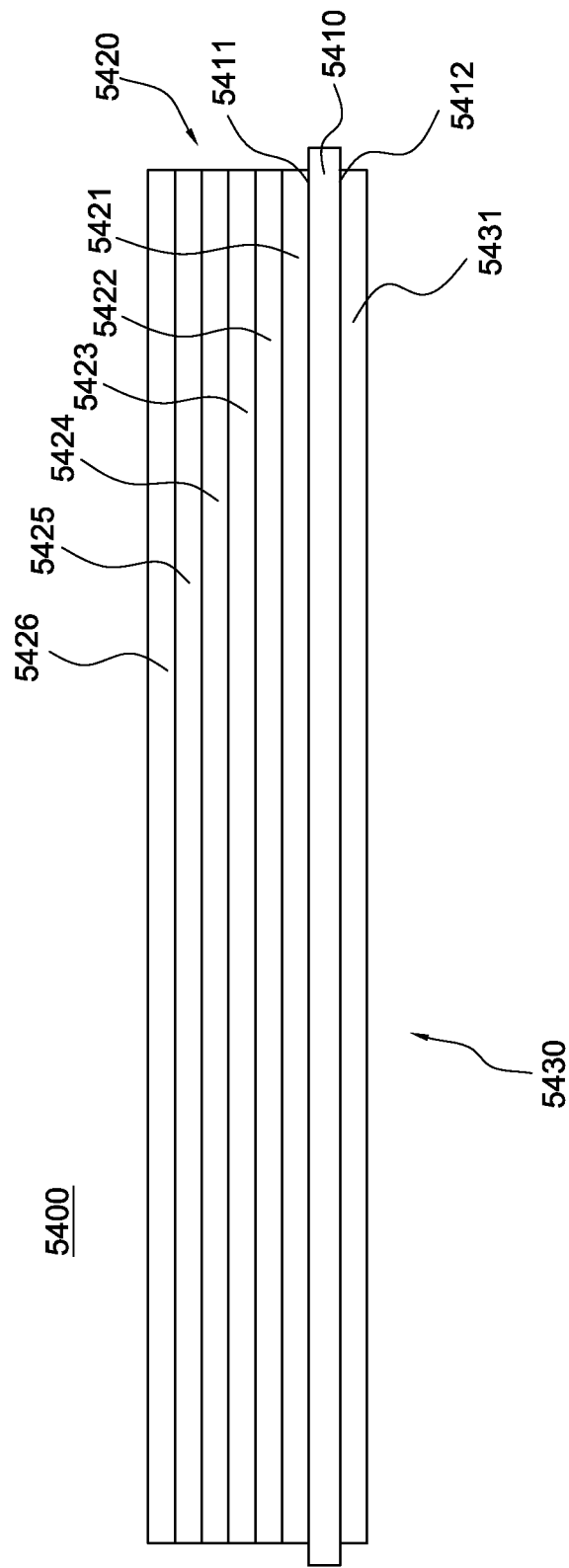
FIG. 54 illustrates a cross-sectional view of an embodiment of an electrical device structure.

Referring back to the figures, FIG. 54 illustrates a cross-sectional view of an example electrical device structure 5400, according to the embodiment of FIG. 52. Structure 5400 can be similar to the composite substrates described earlier with respect to FIG. 52 and FIG. 53. For example, in many embodiments, structure 5400 can comprise carrier substrate 5410 having first side 5411 and second side 5412. In some embodiments, structure 5400 can further comprise first electronic device 5420 located at first side 5411 of carrier substrate 5410. In further embodiments, first electronic device 5420 can comprise first flexible substrate 5421 located at first side 5411 of carrier substrate 5410. In still further embodiments, first electronic device 5420 can comprise first metal gate layer 5422 over first flexible substrate 5421. In various embodiments, first electronic device 5420 can comprise first amorphous silicon layer 5423 over first metal gate layer 5422. In many embodiments, first electronic device 5420 can comprise first N+ amorphous silicon layer 5424 over first amorphous silicon layer 5423. In some embodiments, first electronic device 5420 can comprise first diffusion barrier 5425. In the same or different embodiments, first electronic device 5420 can comprise first metal layer 5426. In the same or different embodiments, first diffusion barrier 5425 can be positioned between first metal layer 5426 and first N+ amorphous silicon layer 5424. In many embodiments, structure 5400 can comprise second electronic device 5430 located at second side 5412 of carrier substrate 5410. Layers 5422, 5423, 5424, 5425, and 5426 of structure 5400 are simplified representations of such layers, which in an actual structure would be patterned, etc.

Referring to FIG. 54, in some embodiments, the carrier substrate can comprise at least one of alumina, silicon, steel, sapphire, barium borosilicate, soda lime silicate, or alkali silicate. In many embodiments, second electronic device 5430 of structure 5400 can comprise second substrate 5431. In some embodiments, first flexible substrate 5421 and/or second substrate 5431 can be similar or identical to the first flexible substrate and/or second substrate of method 5200 (FIG. 52), as described above.

Referring back to FIG. 54, in many embodiments, first flexible substrate 5421 and/or second substrate 5431 can be bonded to carrier substrate 5410. In some embodiments, first flexible substrate 5421 and/or the second substrate 5431 can be bonded to carrier substrate 5410 by an adhesive. In many embodiments, the adhesive can be similar or identical to the adhesive of method 5200, as described above.

Referring back to FIG. 54, in many embodiments, first electronic device 5420 at side 5411 and second electronic device 5430 at side 5412 can each comprise the same type(s) of electronic device(s) and/or the exact same electronic device(s). In other embodiments, first electronic device 5420 can comprise a different type of electronic device than second electronic device 5430.

Figure 56:
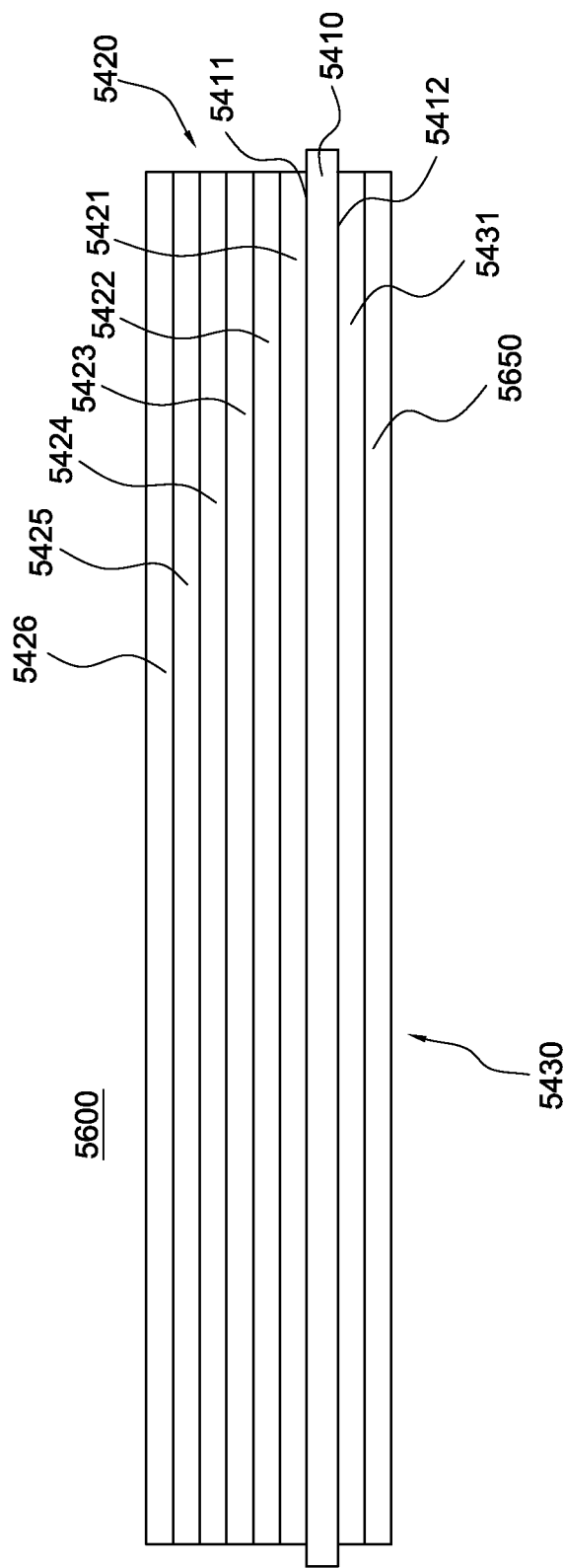
FIG. 56 illustrates a cross-sectional view of an embodiment of an electrical device structure.

Referring back to the figures, FIG. 56 illustrates a cross-sectional view of an example electrical device structure 5600, according to another embodiment. In many embodiments, electrical device structure 5600 can be similar or identical to electrical device structure 5400 (FIG. 54). In the same or different embodiments, structure 5600 can further comprise a protective layer 5650 over at least a portion of second electronic device 5430. In many embodiments, protective layer 5650 can be configured to be removable.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that activities 310, 320, and 330 of FIG. 3, activities 2430, 2431, 2432, 2433, 2434, 2435, 2436, and 2437 of FIG. 24, activities 2830, 2831, 2832, 2833, 2834, 2835, and 2836 of FIG. 28, activities 3311, 3312, 3313, and 3314 of FIG. 33, activities 4430, 4431, 4432, 4433, and 4434 of FIG. 44, processes 210, 220, and 230 of FIG. 2, processes 410, 420, and 430 of FIG. 4, processes 510, 520, 530, and 550 of FIG. 5, processes 610, 620, and 630 of FIG.

6, processes 710, 720, 730, and 750 of FIG. 7, processes 2311, 2312, 2313, 2314, 2315, 2316, 2317, and 2318 of FIG. 23, processes 3212, 3213, 3298, 3214, 3215, 3216, 3217, 3218, 3219, 3220, and 3221 of FIG. 32, procedures 110, 115, 120, 125, 130, 135, 140, 145, 149, 150, 155, and 160 of FIG. 1, procedures 2210, 2220, and 2230 of FIG. 22, and procedures 4811, 4812, 4813, 4814, 4815, and 4816 of FIG. 48 may be comprised of many different activities, procedures and processes, and can be performed by many different modules, in many different orders, that any element of FIGS. 1-56 may be modified, and that the foregoing discussion of certain of these embodiments does not necessarily represent a complete description of all possible embodiments.

All elements claimed in any particular claim are essential to the embodiment claimed in that particular claim. Consequently, replacement of one or more claimed elements constitutes reconstruction and not repair. Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims, unless such benefits, advantages, solutions, or elements are expressly stated in such claim.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A method of manufacturing, the method comprising:
providing a carrier substrate having a first side and a second side;
bonding a first flexible substrate to the first side of the carrier substrate;
bonding a second flexible substrate to the second side of the carrier substrate;
depositing at least one layer of a first material over the first flexible substrate while the first flexible substrate is bonded to the first side of the carrier substrate to create a portion of at least one first electronic device; and
depositing at least one layer of a second material over the second flexible substrate while the second flexible substrate is bonded to the second side of the carrier substrate to create a portion of at least one second electronic device;
wherein:
bonding the second flexible substrate to the second side of the carrier substrate comprises compensating for a deforming force acting on the carrier substrate by the first flexible substrate resulting from the bonding the first flexible substrate to the first side of the carrier substrate.

2. The method of claim 1, wherein:
the first flexible substrate comprises a material; and
the second flexible substrate comprises the material.

3. The method of claim 2, wherein:
the material comprises a thermoplastic polymer; and
the thermoplastic polymer comprises at least one of polyethylene naphthalate, polyethylene terephthalate, polyethersulfone, polyimide, polycarbonate, cyclic olefin copolymer, or liquid crystal polymer.

4. The method of claim 1 further comprising:
depositing at least one first protective layer over the at least one layer of the first material while the first flexible substrate is bonded to the first side of the carrier substrate and before depositing at least a portion of the at least one layer of the second material.

5. The method of claim 4, further comprising:
depositing at least one second protective layer over the at least one layer of the second material while the second flexible substrate is bonded to the second side of the carrier substrate.

6. The method of claim 1 wherein:
the first electronic device and the second electronic device comprise a same type of electronic device.

7. The method of claim 1, wherein at least one of:
(a) depositing the at least one layer of the first material over the first flexible substrate comprises:
depositing a first gate metal layer over the first flexible substrate while the first flexible substrate is bonded to the first side of the carrier substrate;
depositing a first silicon comprising layer over the first gate metal layer while the first flexible substrate is bonded to the first side of the carrier substrate;
depositing a first contact element over the first silicon comprising layer while the first flexible substrate is bonded to the first side of the carrier substrate, wherein the first contact element comprises a first diffusion barrier;
depositing a first dielectric material over the first contact element while the first flexible substrate is bonded to the first side of the carrier substrate, wherein the first dielectric material comprises an organic siloxane-based dielectric material;
depositing a second dielectric material over the first dielectric material while the first flexible substrate is bonded to the first side of the carrier substrate, wherein the second dielectric material comprises a silicon nitride material; and
baking the second dielectric material, the first dielectric material, the first contact element, the first silicon comprising layer, the first gate metal layer, the first flexible substrate, and the carrier substrate while the first flexible substrate is bonded to the first side of the carrier substrate;
(b) depositing the at least one layer of the second material over the second flexible substrate comprises:
depositing a second gate metal layer over the second flexible substrate while the second flexible substrate is bonded to the second side of the carrier substrate;
depositing a second silicon comprising layer over the second gate metal layer while the second flexible substrate is bonded to the second side of the carrier substrate;
depositing a second contact element over the second silicon comprising layer while the second flexible substrate is bonded to the second side of the carrier substrate, wherein the second contact element comprises a second diffusion barrier;
depositing a third dielectric material over the second contact element while the second flexible substrate is bonded to the second side of the carrier substrate, wherein the third dielectric material comprises the organic siloxane-based dielectric material;
depositing a fourth dielectric material over the third dielectric material while the second flexible substrate is bonded to the second side of the carrier substrate, wherein the fourth dielectric material comprises the silicon nitride material; and baking the fourth dielectric material, the third dielectric material, the second contact element, the second silicon comprising layer, the second gate metal layer, the second flexible substrate, and the carrier substrate while the second flexible substrate is bonded to the second side of the carrier substrate;
(c) depositing the at least one layer of the first material over the first flexible substrate further comprises depositing a first base dielectric material, wherein the first base dielectric material comprises a silicon oxide material; or
(d) depositing the at least one layer of the second material over the second flexible substrate further comprises depositing a second base dielectric material, wherein the second base dielectric material comprises the silicon oxide material.

8. The method of claim 1, wherein at least one of:
(a) at least a portion of depositing the at least one layer of the second material over the second flexible substrate is performed before completely depositing each of the at least one layer of the first material over the first flexible substrate; or
(b) at least a portion of depositing the at least one layer of the first material over the first flexible substrate is performed before completely depositing each of the at least one layer of the second material over the second flexible substrate.

9. The method of claim 1, wherein:
at least a portion of depositing the at least one layer of the first material over the first flexible substrate is performed concurrently with at least a portion of depositing the at least one layer of the second material over the second flexible substrate.

10. The method of claim 1, further comprising:
debonding at least one of the first flexible substrate or the second flexible substrate from the carrier substrate.

11. A method comprising:
providing a carrier substrate having a first side and a second side;
bonding a first flexible substrate to the first side of the carrier substrate, at least a portion of an electronic device being located at the second side of the carrier substrate;
depositing a first gate metal layer over the first flexible substrate while the first flexible substrate is bonded to the first side of the carrier substrate;
depositing a first silicon comprising layer over the first gate metal layer while the first flexible substrate is bonded to the first side of the carrier substrate;
forming a first contact element over the first silicon comprising layer while the first flexible substrate is bonded to the first side of the carrier substrate, wherein the first contact element comprises a first diffusion barrier;
depositing a first dielectric material over the first contact element while the first flexible substrate is bonded to the first side of the carrier substrate, wherein the first dielectric material comprises an organic siloxane-based dielectric material;
depositing a second dielectric material over the first dielectric material while the first flexible substrate is bonded to the first side of the carrier substrate, wherein the second dielectric material comprises a silicon nitride material; and
baking the second dielectric material, the first dielectric material, the first contact element, the first silicon comprising layer, the first gate metal layer, the first flexible substrate, and the carrier substrate while the first flexible substrate is bonded to the first side of the carrier substrate;

wherein:
the electronic device comprises a second flexible substrate bonded to the second side of the carrier substrate;
bonding the first flexible substrate to the first side of the carrier substrate comprises compensating for a deforming force acting on the carrier substrate by the second flexible substrate resulting from the second flexible substrate being bonded to the second side of the carrier substrate; and
the at least the portion of the electronic device comprises the first gate metal layer.

12. The method of claim 11, wherein:
the first flexible substrate comprises a material; and
the second flexible substrate comprises the material.

13. The method of claim 12, wherein:
the material comprises a thermoplastic polymer; and
the thermoplastic polymer comprises at least one of polyethylene naphthalate, polyethylene terephthalate, polyethersulfone, polyimide, polycarbonate, cyclic olefin copolymer, or liquid crystal polymer.

14. The method of claim 11 wherein:
each of the first flexible substrate and the second flexible substrate comprises a substrate thickness greater than or equal to approximately 3 micrometers and less than or equal to approximately 100 micrometers.

15. The method of claim 11 wherein:
the carrier substrate comprises a carrier material having a glass transition point greater than or equal to approximately 300° C.

16. The method of claim 11 wherein:
the carrier substrate comprises a carrier thickness greater than or equal to approximately 0.5 millimeters and less than or equal to approximately 2.0 millimeters.

17. The method of claim 11 further comprising:
after baking the second dielectric material, the first dielectric material, the first contact element, the first silicon comprising layer, the first gate metal layer, the first flexible substrate, and the carrier substrate, debonding the first flexible substrate from the carrier substrate.

18. The method of claim 11 further comprising:
after baking the second dielectric material, the first dielectric material, the first contact element, the first silicon comprising layer, the first gate metal layer, the first flexible substrate, and the carrier substrate, debonding the second flexible substrate from the carrier substrate.

19. A method of manufacturing electronic devices, the method comprising:
providing a carrier substrate having a first side and a second side;
providing a first flexible substrate;
bonding the first flexible substrate to the first side of the carrier substrate with a first adhesive;
compensating for a deformation of the carrier substrate by coupling a mechanism to the second side of the carrier substrate, the deformation being caused by the bonding the first flexible substrate to the first side of the carrier substrate;
depositing at least one layer of a first material over the first flexible substrate to create a portion of at least one first electronic device while the first flexible substrate is bonded to the first side of the carrier substrate; and
depositing at least one layer of a second material over the second side of the carrier substrate while compensating for the deformation of the carrier substrate.

20. The method of claim 19 further comprising:
providing a second flexible substrate;
wherein:
- compensating for the deformation of the carrier substrate by coupling the mechanism to the second side of the carrier substrate comprises bonding the second flexible substrate to the second side of the carrier substrate with a second adhesive; and
- the mechanism comprises the second flexible substrate.

* * * * *